(12) United States Patent
Nakamura

(10) Patent No.: US 8,507,945 B2
(45) Date of Patent: Aug. 13, 2013

(54) SEMICONDUCTOR DEVICE INCLUDING AN INSULATED GATE BIPOLAR TRANSISTOR (IGBT)

(75) Inventor: Katsumi Nakamura, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 126 days.

(21) Appl. No.: 12/867,832

(22) PCT Filed: Mar. 31, 2008

(86) PCT No.: PCT/JP2008/056306
§ 371 (c)(1),
(2), (4) Date: Aug. 16, 2010

(87) PCT Pub. No.: WO2009/122486
PCT Pub. Date: Oct. 8, 2009

(65) Prior Publication Data
US 2010/0327313 A1   Dec. 30, 2010

(51) Int. Cl.
*H01L 29/74*   (2006.01)

(52) U.S. Cl.
USPC .......................................... 257/146; 257/330

(58) Field of Classification Search
USPC .......................................... 257/330, 146–147
See application file for complete search history.

(56) References Cited

U.S. PATENT DOCUMENTS

| | | | |
|---|---|---|---|
| 6,111,290 A * | 8/2000 | Uenishi et al. | 257/331 |
| 6,218,217 B1 * | 4/2001 | Uenishi et al. | 438/138 |
| 6,380,586 B1 * | 4/2002 | Yoshikawa | 257/330 |
| 6,399,998 B1 * | 6/2002 | Chang | 257/565 |
| 6,566,691 B1 * | 5/2003 | Inoue et al. | 257/139 |
| 6,621,120 B2 * | 9/2003 | Otsuki et al. | 257/327 |
| 6,664,591 B2 * | 12/2003 | Matsudai et al. | 257/329 |
| 6,683,331 B2 * | 1/2004 | Francis et al. | 257/163 |
| 6,683,343 B2 * | 1/2004 | Matsudai et al. | 257/328 |

(Continued)

FOREIGN PATENT DOCUMENTS

| | | |
|---|---|---|
| CN | 1881612 A | 12/2006 |
| CN | 101090133 A | 12/2007 |

(Continued)

OTHER PUBLICATIONS

Chinese Office Action issued Apr. 23, 2012, in China Patent Application No. 200880128558.0 (with English translation).

(Continued)

Primary Examiner — Nathan Ha
(74) Attorney, Agent, or Firm — Oblon, Spivak, McClelland, Maier & Neustadt, L.L.P.

(57) ABSTRACT

A semiconductor device includes a semiconductor substrate and a MOS transistor. The semiconductor substrate has the first main surface and the second main surface facing each other. The MOS transistor includes a gate electrode (5a) formed on the first main surface side, an emitter electrode (11) formed on the first main surface side, and a collector electrode (12) formed in contact with the second main surface. An element generates an electric field in a channel by a voltage applied to the gate electrode (5a), and controls the current between the emitter electrode (11) and the collector electrode (12) by the electric field in the channel. The spike density in the interface between the semiconductor substrate and the collector electrode (12) is not less than 0 and not more than $3 \times 10^8$ unit/cm$^2$. Consequently, a semiconductor device suitable for parallel operation is provided.

45 Claims, 82 Drawing Sheets

(56) References Cited

U.S. PATENT DOCUMENTS

| | | | |
|---|---|---|---|
| 6,747,295 B2 * | 6/2004 | Inoue et al. | 257/139 |
| 6,781,199 B2 * | 8/2004 | Takahashi | 257/330 |
| 6,815,767 B2 | 11/2004 | Nakamura et al. | |
| 6,838,735 B1 * | 1/2005 | Kinzer et al. | 257/365 |
| 6,849,899 B2 * | 2/2005 | Hshieh et al. | 257/332 |
| 6,867,437 B2 * | 3/2005 | Takahashi et al. | 257/136 |
| 6,867,454 B2 * | 3/2005 | Hattori | 257/329 |
| 6,870,200 B2 * | 3/2005 | Yanagisawa | 257/139 |
| 6,894,347 B2 * | 5/2005 | Hattori et al. | 257/330 |
| 6,953,968 B2 | 10/2005 | Nakamura et al. | |
| 8,124,533 B2 * | 2/2012 | Narazaki | 438/700 |
| 2001/0042885 A1 | 11/2001 | Nakamura | |
| 2002/0121660 A1 | 9/2002 | Otsuki et al. | |
| 2005/0161732 A1 * | 7/2005 | Mizukami et al. | 257/327 |
| 2007/0004098 A1 | 1/2007 | Kazama et al. | |
| 2007/0296080 A1 | 12/2007 | Mizuno et al. | |

FOREIGN PATENT DOCUMENTS

| | | |
|---|---|---|
| DE | 10 2006 028 342 A1 | 12/2006 |
| DE | 10 2007 026 365 A1 | 12/2007 |
| JP | 6-45612 | 2/1994 |
| JP | 8-316479 | 11/1996 |
| JP | 9 260662 | 10/1997 |
| JP | 11-274484 | 10/1999 |
| JP | 2001-332729 | 11/2001 |
| JP | 2002-261282 | 9/2002 |
| JP | 2002-299623 | 10/2002 |
| JP | 2002 314083 | 10/2002 |
| JP | 2002 359373 | 12/2002 |
| JP | 2003 318400 | 11/2003 |
| JP | 2004 247593 | 9/2004 |
| JP | 2006 49933 | 2/2006 |
| JP | 2006 294968 | 10/2006 |
| JP | 2007 5368 | 1/2007 |
| JP | 2007 36211 | 2/2007 |
| JP | 2007 335431 | 12/2007 |
| WO | WO 02/061845 A1 | 8/2002 |

OTHER PUBLICATIONS

German Office Action mailed Apr. 18, 2013, in German Patent Application No. 11 2008 003 787.6 (with English Translation).

Japanese Office Action mailed May 28, 2013, in Japanese Patent Application No. 2010-505147 (with English Translation).

Japanese Office Action mailed May 28, 2013, in Japanese Patent Application No. 2010-505147 (with complete English Translation).

* cited by examiner

UNDER CONDITIONS OF
$C_{s,p} > 5 \times 10^{15} cm^{-3}$, $C_{p,p} > 1 \times 10^{16} cm^{-3}$ $V_{CE}(V)$  $I_C(A)$ Time ($\mu$ sec)

STRUCTURE WITHOUT RESISTOR BODY 28a (Vge REPRESENTS OSCILLATION WAVEFORM)

STRUCTURE WITH RESISTOR BODY 28a

GATE VOLTAGE $V_{ge}(V)$

Time ($\mu$ sec)

SEMICONDUCTOR DEVICE INCLUDING AN INSULATED GATE BIPOLAR TRANSISTOR (IGBT)

TECHNICAL FIELD

The present invention relates to a semiconductor device, and particularly to a semiconductor device having an IGBT (Insulated Gate Bipolar Transistor) which is a high withstand voltage semiconductor device.

BACKGROUND ART

In the field of the high withstand voltage semiconductor device (power device) which controls the voltage exceeding several hundreds volts, since a large current is also applied, there is a need to provide element characteristics which suppress heat generation, that is, loss. Furthermore, it is desirable to implement a voltage drive element having a relatively small-sized drive circuit suffering little loss as a driving scheme of the gate controlling the voltage and current.

In recent years, for the reasons as described above, an insulated gate bipolar transistor, that is, an IGBT, has been mainly employed in this field as an element that allows voltage driving with little loss. This IGBT is configured so as to allow a decreased impurity concentration of the drain of a MOS (Metal Oxide Semiconductor) transistor for keeping the withstand voltage low and to set a diode to be on the drain side for decreasing the drain resistance.

Since the diode exhibits a bipolar behavior in the IGBT as described above, the source side and the drain side of the MOS transistor in the IGBT are referred to as an emitter side and a collector side, respectively, in the present application.

The IGBT serving as a voltage drive element is generally applied with a voltage of several hundreds volts between its collector and emitter, and the applied voltage is controlled by a gate voltage of ±several volts to several tens of volts. Furthermore, the IGBT is often used as an inverter, in which case the voltage between the collector and the emitter is low but a large current flows when the gate is turned on, and no current flows but the voltage between the collector and the emitter is high when the gate is turned off.

The IGBT is usually operated in the above-described mode. Thus, loss may include a steady loss which is the product of the current and the voltage in the ON state, and a switching loss during the period of transition between the ON state and the OFF state. The product of the leakage current and the voltage in the OFF state is considerably small, so that it can be negligible.

On the other hand, it is also important to prevent destruction of the element even under the abnormal conditions, for example, in the case where the load shorts out. In this case, the gate is turned on to cause a large current to flow while a power supply voltage of several hundreds volts is applied between the collector and the emitter.

In the IGBT configured to have a MOS transistor and a diode connected in series, the maximum current is limited by the saturation current of the MOS transistor. Accordingly, the current limitation occurs also in the case where a short circuit occurs as described above, which allows prevention of element destruction resulting from heat generation for a certain period of time.

The structure of the conventional IGBT is disclosed, for example, in Japanese Patent Laying-Open No. 2004-247593 (Patent Document 1). The IGBT in Patent Document 1 mainly includes a gate electrode, a source (emitter) electrode, a drain (collector) electrode, and an n-type substrate. A trench is formed on the upper surface of the n-type substrate, and the gate electrode is buried in this trench. A p-type base layer is formed on the upper portion in the n-type substrate, and an $n^+$ type source layer and a $p^+$ type drain layer are formed within the p-type base layer. The $n^+$ type source layer and the $p^+$ type drain layer are adjacent to each other on the surface of the n-type substrate. The gate electrode faces the $n^+$ type source layer and the p-type base layer across the gate insulating film within the n-type substrate. The emitter electrode is in electrical contact with the $n^+$ type source layer and the $p^+$ type drain layer. The $p^+$ type drain layer is formed on the underside of the n-type substrate, and the collector electrode is in contact with the $p^+$ type drain layer on the underside of the n-type substrate. An $n^-$ type epitaxial layer and an n-type buffer layer are buried between the $p^+$ type drain layer and the p-type base layer within the n-type substrate. The $n^-$ type epitaxial layer is in contact with the p-type base layer and the n-type buffer layer, and the n-type buffer layer is in contact with the $p^+$ type drain layer.

Furthermore, the IGBT having the same configuration as that in Patent Document 1 is disclosed, for example, in Japanese Patent Laying-Open No. 2006-49933 (Patent Document 2), Japanese Patent Laying-Open No. 2002-359373 (Patent Document 3), Japanese Patent Laying-Open No. 09-260662 (Patent Document 4), U.S. Pat. No. 6,815,767 (Patent Document 5), U.S. Pat. No. 6,953,968 (Patent Document 6), and U.S. Pat. No. 6,781,199 (Patent Document 7).

Patent Document 1: Japanese Patent Laying-Open No. 2004-247593
Patent Document 2: Japanese Patent Laying-Open No. 2006-049933
Patent Document 3: Japanese Patent Laying-Open No. 2002-359373
Patent Document 4: Japanese Patent Laying-Open No. 09-260662
Patent Document 5: U.S. Pat. No. 6,815,767
Patent Document 6: U.S. Pat. No. 6,953,968
Patent Document 7: U.S. Pat. No. 6,781,199

DISCLOSURE OF THE INVENTION

Problems to be Solved by the Invention

In the power device, a plurality of IGBT and diode chips are provided in one package module, in which the plurality of IGBTs are connected in parallel to each other. The temperature dependency of an ON voltage $V_{CE}(sat)$ is important as characteristics of the IGBT used for the power device. ON voltage $V_{CE}(sat)$ described herein represents a voltage between the collector and the emitter that is required to obtain an arbitrary rated current (density) $J_C$. It is suitable for operating the plurality of IGBTs connected in parallel to each other (in other words, operating the IGBTs in parallel) that ON voltage $V_{CE}(sat)$ exhibits positive temperature dependency, that is, ON voltage $V_{CE}(sat)$ increases in accordance with an increase in temperature of the IGBT. In the case where ON voltage $V_{CE}(sat)$ exhibits negative temperature dependency, the current flows concentratedly into the IGBT having a low ON voltage $V_{CE}(sat)$ when the IGBTs are operated in parallel. As a result, the package module is likely to malfunction, which may tend to cause problems such as destruction.

Therefore, an object of the present invention is to provide a semiconductor device suitable for parallel operation.

Means for Solving the Problems

A semiconductor device according to one aspect of the present invention includes a semiconductor substrate and an element. The semiconductor substrate has a first main surface and a second main surface facing each other. The element has a gate electrode formed on a side of the first main surface, a first electrode formed on the side of the first main surface and a second electrode formed in contact with the second main surface. The element generates an electric field in a channel by a voltage applied to the gate electrode, and controls a current between the first electrode and the second electrode by the electric field in the channel. A spike density in an interface between the semiconductor substrate and the second electrode is not less than 0 and not more than $3\times10^8$ unit/cm$^2$.

A semiconductor device according to another aspect of the present invention includes a semiconductor substrate and an element. The semiconductor substrate has a first main surface and a second main surface facing each other. The element has a gate electrode formed on a side of the first main surface, a first electrode formed on the side of the first main surface, and a second electrode formed in contact with the second main surface. The element generates an electric field in a channel by a voltage applied to the gate electrode, and controls a current between the first electrode and the second electrode by the electric field in the channel. The semiconductor device further includes a collector region formed on the second main surface. The collector region includes a collector diffusion layer of a first conductivity type in contact with the second electrode, a buffer diffusion layer of a second conductivity type formed closer to the first main surface than the collector diffusion layer is, and a drift diffusion layer of the second conductivity type. The drift diffusion layer is lower in impurity concentration than the buffer diffusion layer, and is formed adjacent to the buffer diffusion layer and closer to the first main surface than the buffer diffusion layer is. A ratio of the number of atoms per unit area of impurities forming the buffer diffusion layer to the number of atoms per unit area of impurities forming the drift diffusion layer is not less than 0.05 and not more than 100.

Effects of the Invention

According to the present invention, a semiconductor device suitable for parallel operation can be provided.

DESCRIPTION OF THE REFERENCE SIGNS 1 n$^-$ drift layer, 1a gate groove, 1b emitter groove, 2 p-type body region, 3 n-type emitter region or n-type impurity diffusion region, 4, 4a gate insulating film, 4b emitter insulating film, 4b emitter insulating film, 5 conductive layer, 5a gate electrode, 5b emitter conductive layer, 6 p$^+$ impurity diffusion region, 7 n-type buffer region, 7a n-type intermediate layer, 8 p-type collector region, 9, 22A, 22B insulating film, 9a contact hole, 10 barrier metal layer, 11 emitter electrode, 11a gate electrode wiring, 12, 12a collector electrode, 14, 14a n-type impurity diffusion region, 15 passivation film, 21a, 21b silicide layer, 28 gate pad, 28a resistor body, 31 mask layer, 32, 33 silicon oxide film, 32a sacrificial oxide film, 41 p-type impurity diffusion region.

BEST MODES FOR CARRYING OUT THE INVENTION

The embodiments of the present invention will be hereinafter described with reference to the accompanying drawings.

First Embodiment

Figure 1:
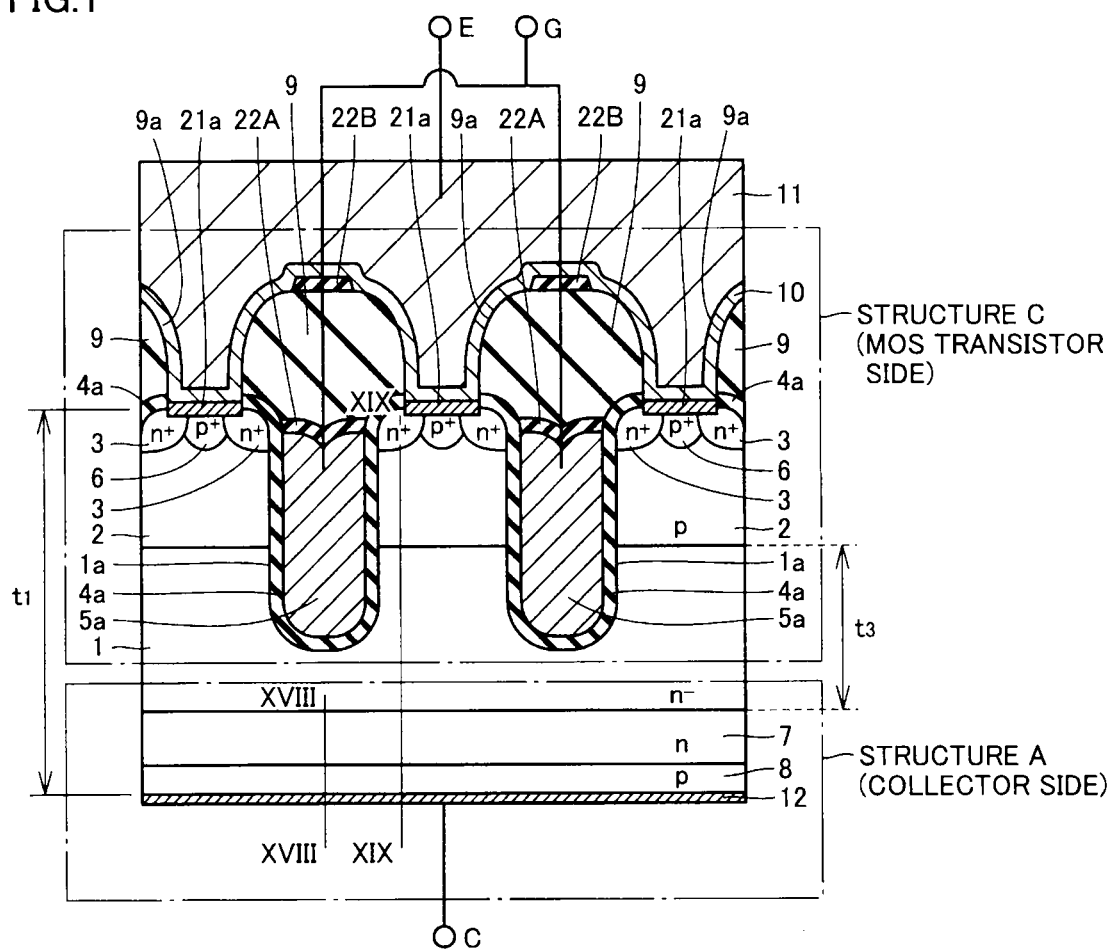
FIG. 1 is a schematic cross sectional view showing the configuration of a semiconductor device according to the first embodiment of the present invention.

FIG. 1 is a schematic cross sectional view showing the configuration of a semiconductor device according to the first embodiment of the present invention. Referring to FIG. 1, the semiconductor device according to the present embodiment is a trench-type IGBT formed on the semiconductor substrate having a thickness $t_1$ of 50-800 µm, for example, when assuming that the semiconductor device has a withstand voltage of 600-6500V. The semiconductor substrate has the first main surface (upper surface) and the second main surface (underside) facing each other. Assuming that the semiconductor device has a withstand voltage of, for example, 600-6500V, an n⁻ drift layer (drift diffusion layer) 1 has a concentration of $1\times10^{12}$ to $1\times10^{15}$ cm$^{-3}$. On the first main surface side of the semiconductor substrate, a p-type body region 2 is formed which is made of a p-type semiconductor, for example, having a concentration of approximately $1\times10^{15}$ to $1\times10^{18}$ cm$^{-3}$ and a diffusion depth of approximately 1.0 to 4.0 µm from the first main surface. On the first main surface in p-type body region 2 (body diffusion layer), an n-type emitter region 3 is formed which is made of an n-type semiconductor, for example, having a concentration of $1\times10^{18}$ to $1\times10^{20}$ cm$^{-3}$ and a diffusion depth of approximately 0.3 to 2.0 µm from the first main surface. On the first main surface, a p⁺ impurity diffusion region 6 (the first emitter diffusion layer) for providing low resistance contact with p-type body region 2 is formed adjacent to this n-type emitter region 3 (the second emitter diffusion layer), for example, so as to have a concentration of approximately $1\times10^{18}$ to $1\times10^{20}$ cm$^{-3}$ and a diffusion depth from the first main surface less than or equal to the depth of n-type emitter region 3.

On the first main surface, a gate groove 1a is formed so as to extend through n-type emitter region 3 and p-type body region 2 to n⁻ drift layer 1. This gate groove 1a has a depth, for example, of 3-10 µm from the first main surface and has a pitch, for example, of 2.0 µm to 6.0 µm. Gate groove 1a has a gate insulating film 4a formed on its inner surface. For the purpose of improving the characteristics and reliability of the gate insulating film, and device yield, this gate insulating film 4a has a laminated structure of a silicon oxide film formed by the CVD method and a silicon oxide film formed by the thermal oxidation method or a silicon nitride oxide film in which nitrogen is segregated in the Si/SiO$_2$ interface.

A gate electrode 5a, for example, made of polycrystal silicon having phosphorus introduced thereinto in high concentration or made of metal material such as W/TiSi$_2$ is formed so as to fill gate groove 1a. It is to be noted that a silicide layer (for example, TiSi$_2$, CoSi, and the like) may be formed on the surface of gate electrode 5a for lowering the resistance of gate electrode 5a. An insulating film 22A made, for example, of a silicon oxide film is formed on the upper surface of gate electrode 5a. Furthermore, gate electrode 5a is electrically connected to the control electrode which applies a gate potential G. It is to be noted that gate electrode 5a may be formed on the first main surface side.

Thus, gate groove 1a, gate insulating film 4a and gate electrode 5a together form a gate trench. Furthermore, n⁻ drift layer 1, n-type emitter region 3 and gate electrode 5a together form an insulated gate type field effect transistor portion (in this embodiment, a MOS transistor) in which n⁻ drift layer 1 is used as a drain, n-type emitter region 3 is used as a source, and a portion of p-type body region 2 facing gate electrode 5a across gate insulating film 4a is used as a channel. In other words, this MOS transistor serves to generate an electric field in the channel by the voltage applied to gate electrode 5a, and control the current between an emitter electrode 11 and a collector electrode 12 by the electric field in the channel. The first main surface has a plurality of MOS transistors arranged thereon, each of which has the configuration described above.

On the first main surface, for example, an insulating film 9 made of silicate glass and an insulating film 22B made of a silicon oxide film formed by the CVD method are formed. These insulating films 9 and 22B have a contact hole 9a extending to the first main surface. A barrier metal layer 10 is formed along the inner surface of contact hole 9a and the upper surface of insulating films 9 and 22B. A silicide layer 21a is formed in the area where this barrier metal layer 10 and the semiconductor substrate are in contact with each other. Emitter electrode 11 (the first electrode) which applies an emitter potential E is electrically connected to n-type emitter region 3 and p⁺ impurity diffusion region 6 through this barrier metal layer 10 and silicide layer 21a. It is to be noted that emitter electrode 11 may be formed on the first main surface side.

Furthermore, a p-type collector region 8 (collector diffusion layer) and an n-type buffer region 7 (buffer diffusion layer) are formed on the second main surface side of the semiconductor substrate. Collector electrode 12 (the second electrode) which applies a collector potential C is electrically connected to p-type collector region 8. Collector electrode 12 is formed on the second main surface side of the semiconductor substrate and applies collector potential C. This collector electrode 12 is made of, for example, an aluminum compound. N-type buffer region 7 is formed closer to the first main surface than p-type collector region 8 is. Also, n⁻ drift layer 1 is lower in impurity concentration than n-type buffer region 7 and positioned adjacent to n-type buffer region 7 and closer to the first main surface than n-type buffer region 7 is. P-type collector region 8, n-type buffer region 7 and n⁻ drift layer 1 together form a collector region.

Particularly, when n-type buffer region 7 is provided, the main junction leakage characteristics are decreased and the withstand voltage is increased as compared to the case where n-type buffer region 7 is not provided. In addition, a tail current decreases in the waveform of $I_C$ at the time of turning off, which results in a decrease in switching loss ($E_{OFF}$).

Furthermore, the reason why the diffusion depth of n-type buffer region 7 is shallow is that n-type buffer region 7 is formed after the impurity diffusion region is formed on the MOS transistor side. In other words, this is because the low-temperature annealing technique or the annealing technique for locally raising a temperature as in laser annealing is used when forming n-type buffer region 7, in order to prevent an adverse effect by the high-temperature heat treatment on the impurity diffusion region on the MOS transistor side.

In the semiconductor device according to the present embodiment, for example, when the inverter is connected, it is assumed on the basis of the emitter potential that gate potential G of the control electrode corresponds to a pulsed control signal which is set at −15V in the OFF state and set at +15V in the ON state, and collector potential C of the collector electrode 12 corresponds to a voltage approximately between the power supply voltage and the saturation voltage in accordance with gate potential G.

The manufacturing method according to the present embodiment will then be described.

FIGS. 2-11 each are a schematic cross sectional view showing the method for manufacturing the semiconductor device in order of processes, according to the first embodiment of the present invention. First, referring to FIG. 2, p-type body region 2 having, for example, a peak concentration of $1\times10^{15}$ to $1\times10^{18}$ cm$^{-3}$ and a diffusion depth of 1.0 to 4.0 µm from the first main surface is formed on the first main surface of the semiconductor substrate including n⁻ drift layer 1. Then, a mask layer 31 is formed above the first main surface.

Figure 3:
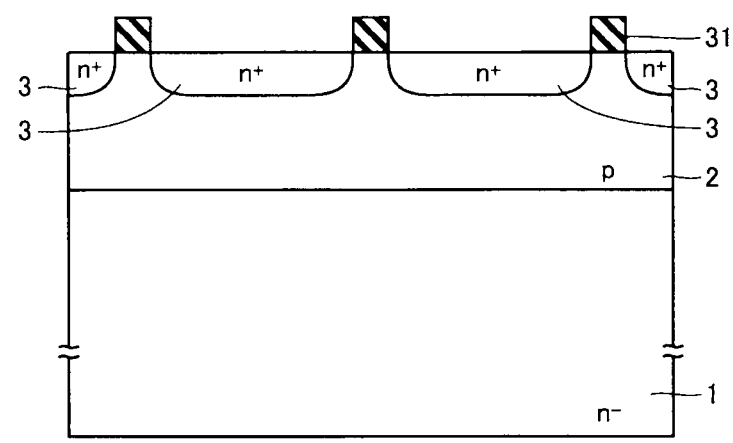
FIG. 3 is a schematic cross sectional view showing the second process of the method for manufacturing the semiconductor device according to the first embodiment of the present invention.

Referring to FIG. 3, mask layer 31 is patterned. When this patterned mask layer 31 is used as a mask to perform, for example, ion implantation, n-type emitter region 3 having a surface concentration of $1.0 \times 10^{18}$ to $1.0 \times 10^{20}$ cm$^{-3}$ and a diffusion depth of 0.3 to 2.0 µm from the first main surface is formed on the first main surface within p-type body region 2. Mask layer 31 is then removed.

Figure 4:
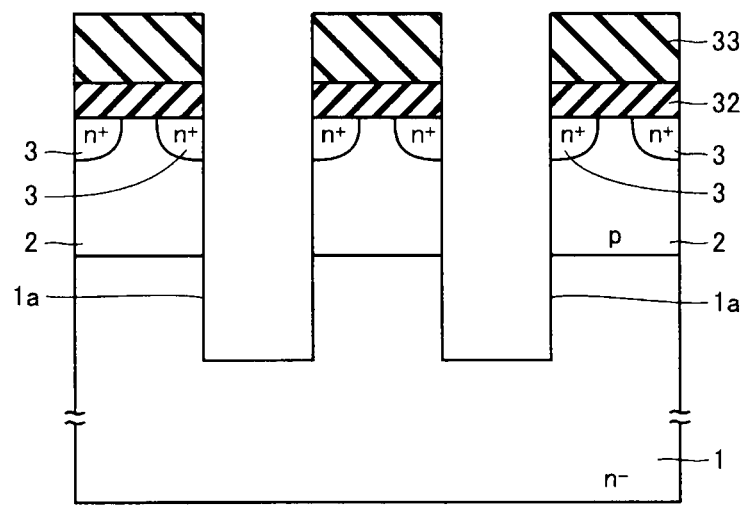
FIG. 4 is a schematic cross sectional view showing the third process of the method for manufacturing the semiconductor device according to the first embodiment of the present invention.

Referring to FIG. 4, for example, a silicon oxide film 32 formed by thermal oxidation and a silicon oxide film 33 formed by the CVD method are formed in this order on the first main surface. These silicon oxide films 32 and 33 are patterned by the ordinary photoengraving technique and etching technique. These patterned silicon oxide films 32 and 33 each are used as a mask to subject the semiconductor substrate to anisotropic etching. Consequently, gate groove 1a is formed so as to extend through n-type emitter region 3 and p-type body region 2 to n⁻ drift layer 1.

Figure 5:
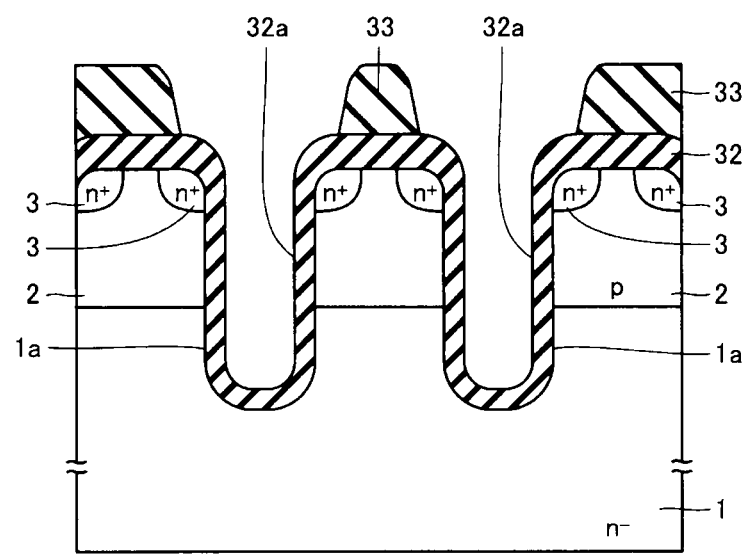
FIG. 5 is a schematic cross sectional view showing the fourth process of the method for manufacturing the semiconductor device according to the first embodiment of the present invention.

Referring to FIG. 5, the process such as isotropic plasma etching and sacrificial oxidation is carried out to round off the opening and the bottom of gate groove 1a and flatten the sidewall of gate groove 1a having projections and depressions. Furthermore, the above-mentioned sacrificial oxidation causes a sacrificial oxide film 32a to be formed integrally with thermal oxide film 32 on the inner surface of gate groove 1a. Thus, isotropic plasma etching and sacrificial oxidation are carried out to allow improvement in characteristics of the gate insulating film formed on the inner surface of gate groove 1a. Then, oxide films 32, 32a and 33 are removed.

Figure 6:
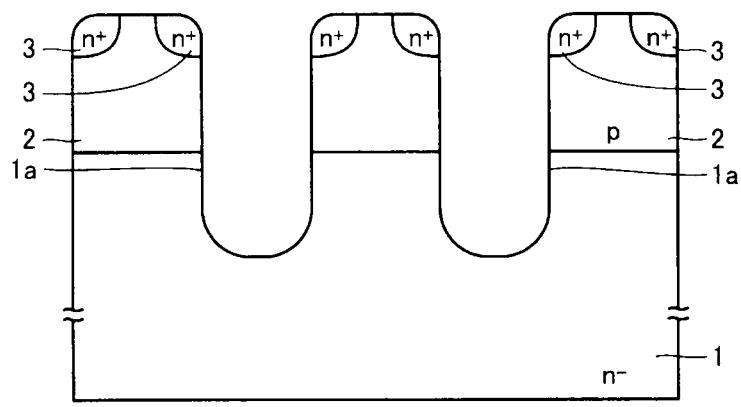
FIG. 6 is a schematic cross sectional view showing the fifth process of the method for manufacturing the semiconductor device according to the first embodiment of the present invention.

Referring to FIG. 6, the first main surface of the semiconductor substrate and the inner surface of gate groove 1a are exposed by removing the above-described oxide films.

Figure 7:
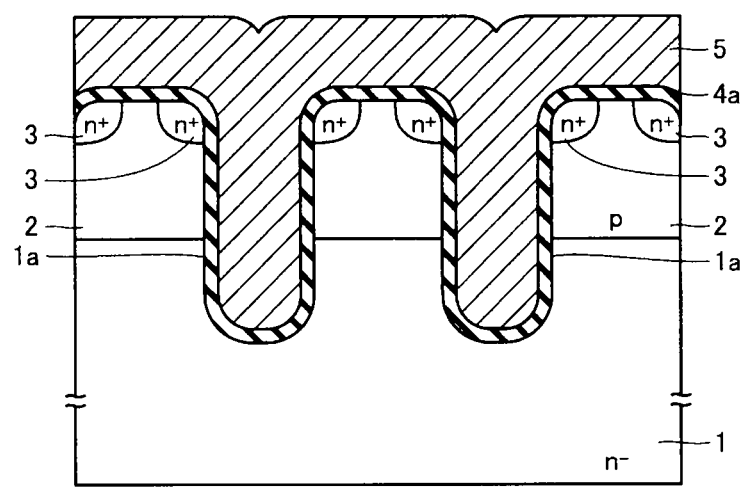
FIG. 7 is a schematic cross sectional view showing the sixth process of the method for manufacturing the semiconductor device according to the first embodiment of the present invention.

Referring to FIG. 7, gate insulating film 4a made, for example, of a silicon oxide film is formed along the first main surface and the inner surface of gate groove 1a. Then, a conductive layer 5 is formed on the entire surface so as to fill gate groove 1a. Conductive layer 5 is made of material such as polycrystalline silicon having phosphorus introduced thereinto in high concentration or polycrystalline silicon having no impurities introduced thereinto but having phosphorus introduced thereinto by ion implantation, or metal material such as W (tungsten)/TiSi$_2$ (titanium silicide).

For the purpose of improving the characteristics, reliability and device yield of the gate insulating film, it is preferable to employ, as gate insulating film 4a, a laminated structure of a silicon oxide film formed by the CVD method and a silicon oxide film formed by thermal oxidation or a nitride oxide film in which nitrogen is segregated in the interface between silicon and silicon oxide.

Then, conductive layer 5 is patterned by the ordinary photoengraving technique and the etching technique.

Figure 8:
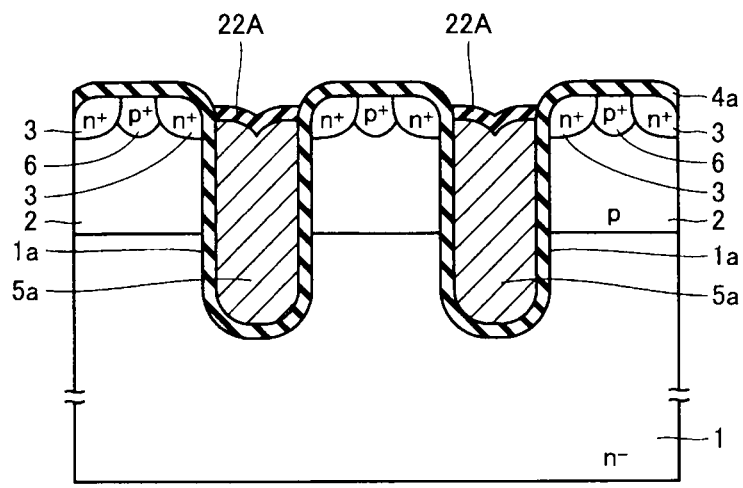
FIG. 8 is a schematic cross sectional view showing the seventh process of the method for manufacturing the semiconductor device according to the first embodiment of the present invention.

Referring to FIG. 8, this patterning results in formation of a gate electrode 5a while the conductive layer remains in gate groove 1a. In this case, a silicide layer (for example, TiSi$_2$, COSi and the like) may be formed on the surface of gate electrode 5a in order to reduce resistance of gate electrode 5a. Then, the upper surface of gate electrode 5a is oxidized to form insulating film 22A made of, for example, a silicon oxide film. Then, p⁺ impurity diffusion region 6 is formed which has, for example, a surface concentration of $1.0 \times 10^{18}$ to $1.0 \times 10^{20}$ cm$^{-3}$ in the first main surface and a diffusion depth from the first main surface less than n-type emitter region 3.

Figure 9:
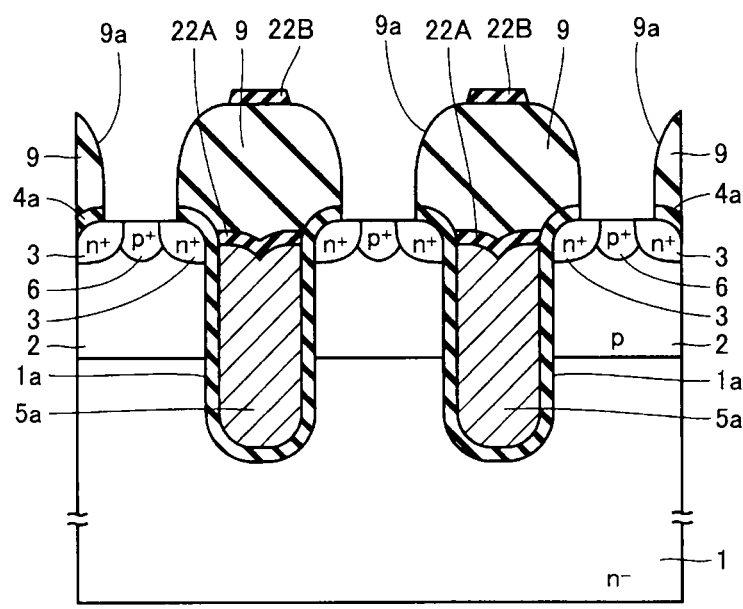
FIG. 9 is a schematic cross sectional view showing the eighth process of the method for manufacturing the semiconductor device according to the first embodiment of the present invention.

Referring to FIG. 9, for example, insulating film 9 made of silicate glass and insulating film 22B made of a silicon oxide film formed by the CVD method are formed in this order on the first main surface. Contact hole 9a is provided in these insulating films 9 and 22B by the ordinary photoengraving technique and the etching technique.

Figure 10:
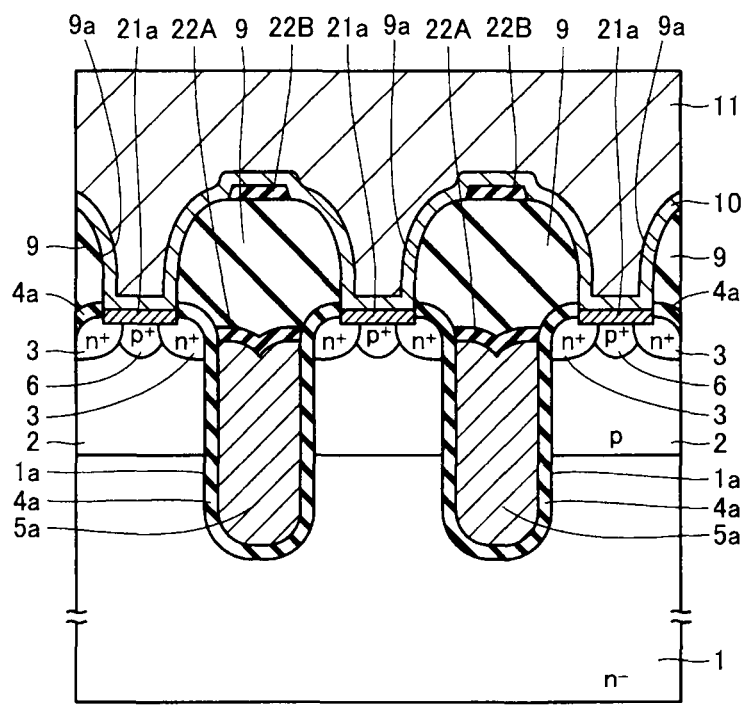
FIG. 10 is a schematic cross sectional view showing the ninth process of the method for manufacturing the semiconductor device according to the first embodiment of the present invention.

Referring to FIG. 10, a barrier metal layer 10 made, for example, of a metal layer is formed by the sputtering method. Then, lamp annealing is carried out to form a silicide layer 21a in the contact area between barrier metal layer 10 and the semiconductor substrate. Emitter electrode 11 is subsequently formed.

Figure 11:
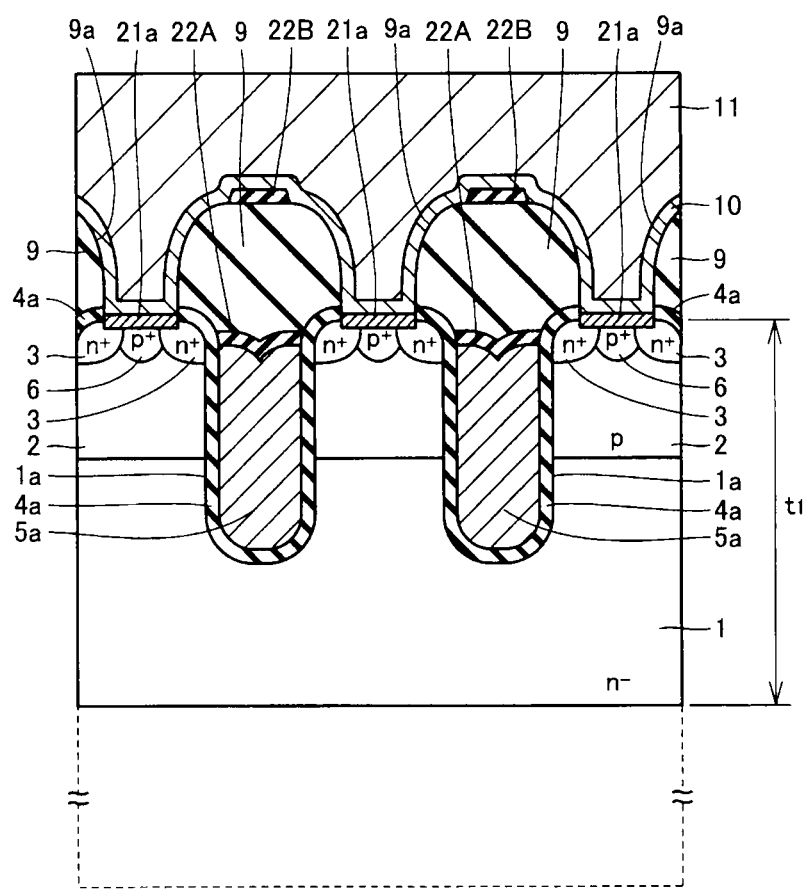
FIG. 11 is a schematic cross sectional view showing the tenth process of the method for manufacturing the semiconductor device according to the first embodiment of the present invention.

Referring to FIG. 11, n⁻ drift layer 1 on the second main surface side of the semiconductor substrate is polished to thereby adjust thickness $t_1$ of the semiconductor substrate in accordance with the withstand voltage required for the MOS transistor. For example, in order to manufacture an IGBT having a withstand voltage of 600V-6500V, n⁻ drift layer 1 should have a thickness $t_3$ (FIG. 1) of 50 to 800 µm. After polishing, the second main surface of the semiconductor substrate is subjected to etching and the like in order to recover the crystallinity of the polished surface.

Then, after implanting n-type impurities and p-type impurities into the second main surface of the semiconductor substrate, for example, by the ion implantation method, the impurities are diffused. Alternatively, immediately after implanting the n-type impurities and the p-type impurities, heat treatment is performed in accordance with the implantation depth of each of the impurities. Consequently, n-type buffer region 7 and p-type collector region 8 are formed. Furthermore, collector electrode 12 is formed to complete the semiconductor device as shown in FIG. 1. Collector electrode 12 is made, for example, of metal material, such as aluminum or the like, that provides an ohmic contact property with p-type collector region 8.

Figure 2:
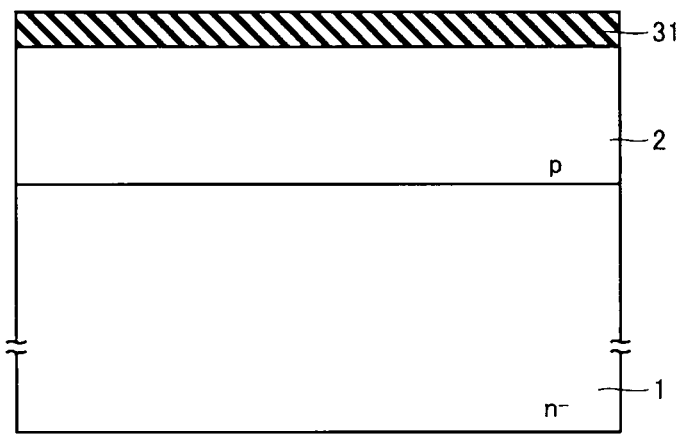
FIG. 2 is a schematic cross sectional view showing the first process of a method for manufacturing the semiconductor device according to the first embodiment of the present invention.

In the present embodiment, after forming emitter electrode 11 as shown in FIG. 11, the second main surface of n⁻ drift layer 1 may be polished to form n-type buffer region 7 and p-type collector region 8. Furthermore, as shown in FIG. 2, the second main surface may be polished before formation of p-type body region 2. Also, as shown in FIG. 9, after or before contact hole 9a is opened, the second main surface may be polished to form n-type buffer region 7 and p-type collector region 8.

In the present embodiment, the spike density in the interface between the semiconductor substrate and collector electrode 12 (density of the spikes made of an alloy formed by the reaction between the semiconductor material forming p-type collector region 8 and the metal material on the p-type collector region 8 side in collector electrode 12) is not less than 0 and not more than $3 \times 10^8$ unit/cm$^2$.

Figure 12:
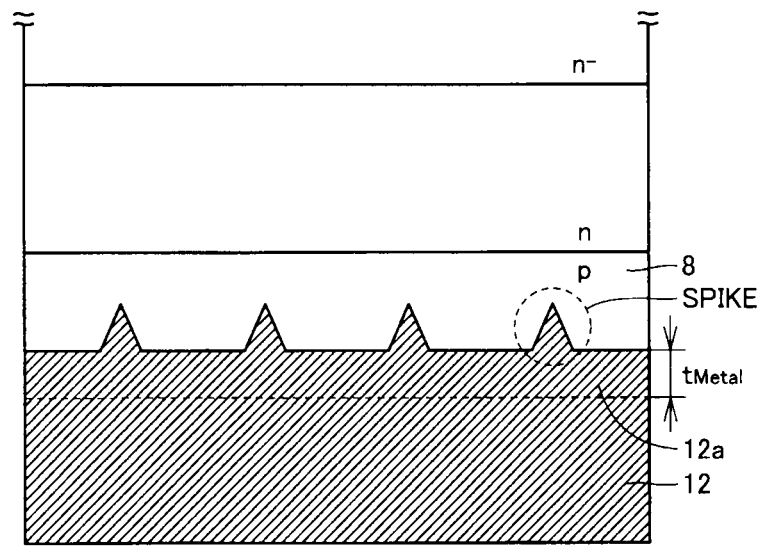
FIG. 12 is a cross sectional view schematically showing the state of the interface between a p-type collector region and a collector electrode in which spikes are formed.
Figure 13:
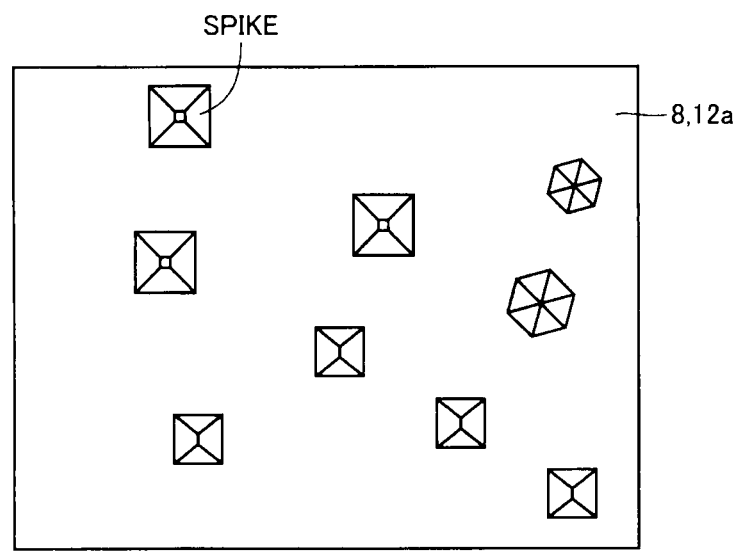
FIG. 13 is a plan view schematically showing the state of the interface between the p-type collector region and the collector electrode in which spikes are formed.

FIGS. 12 and 13 each are a diagram schematically showing the state of the interface between the p-type collector region and the collector electrode in which spikes are formed. FIG. 12 shows a cross sectional view and FIG. 13 shows a plan view. Referring to FIGS. 12 and 13, a plurality of spikes are generally formed in the interface between p-type collector region 8 and collector electrode 12. A spike is a projection (or a depression) having a shape of, for example, a four-sided or eight-sided pyramid and made of an alloy of the material forming collector electrode 12 and the material forming p-type collector region 8. In the case where collector electrode 12 is formed of a multilayer film, a spike is formed of an alloy of the material forming a layer 12a which is in direct contact with p-type collector region 8 and the material forming p-type collector region 8.

The spike density is measured, for example, by the following methods. First, collector electrode 12 is dissolved using chemical solution to remove it from the semiconductor substrate. The second main surface of the exposed semiconductor substrate is then observed with a microscope, to count the number of depressions each having a four-sided or eight-sided pyramid and existing in the second main surface. The resultant number is divided by the observed area to obtain a value which is defined as a spike density.

When the spike density is increased, the ionization rate of the impurities in p-type collector region 8 at low temperature (298K or lower) is decreased, and the effective efficiency of implantation of the carrier (hole) from p-type collector region 8 into n-type buffer region 7 is also decreased. Thus, the $J_c$-$V_{CE}$ characteristics of the IGBT depend on the spike density.

Figure 14:
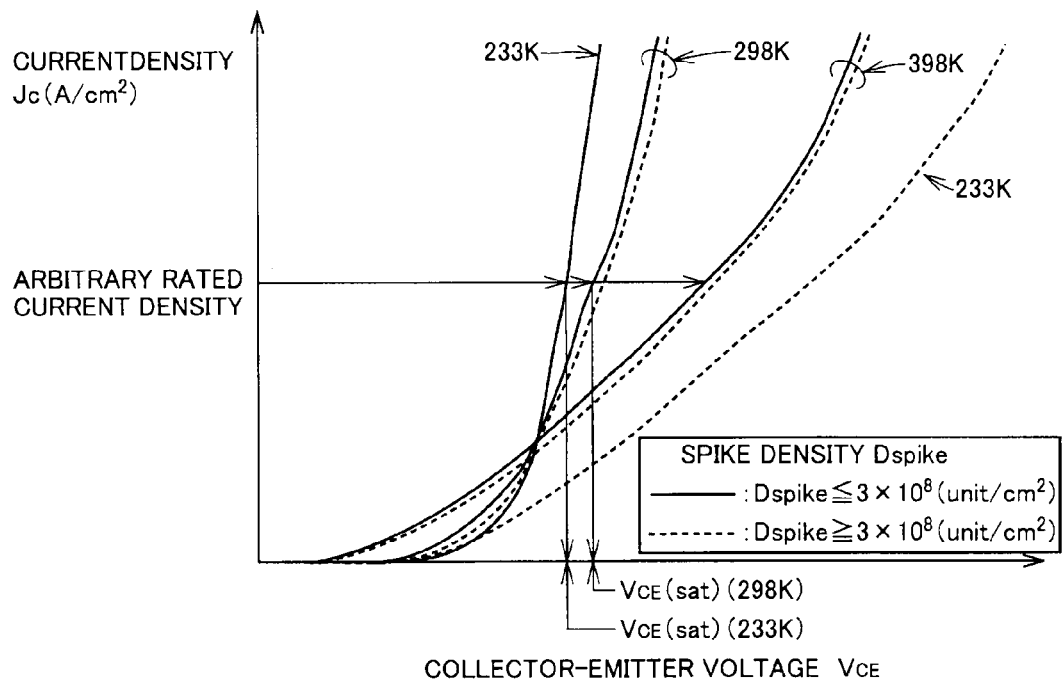
FIG. 14 is a diagram showing the temperature dependency in the relation between a collector-emitter voltage $V_{CE}(sat)$ and a current density $J_C$ according to the first embodiment of the present invention.

The spike density set at not less than 0 and not more than $3 \times 10^8$ unit/cm$^2$ allows the following effects to be achieved. FIG. 14 is a diagram showing the temperature dependency in the relation between the collector-emitter voltage and the current density according to the first embodiment of the present invention. Referring to FIG. 14, $V_{CE}$(sat) represents an emitter-collector voltage corresponding to an arbitrary rated current density. At temperatures of 298K and 398K, the curves are almost the same in both cases where the spike density is not less than $3 \times 10^8$ unit/cm$^2$ and is not more than $3 \times 10^8$ unit/cm$^2$. In contrast, at a temperature of 233K, the emitter-collector voltage is significantly increased in the case where the spike density is not more than $3 \times 10^8$ unit/cm$^2$.

Figure 15:
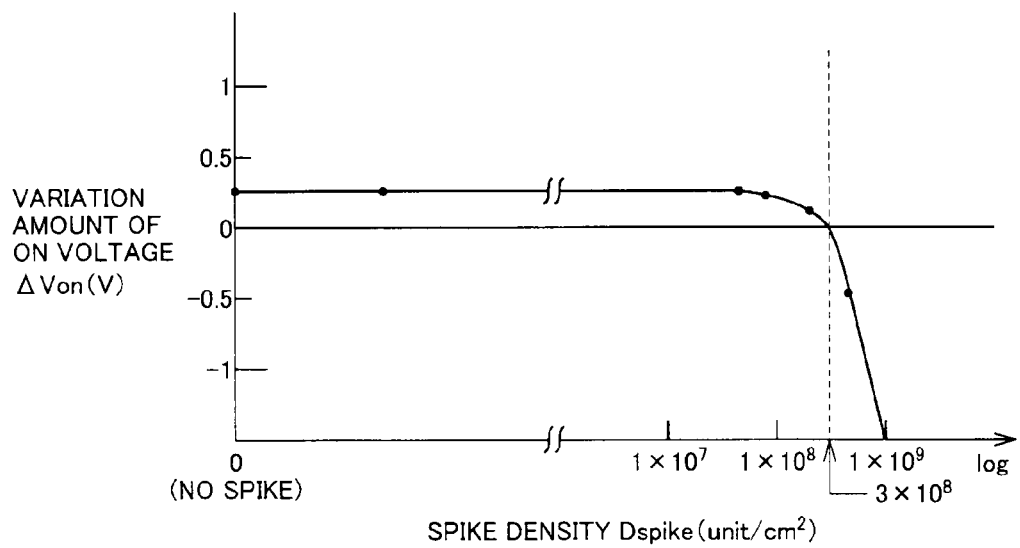
FIG. 15 is a diagram showing the relation between the spike density and the variation amount of the ON voltage according to the first embodiment of the present invention.

FIG. 15 is a diagram showing the relation between the spike density and the variation amount of the ON voltage according to the first embodiment of the present invention. FIG. 15 shows the results obtained when p-type collector region 8 and n-type buffer region 7 are set under the fixed conditions (concentration, depth). Furthermore, an ON-voltage variation amount $\Delta V_{on}$ in FIG. 15 represents a value obtained by subtracting collector-emitter voltage $V_{CE}$(sat) at 233K (233K) from collector-emitter voltage $V_{CE}$(sat) at 298K (298K). Referring to FIG. 15, when a spike density $D_{spike}$ is not more than $3 \times 10^8$ unit/cm$^2$, collector-emitter voltage $V_{CE}$(sat) at 298K represents a value not less than collector-emitter voltage $V_{CE}$(sat) at 233K. In contrast, when spike density $D_{spike}$ exceeds $3 \times 10^8$ unit/cm$^2$, collector-emitter voltage $V_{CE}$(sat) at 298K represents a value less than collector-emitter voltage $V_{CE}$(sat) at 233K.

Figure 16:
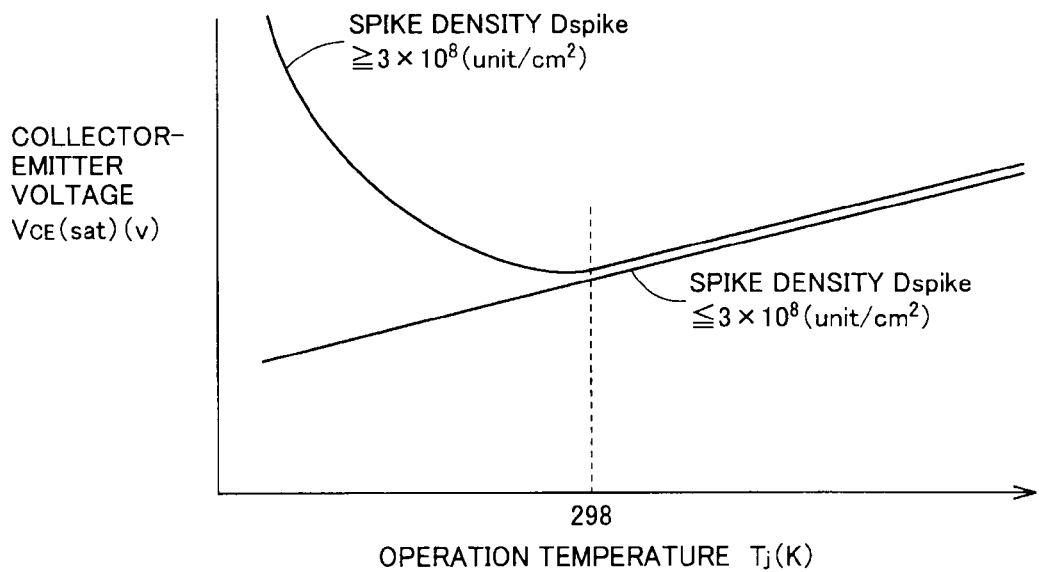
FIG. 16 is a diagram showing the spike density dependency in the relation between $V_{CE}(sat)$ and the operation temperature of the device according to the first embodiment of the present invention.

FIG. 16 is a diagram showing the spike density dependency in the relation between the collector-emitter voltage and the operation temperature of the device according to the first embodiment of the present invention. Referring to FIG. 16, the temperature dependency of voltage $V_{CE}$(sat) is rendered positive when spike density $D_{spike}$ is not more than $3 \times 10^8$ unit/cm$^2$, whereas the temperature dependency of voltage $V_{CE}$(sat) is rendered negative in a region at a temperature lower than 298K when spike density $D_{spike}$ is not less than $3 \times 10^8$ unit/cm$^2$.

As described above, the temperature dependency of collector-emitter voltage $V_{CE}$ can be rendered positive by setting the spike density in the interface between the semiconductor substrate and collector electrode 12 at not less than 0 and not more than $3 \times 10^8$ unit/cm$^2$ as in the present embodiment. Consequently, the concentrated flow of the current into the IGBT having a low voltage $V_{CE}$ can be prevented when the IGBTs are operated in parallel. Accordingly, the semiconductor device suitable for parallel operation can be implemented.

The spike density can be controlled, for example, by the material properties of the collector electrode, the heat treatment conditions, or the film thickness of the collector electrode. As to the material properties of the collector electrode, Al, AlSi, Ti, and silicide containing metal are suitable. Silicide containing metal may include silicide containing Ti, silicide containing Ni, or silicide containing Co. Furthermore, as to the material properties of the collector electrode, it is preferable to employ the material, for example, such as Al and AlSi, which exhibits an ohmic resistance property in the interface with the contacting semiconductor layer (p-type collector region 8 in FIG. 1). As to the material properties of the semiconductor substrate, Si, SiC, GaN, or Ge is suitable. In particular, when silicide is used as a collector electrode, no spike is formed in the interface between the semiconductor substrate and the collector electrode. The collector electrode made of silicide is formed by forming metal containing Ti, Co, Ni or the like on the second main surface of the semiconductor substrate made of Si, SiC, GaN, Ge or the like and subjecting it to heat treatment.

Figure 17:
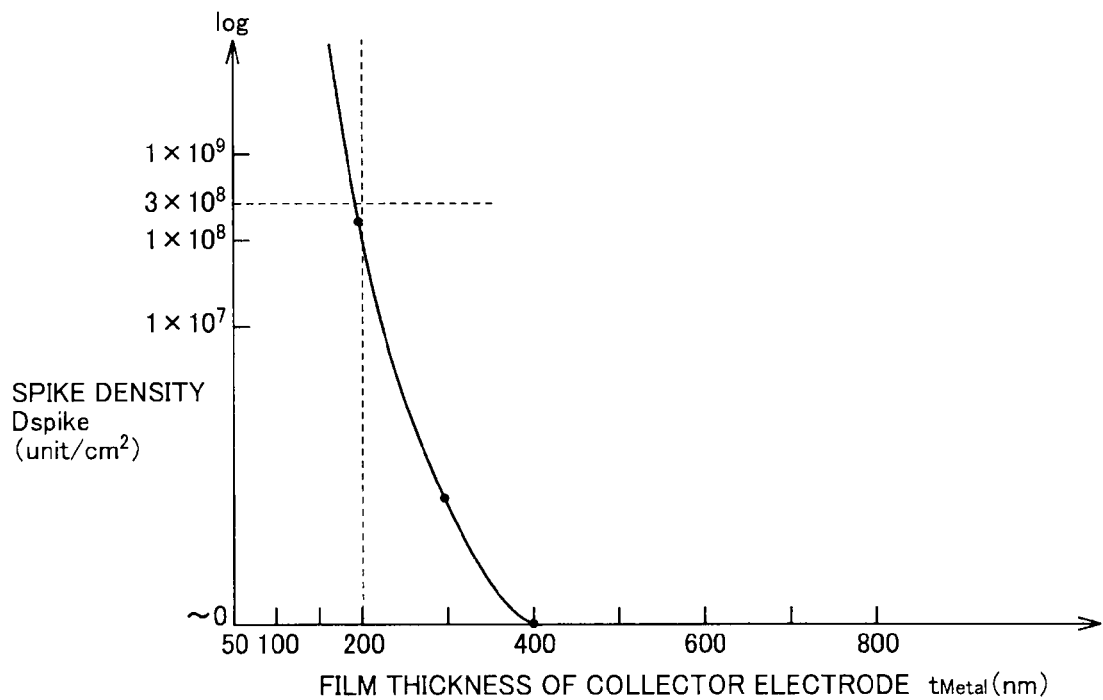
FIG. 17 is a diagram showing the relation between the spike density and the film thickness of the collector electrode according to the first embodiment of the present invention.

Furthermore, it is preferable that the film thickness of the collector electrode is 200 nm or more. FIG. 17 is a diagram showing the relation between the spike density and the film thickness of the collector electrode according to the first embodiment of the present invention. Referring to FIG. 17, when the collector electrode has a film thickness of not less than 200 nm, the spike density is not more than $3 \times 10^8$ unit/cm$^2$. However, in light of manufacturing limitation, it is preferable that the collector electrode has a film thickness of not more than 10000 nm.

The spike density can be set at not less than 0 and not more than $3 \times 10^8$ unit/cm$^2$ by appropriately combining the material properties of the collector electrode, the heat treatment conditions, or the film thickness of the collector electrode as described above.

Although the case where the IGBT has a configuration shown in FIG. 1 has been described in the present embodiment, the semiconductor device of the present invention is not limited to the configuration in FIG. 1, but may be provided with a semiconductor substrate having the first main surface and the second main surface facing each other, and an element. This element includes the gate electrode formed on the first main surface side, the first electrode formed on the first main surface side, and the second electrode formed in contact with the second main surface. This element serves to generate an electric field in the channel by the voltage applied to the gate electrode, and control the current between the first electrode and the second electrode by the electric field in the channel. Furthermore, it may also have a device structure such as a diode.

Second Embodiment

Figure 18:
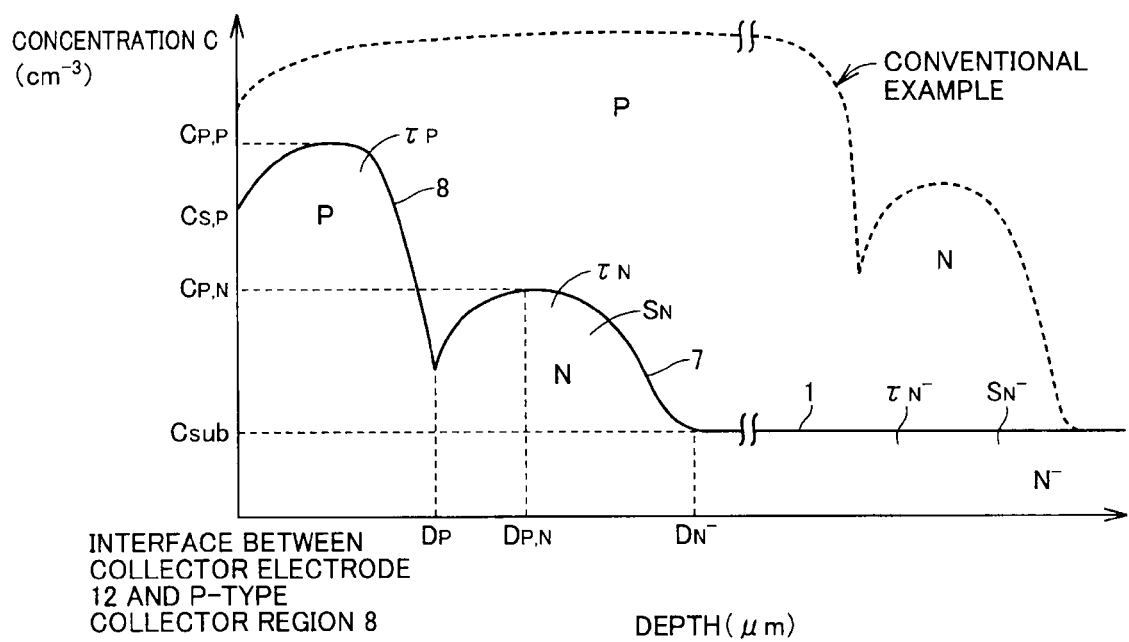
FIG. 18 shows a concentration distribution along a line XVIII-XVIII in FIG. 1.
Figure 19:
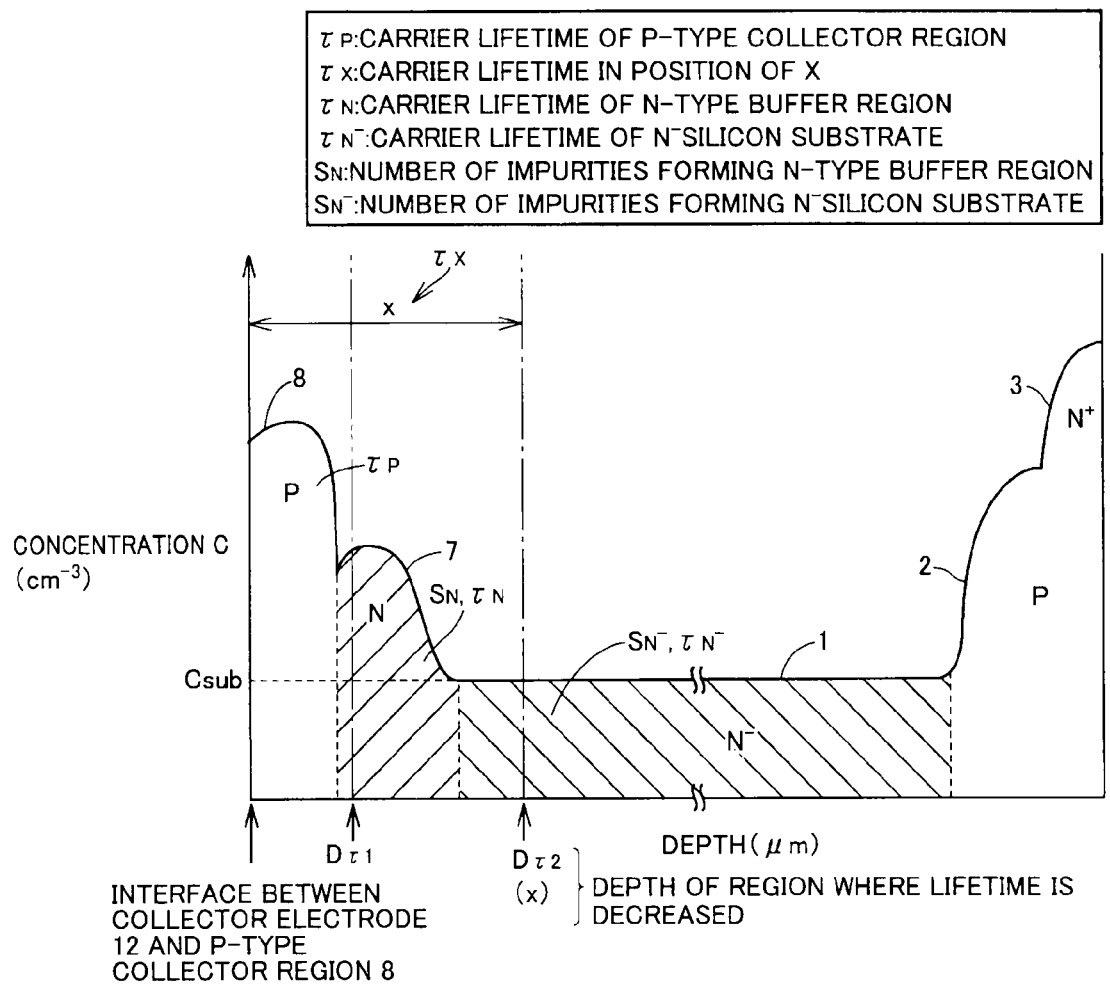
FIG. 19 shows a concentration distribution along a line XIX-XIX in FIG. 1.

FIG. 18 shows a concentration distribution along a line XVIII-XVIII in FIG. 1. FIG. 19 shows a concentration distribution along a line XIX-XIX in FIG. 1. It is to be noted that FIG. 18 also shows the concentration distribution of the p-type impurities or the n-type impurities in the conventional case.

Referring to FIGS. 18 and 19, a concentration $C_{S,P}$ represents an impurity concentration in p-type collector region 8 in the interface between collector electrode 12 and p-type collector region 8 (the second main surface of the semiconductor substrate), and a concentration $C_{P,P}$ represents the maximum value of the impurity concentration in p-type collector region 8. A concentration $C_{P,N}$ represents the maximum value of the impurity concentration in n-type buffer region 7. A concentration $C_{sub}$ represents an impurity concentration in n⁻ drift layer 1. A depth $D_P$ represents a depth from the second main surface to the junction plane between p-type collector region 8 and n-type buffer region 7. A depth $D_{P,N}$ represents a depth from the second main surface to the position where concentration $C_{P,N}$ in n-type buffer region 7 is achieved. A depth $D_{N-}$ represents a depth from the second main surface to the junction plane between n-type buffer region 7 and n⁻ drift layer 1.

As set forth below with reference to FIG. 29, in the case where an n-type intermediate layer 7a is formed, a depth $D_N$ represents a depth from the second main surface to the junction plane between n-type buffer region 7 and n-type intermediate layer 7a. Furthermore, $\tau_p$ represents a carrier lifetime of p-type collector region 8, $\tau_N$ represents a carrier lifetime of n-type buffer region 7, and $\tau_{N-}$ represents a carrier lifetime of n⁻ drift layer 1. Also, $\tau_x$ represents a carrier lifetime in the position at a depth of x from the second main surface. In addition, $S_N$ represents the number of atoms per unit area (atom/cm²) of the impurities forming n-type buffer region 7, and $S_{N-}$ represents the number of atoms per unit area (atom/cm²) of the impurities forming n⁻ drift layer 1. The number of atoms per unit area of the impurities in the desired region is obtained by integrating the impurity concentration profile in that region with respect to the entire depth direction.

The inventor of the present application found that the abnormal operation of the IGBT can be prevented by establishing the relation among p-type collector region 8, n-type buffer region 7 and n⁻ drift layer 1 under the following conditions. The meaning of preventing the abnormal operation of the IGBT will be described below.

a. Snap-back characteristics do not occur in the $J_c$-$V_{CE}$ characteristics at a temperature of 298K or lower.

b. The IGBT is turned on even at a low temperature of 298K or lower.

c. A desired withstand voltage is achieved, or thermal runaway does not occur in the IGBT at a temperature of 398K or more.

Figure 20:
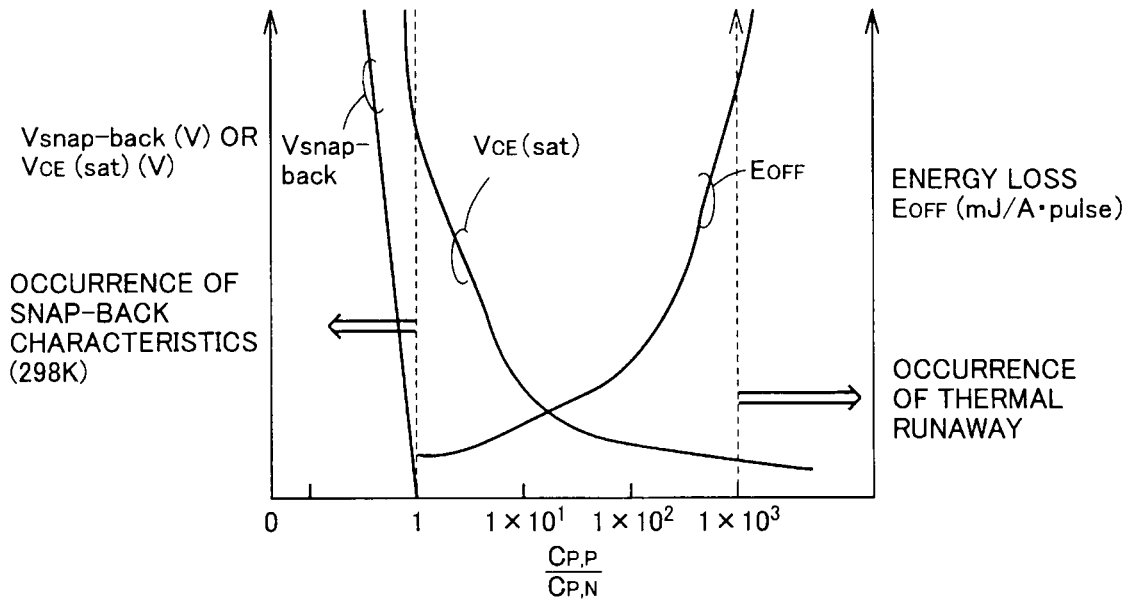
FIG. 20 is a diagram showing the relation of $C_{P,P}/C_{P,N}$ to $V_{CE}(sat)$ and an energy loss $E_{Off}$ according to the second embodiment of the present invention.
Figure 21:
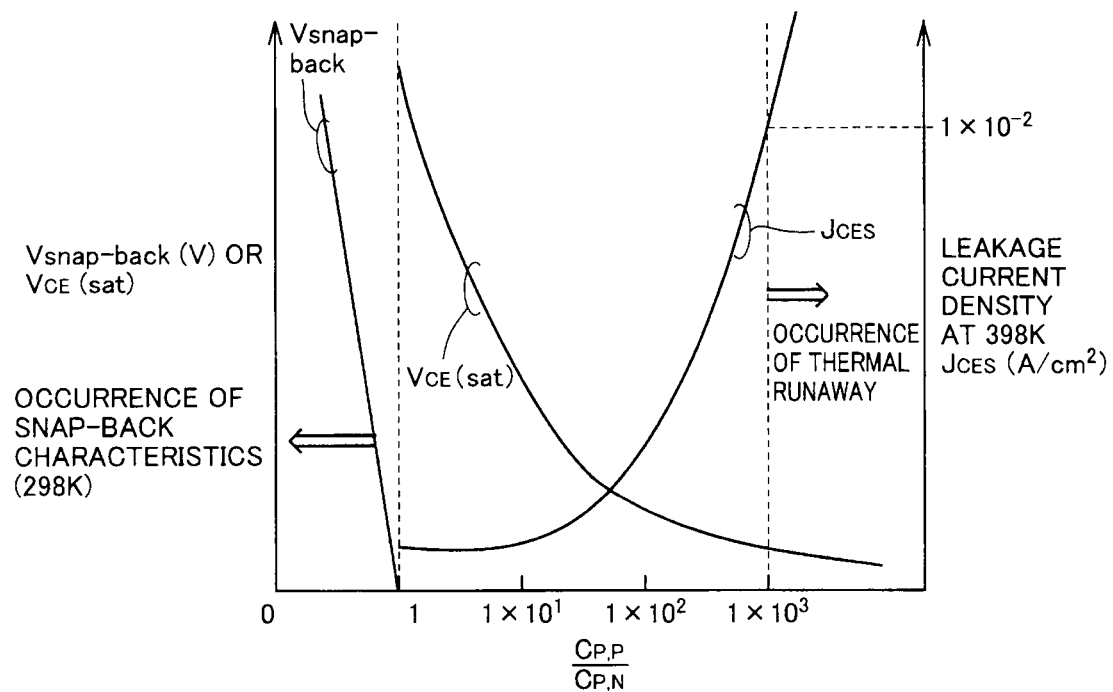
FIG. 21 is a diagram showing the relation of $C_{P,P}/C_{P,N}$ to $V_{CE}(sat)$ and a leakage current density $J_{CES}$ in the IGBT having a withstand voltage of 1200V class, according to the second embodiment of the present invention.
Figure 22:
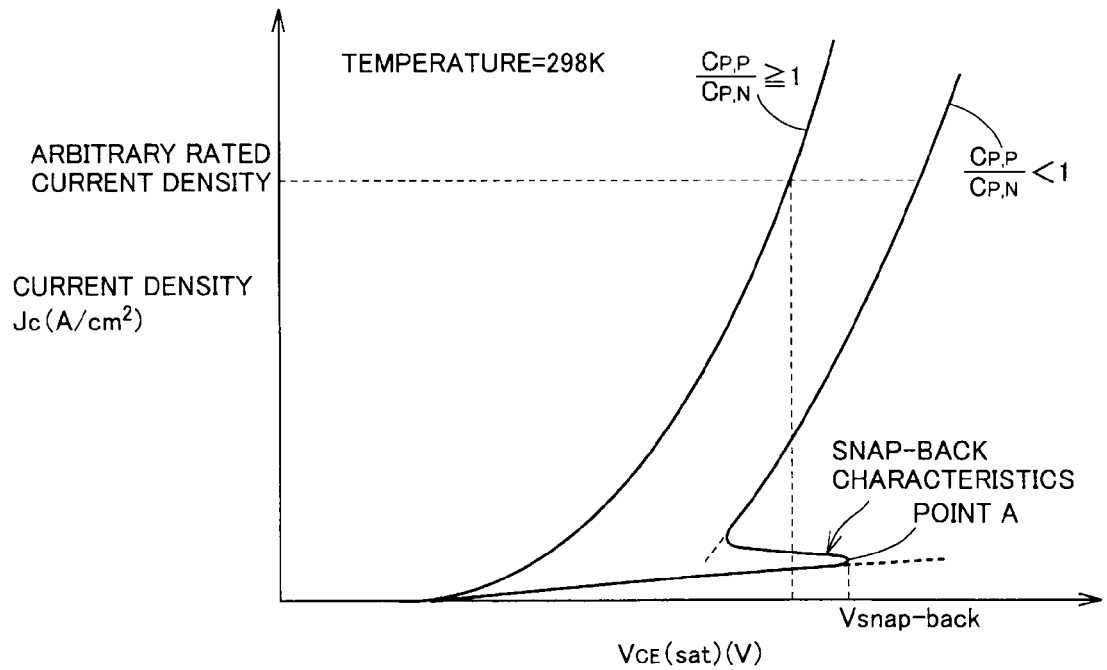
FIG. 22 is a diagram showing the $C_{P,P}/C_{P,N}$ dependency in the relation between $V_{CE}(sat)$ and $J_C$ according to the second embodiment of the present invention.

FIG. 20 is a diagram showing the relation of $C_{P,P}/C_{P,N}$ to $V_{CE}$(sat) and an energy loss $E_{Off}$ at the time of turning off, according to the second embodiment of the present invention. $E_{Off}$ represents an energy loss at the time when the switching device is turned off. $V_{snap-back}$ represents a collector-emitter voltage at a point A shown in FIG. 22 in the case where the snap-back characteristics occur. FIG. 21 is a diagram showing the relation of $C_{P,P}/C_{P,N}$ to $V_{CE}$(sat) and a leakage current density $J_{CES}$ in the IGBT according to the second embodiment of the present invention. Leakage current density $J_{CES}$ represents a leakage current density between the collector and the emitter in the state where a short circuit occurs between the gate and the emitter. Referring to FIGS. 20 and 21, in the case where the ratio $C_{P,P}/C_{P,N}$ of the maximum value of the impurity concentration in p-type collector region 8 to the maximum value of the impurity concentration in n-type buffer region 7 is $C_{P,P}/C_{P,N}<1$, the snap-back characteristics occur, which causes generation of a snap-back voltage $V_{snap-back}$ accordingly. Consequently, as shown in FIG. 22, $V_{CE}$(sat) to the arbitrary current density is increased under the condition of $C_{P,P}/C_{P,N}<1$. Furthermore, under the condition of $C_{P,P}/C_{P,N}>1\times10^3$, $J_{CES}$ is increased to cause thermal runaway of the IGBT. In view of the foregoing, the condition of $1\leq C_{P,P}/C_{P,N}\leq 1\times10^3$ is preferable in order to prevent the abnormal operation of the IGBT.

Figure 23:
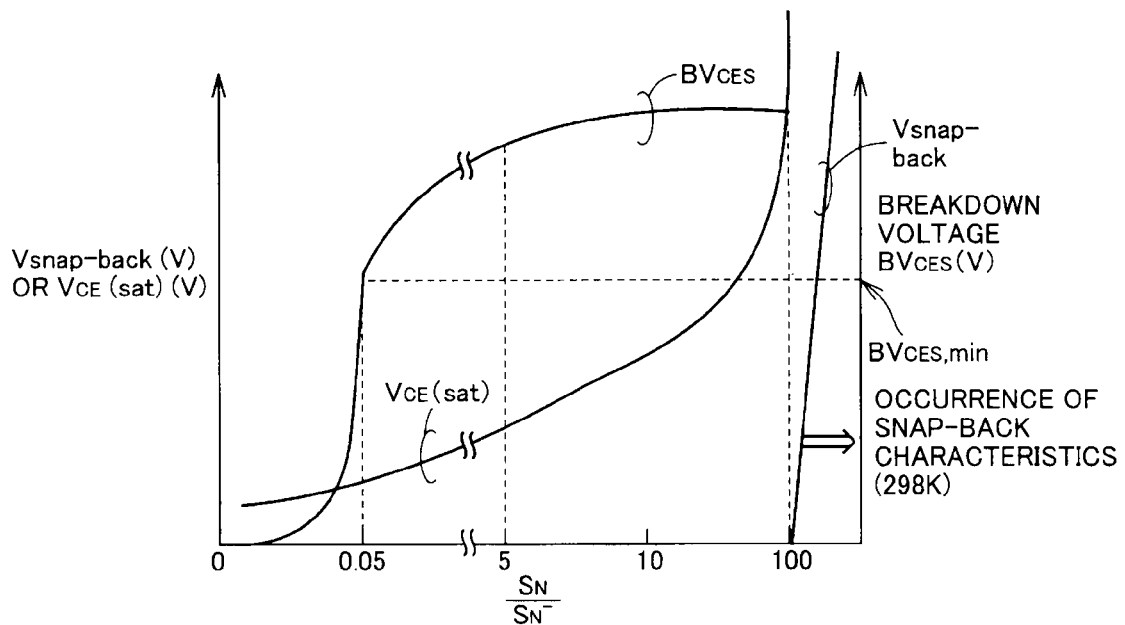
FIG. 23 is a diagram showing the relation of $S_N/S_{N-}$ to $V_{CE}(sat)$ and a breakdown voltage $BV_{CES}$ according to the second embodiment of the present invention.

FIG. 23 is a diagram showing the relation of $S_N/S_{N-}$ to $V_{CE}$(sat) and a breakdown voltage $BV_{CES}$ according to the second embodiment of the present invention. Breakdown voltage $BV_{CES}$ represents a breakdown voltage between the collector and the emitter in the state where a short circuit occurs between the collector and the emitter. Referring to FIG. 23, in the case where the ratio $S_N/S_{N-}$ of the number of atoms per unit area (atom/cm²) of the impurities forming n-type buffer region 7 to the number of atoms per unit area (atom/cm²) of the impurities forming n⁻ drift layer 1 is $0.05\leq S_N/S_{N-}$, a high breakdown voltage $BV_{CES}$ is achieved. Furthermore, in the case where $S_N/S_{N-}$ shows the condition of $S_N/S_{N-}\leq 100$, the snap-back characteristics are suppressed and emitter-collector voltage $V_{CE}$(sat) is also kept low. In view of the foregoing, the condition of $0.05\leq S_N/S_{N-}\leq 100$ is preferable in order to prevent the abnormal operation of the IGBT to allow parallel operation.

Figure 24:
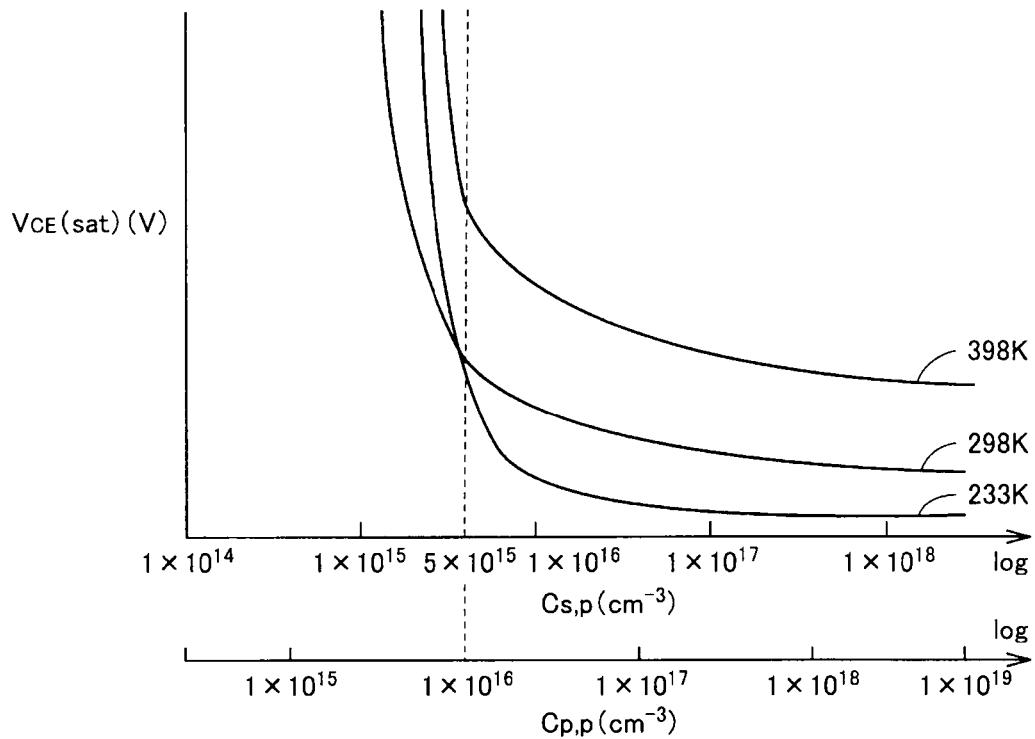
FIG. 24 is a diagram showing the temperature dependency in the relation of $C_{S,P}$ and $C_{P,P}$ to $V_{CE}(sat)$ according to the second embodiment of the present invention.

FIG. 24 is a diagram showing the temperature dependency in the relation of $C_{S,P}$ and $C_{P,P}$ to $V_{CE}$(sat) according to the second embodiment of the present invention. Referring to FIG. 24, at any of temperatures of 233K, 298K and 398K, emitter-collector voltage $V_{CE}$(sat) is significantly decreased under the conditions of $5\times10^{15}\leq C_{S,P}$ and $1\times10^{16}\leq C_{P,P}$. In addition, in light of manufacturing limitations, the conditions of $C_{S,P}\leq 1.0\times10^{22}$ cm⁻³ and $C_{P,P}\leq 1.0\times10^{22}$ cm⁻³ are preferable.

Figure 25:
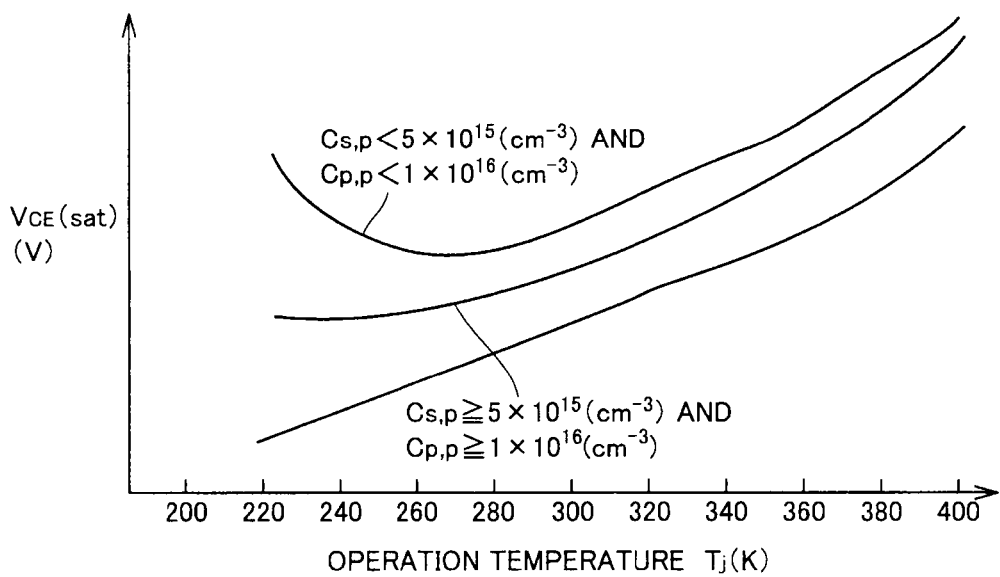
FIG. 25 is a diagram showing the dependency of each of $C_{S,P}$ and $C_{P,P}$ in the relation between $V_{CE}(sat)$ and the operation temperature of the device according to the second embodiment of the present invention.
Figure 26:
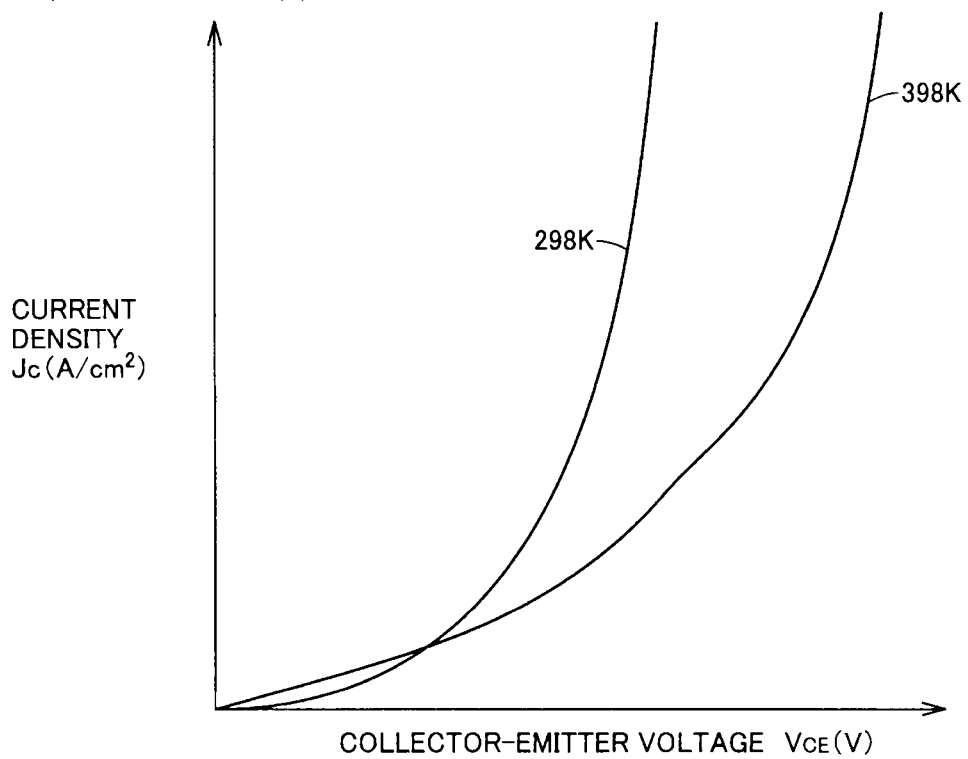
FIG. 26 is a diagram showing the temperature dependency of $J_C$-$V_{CE}$ characteristics under the conditions of $5\times10^{15} \leqq C_{S,P}$ and $1\times10^{16} \leqq C_{P,P}$, according to the second embodiment of the present invention.
Figure 27:
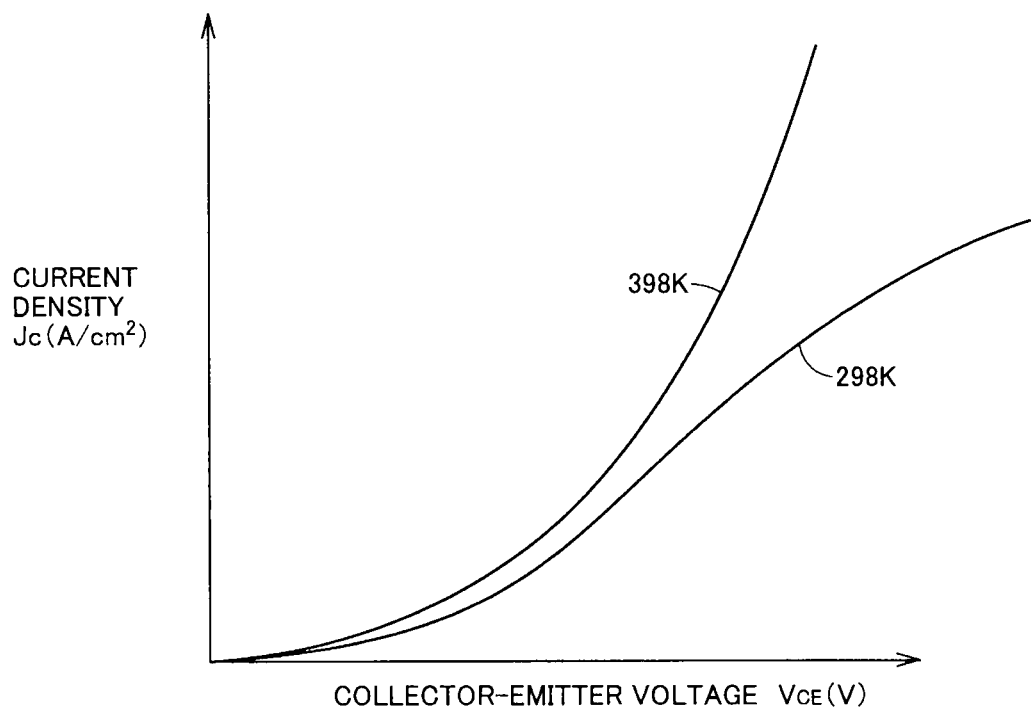
FIG. 27 is a diagram showing the temperature dependency of the $J_C$-$V_{CE}$ characteristics under the conditions of $5\times10^{15} > C_{S,P}$ and $1\times10^{16} > C_{P,P}$, according to the second embodiment of the present invention.

FIG. 25 is a diagram showing the dependency of each of $C_{S,P}$ and $C_{P,P}$ in the relation between $V_{CE}$(sat) and the operation temperature of the device according to the second embodiment of the present invention. FIGS. 26 and 27 each are a diagram showing the temperature dependency of the $J_C$-$V_{CE}$ characteristics according to the second embodiment of the present invention. As can be seen from FIGS. 24-27, the temperature dependency of $V_{CE}$(sat) is rendered positive under the conditions of $5\times10^{15}\leq C_{S,P}$ and $1\times10^{16}\leq C_{P,P}$.

In view of the foregoing, the conditions of $5\times10^{15}\leq C_{S,P}$ and $1\times10^{16}\leq C_{P,P}$ are preferable in order to prevent abnormal operation of the IGBT.

Figure 28:
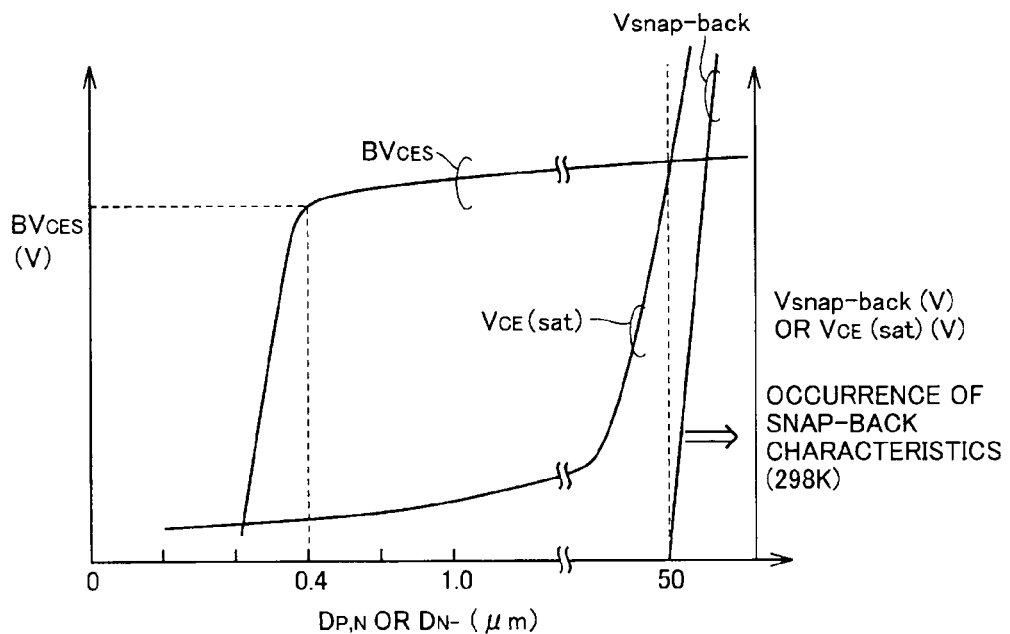
FIG. 28 is a diagram showing the relation of $D_{P,N}$ or $D_{N-}$ to $V_{CE}(\text{sat})$ and $BV_{CES}$ according to the second embodiment of the present invention.

FIG. 28 is a diagram showing the relation of $D_{P,N}$ or $D_{N-}$ to $V_{CE}$(sat) and $BV_{CES}$ according to the second embodiment of the present invention. Referring to FIG. 28, when depth $D_{P,N}$ from the second main surface to the position where concentration $C_{P,N}$ in n-type buffer region 7 is achieved is 0.4 μm$\leq D_{P,N}$, or when depth $D_{N-}$ from the second main surface to the junction plane between n-type buffer region 7 and n⁻ drift layer 1 is 0.4 μm$\leq D_{N-}$, high breakdown voltage $BV_{CES}$ and low emitter-collector voltage $V_{CE}$(sat) are attained. On the other hand, the snap-back characteristics occur under the condition of $D_{P,N}>50$ μm or $D_{N-}>50$ μm.

In view of the foregoing, the conditions of 0.4 μm$\leq D_{P,N}\leq 50$ μm and 0.4 μm$\leq D_{N-}\leq 50$ μm are preferable in order to prevent abnormal operation of the IGBT.

Figure 29:
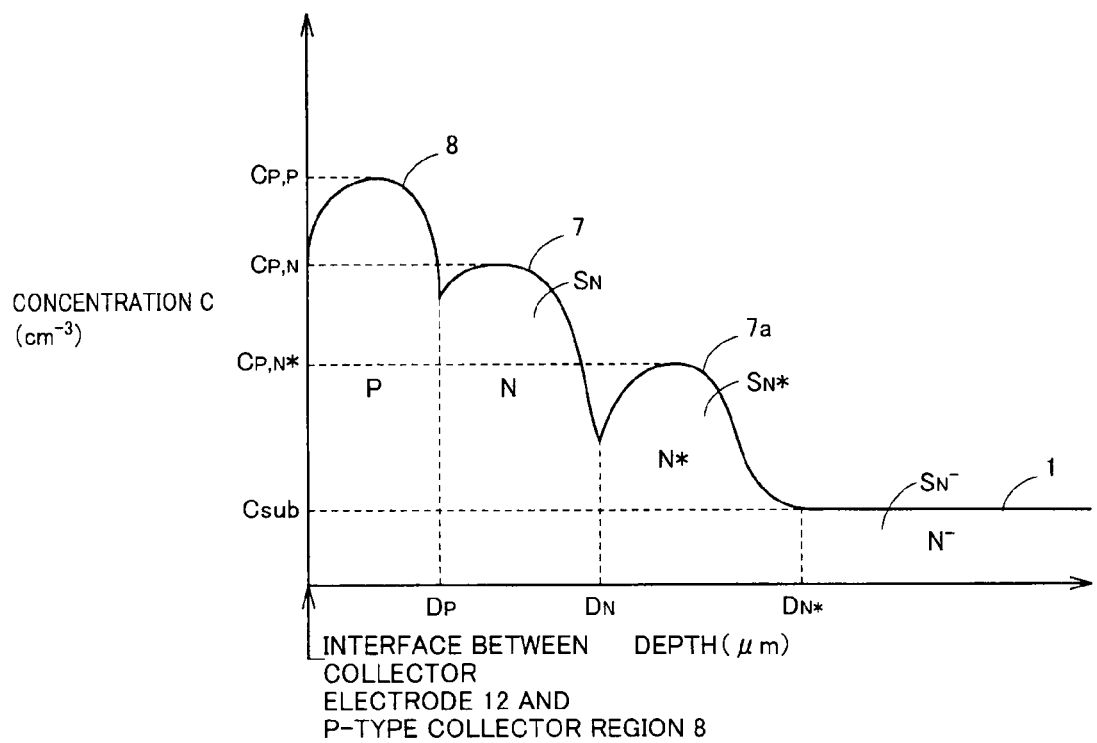
FIG. 29 shows another example of the concentration distribution along a line XVIII-XVIII in FIG. 1.

FIG. 29 shows another example of the concentration distribution along a line XVIII-XVIII in FIG. 1. Referring to FIG. 29, the collector region may further include n-type intermediate layer 7a. A maximum value $C_{P,N*}$ of the impurity concentration in n-type intermediate layer 7a is lower than a maximum value $C_{P,N}$ of the impurity concentration in n-type buffer region 7 and higher than impurity concentration $C_{sub}$ in n⁻ drift layer 1. Furthermore, n-type intermediate layer 7a is in contact with both of n-type buffer region 7 and n drift layer 1. A depth $D_N$ represents a depth from the second main surface to the junction plane between n-type buffer region 7 and n-type intermediate layer 7a. A depth $D_{N*}$ represents a depth from the second main surface to the junction plane between n-type intermediate layer 7a and n⁻ drift layer 1. $S_{N*}$ represents the number of atoms per unit area (atom/cm²) of the impurities forming n-type intermediate layer 7a. Furthermore, n-type intermediate layer 7a may be formed by implanting impurity ions into a part of n-type buffer region 7. Also, it may also be formed by implanting ions causing crystal defects resulting in a lifetime killer into a part of n-type buffer region 7 by the method employing proton irradiation and the like.

Figure 30:
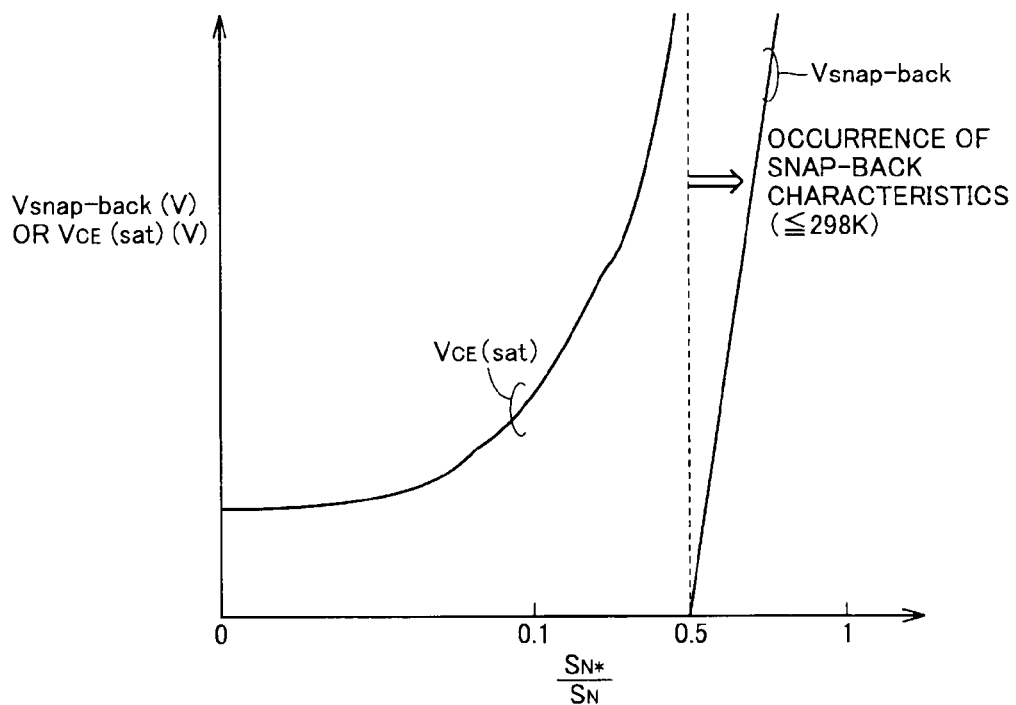
FIG. 30 is a diagram showing the relation between $S_{N*}/S_N$ and $V_{CE}(\text{sat})$ according to the second embodiment of the present invention.

FIG. 30 is a diagram showing the relation between $S_{N*}/S_N$ and $V_{CE}$(sat) according to the second embodiment of the present invention. Referring to FIG. 30, in the case where the ratio $S_{N*}/S_N$ of the number of atoms per unit area (atom/cm²) of the impurities forming n-type intermediate layer 7a to the number of atoms per unit area (atom/cm$^2$) of the impurities forming n-type buffer region 7 is $0.5<S_{N*}/S_N$, the snap-back characteristics occur.

In view of the foregoing, the condition of $0<S_{N*}/S_N\leq0.5$ is preferable in order to prevent abnormal operation of the IGBT.

Figure 31:
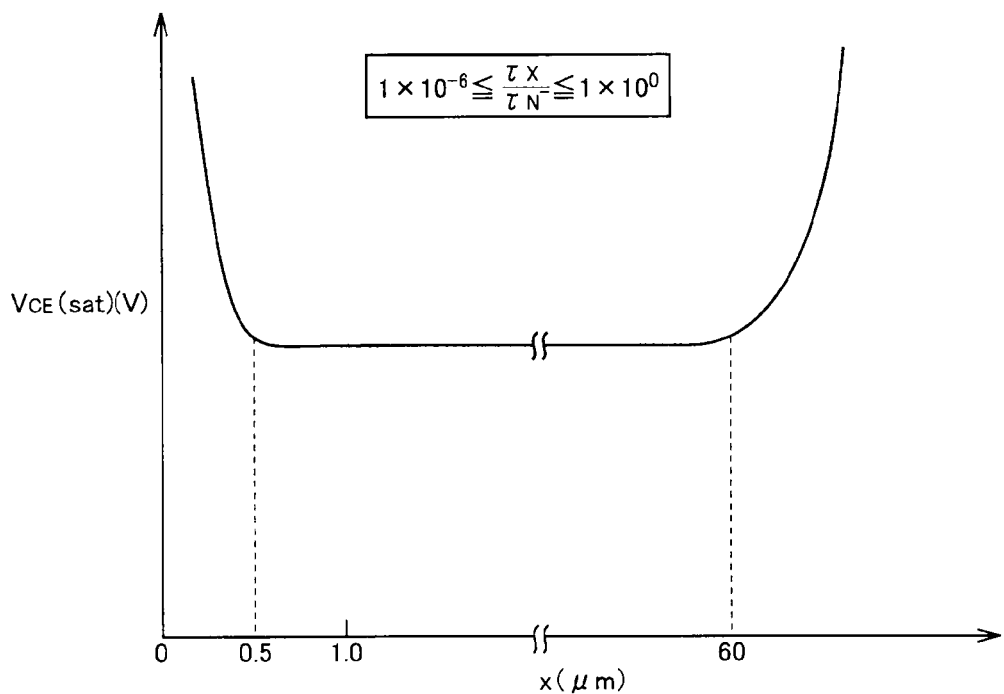
FIG. 31 is a diagram showing the relation between a depth x from the second main surface and $V_{CE}(\text{sat})$ according to the second embodiment of the present invention.
Figure 32:
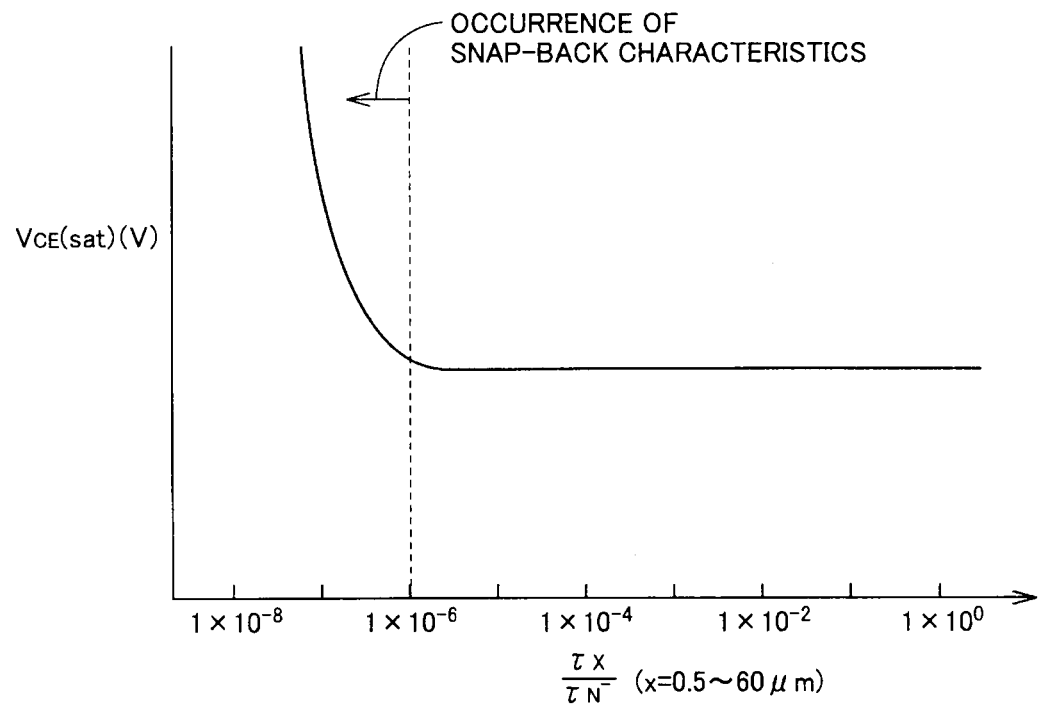
FIG. 32 is a diagram showing the relation between $\tau_x/\tau_{N-}$ and $V_{CE}(\text{sat})$ according to the second embodiment of the present invention.
Figure 33:
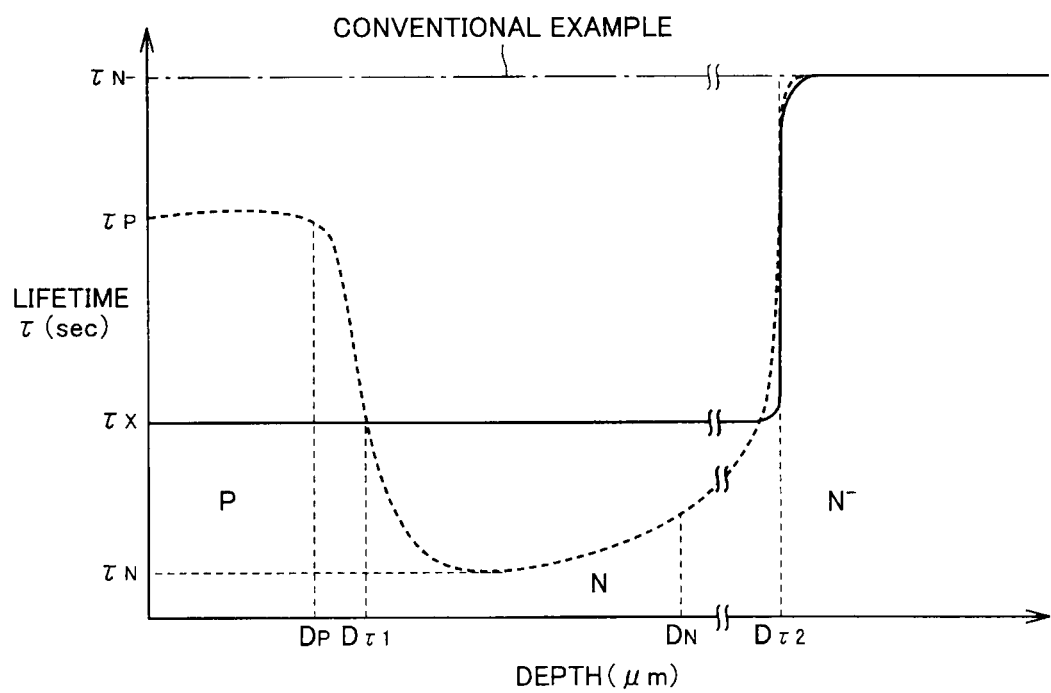
FIG. 33 is a diagram showing an example of the relation between depth x from the second main surface and the carrier lifetime according to the second embodiment of the present invention.

FIG. 31 is a diagram showing the relation between a depth x from the second main surface and V$_{CE}$(sat) according to the second embodiment of the present invention. FIG. 32 is a diagram showing the relation between $\tau_x/\tau_{N-}$ and V$_{CE}$(sat) according to the second embodiment of the present invention. FIG. 33 is a diagram showing an example of the relation between depth x from the second main surface and the carrier lifetime according to the second embodiment of the present invention. Particularly referring to FIG. 33, defects are introduced into the semiconductor substrate in the vicinity of the second main surface during ion implantation for forming p-type collector region 8 and n-type buffer region 7. Since it is necessary to implant impurities more deeply when forming n-type buffer region 7 than when forming p-type collector region 8, n-type buffer region 7 is required to be annealed at a temperature higher than that for p-type collector region 8. Consequently, n-type buffer region 7 suffers thermal stress by annealing, with the result that carrier lifetime $\tau_N$ of n-type buffer region 7 is decreased below carrier lifetime $\tau_P$ of p-type collector region 8. Furthermore, the carrier lifetime of each of n-type buffer region 7 and p-type collector region 8 is decreased below carrier lifetime $\tau_{N-}$ of n$^-$ drift layer 1.

Thus, as the ratio $\tau_x/\tau_{N-}$ of carrier lifetime $\tau_x$ at depth x from the second main surface to carrier lifetime $\tau_{N-}$ of n$^-$ drift layer 1 is set under the condition of $1\times10^{-6}\leq\tau_x/\tau_{N-}\leq1$ particularly in the region where depth x from the second main surface is 0.50 μm$\leq$x$\leq$60.0 μm, collector-emitter voltage V$_{CE}$(sat) is significantly decreased as shown particularly in FIGS. 31 and 32.

In this case, a decrease in the carrier lifetime is caused by introducing defects into p-type collector region 8 and n-type buffer region 7 when implanting ions for forming p-type collector region 8 and n-type buffer region 7. The method of annealing the portion having defects introduced thereinto is effective in improving the carrier lifetime. The relation between the annealing technique and the carrier lifetime will then be described.

Figure 34:
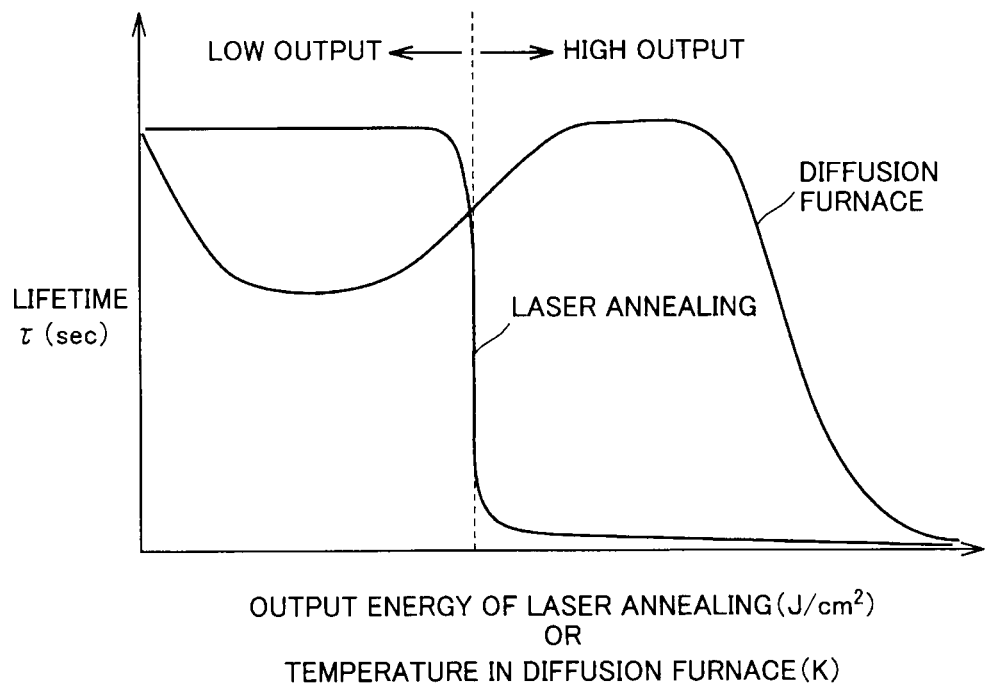
FIG. 34 is a diagram showing the relation of the carrier lifetime to the output of laser annealing and the temperature in a diffusion furnace according to the second embodiment of the present invention.

FIG. 34 is a diagram showing the relation of the carrier lifetime to the output of laser annealing and the temperature in a diffusion furnace according to the second embodiment of the present invention. Referring to FIG. 34, in the case where annealing is performed in the diffusion furnace, an excessively high temperature in the diffusion furnace causes a decrease in the carrier lifetime. Furthermore, when laser annealing is performed with high output energy by the laser annealing technique, the carrier lifetime is also decreased. In addition, since a laser beam has the property of attenuating within the semiconductor substrate, the output power of laser annealing needs to be increased when the depth from the second main surface of the semiconductor substrate to the junction plane between p-type collector region 8 and n-type buffer region 7 is excessively large. This makes it difficult to improve the carrier lifetime by laser annealing. In consideration of the above situation, it is preferable that the depth from the second main surface of the semiconductor substrate to the junction plane between p-type collector region 8 and n-type buffer region 7 is greater than 0 and not more than 1.0 μm.

Figure 35:
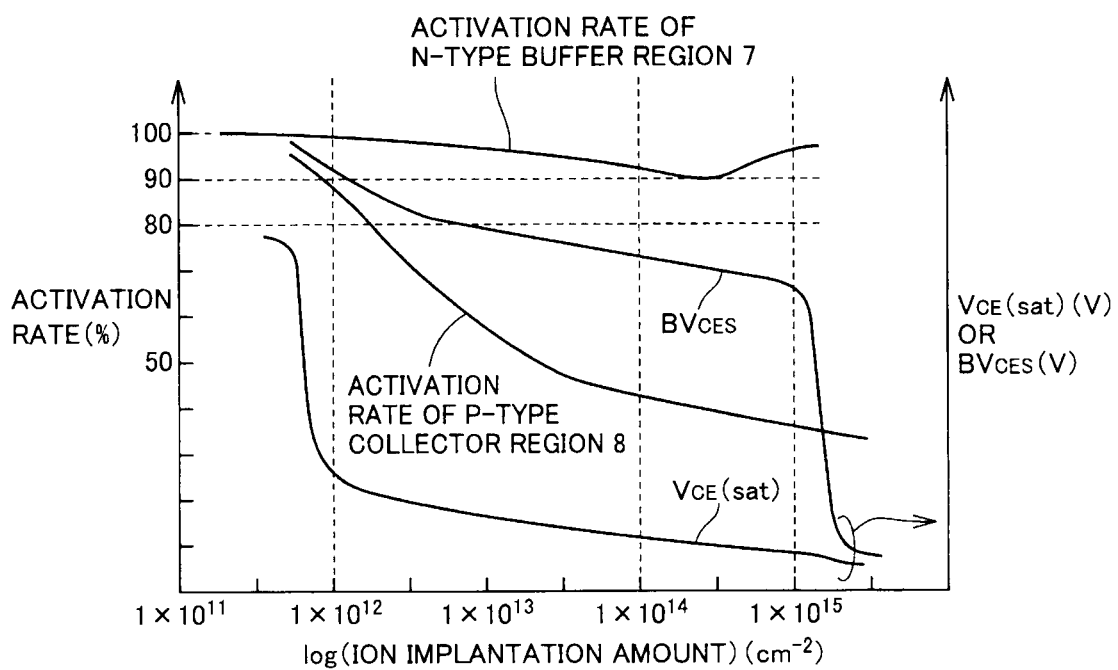
FIG. 35 is a diagram showing the relation of the ion implantation amount to a carrier activation rate, $V_{CE}(\text{sat})$ and $BV_{CES}$, according to the second embodiment of the present invention.

FIG. 35 is a diagram showing the relation of the ion implantation amount to the carrier activation rate, V$_{CE}$(sat) and BV$_{CES}$, according to the second embodiment of the present invention. Referring to FIG. 35, the activation rate in each of n-type buffer region 7 and p-type collector region 8 depends on the ion implantation amount or the type of ions in n-type buffer region 7 and p-type collector region 8. In FIG. 35, the activation rate in p-type collector region 8 is different from that in n-type buffer region 7, and the activation rate in p-type collector region 8 is lower than that in n-type buffer region 7. This allows the IGBT to be normally operated to increase breakdown voltage BV$_{CES}$. In particular, in the case where the activation rate in p-type collector region 8 is greater than 0 and not more than 90%, collector-emitter voltage V$_{CE}$(sat) is greatly decreased.

The activation rate is calculated by the following expression (1).

Activation rate: {(impurity concentration(cm$^{-3}$)obtained from the resistance value calculated by the method such as an SR(spreading-resistance)measurement)/(impurity concentration(cm$^{-3}$)measured using an SIMS(Secondary Ionization Mass Spectrometer))}×100      (1)

By using the above-described collector structure, the normal operation of the IGBT can be ensured, a high withstand voltage can be maintained, and thermal runaway of the IGBT can be suppressed. Furthermore, the flexibility (controllability) of the trade-off characteristics of V$_{CE}$(sat)-E$_{OFF}$ can be achieved even with the N$^-$ drift layer reduced in thickness, when the device characteristics are to be improved.

Third Embodiment

It is effective to reduce the thickness of n$^-$ drift layer 1 in order to improve the V$_{CE}$(sat)-E$_{off}$ characteristics regarded as important device characteristics of the IGBT. However, the inventor of the present application found that the surface roughness of the polished surface affects each characteristic of the IGBT when the second main surface of the semiconductor substrate is polished as shown in FIG. 11.

Figure 36:
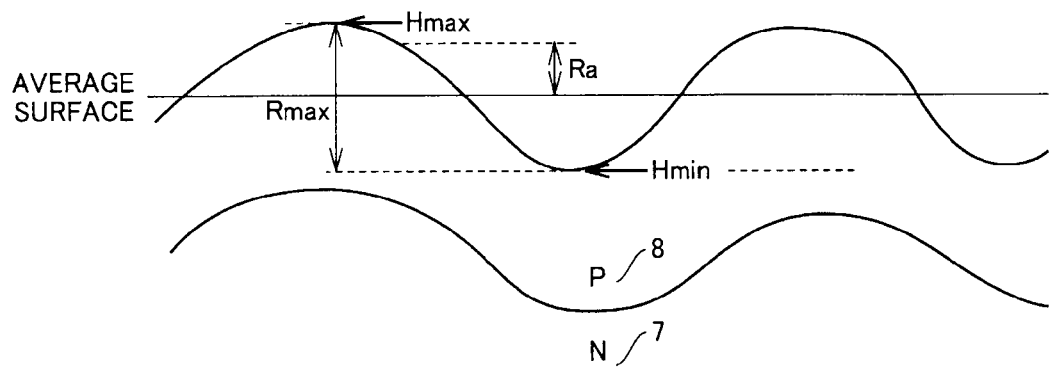
FIG. 36 is an enlarged cross sectional view schematically showing the second main surface of the semiconductor substrate according to the third embodiment of the present invention.

FIG. 36 is an enlarged cross sectional view schematically showing the second main surface of the semiconductor substrate according to the third embodiment of the present invention. Referring to FIG. 36, the center line average roughness defined in the present embodiment represents a center line average roughness R$_a$ specified in JIS (Japanese Industrial Standard) and corresponds to an average value of the absolute value deviation from the center line. Furthermore, the maximum height represents a maximum height R$_{max}$ specified in JIS and corresponds to a height (R$_{max}$=H$_{max}$-H$_{min}$) from the bottom of the valley (height H$_{min}$) to the highest peak (height H$_{max}$) in the reference length.

Figure 37:
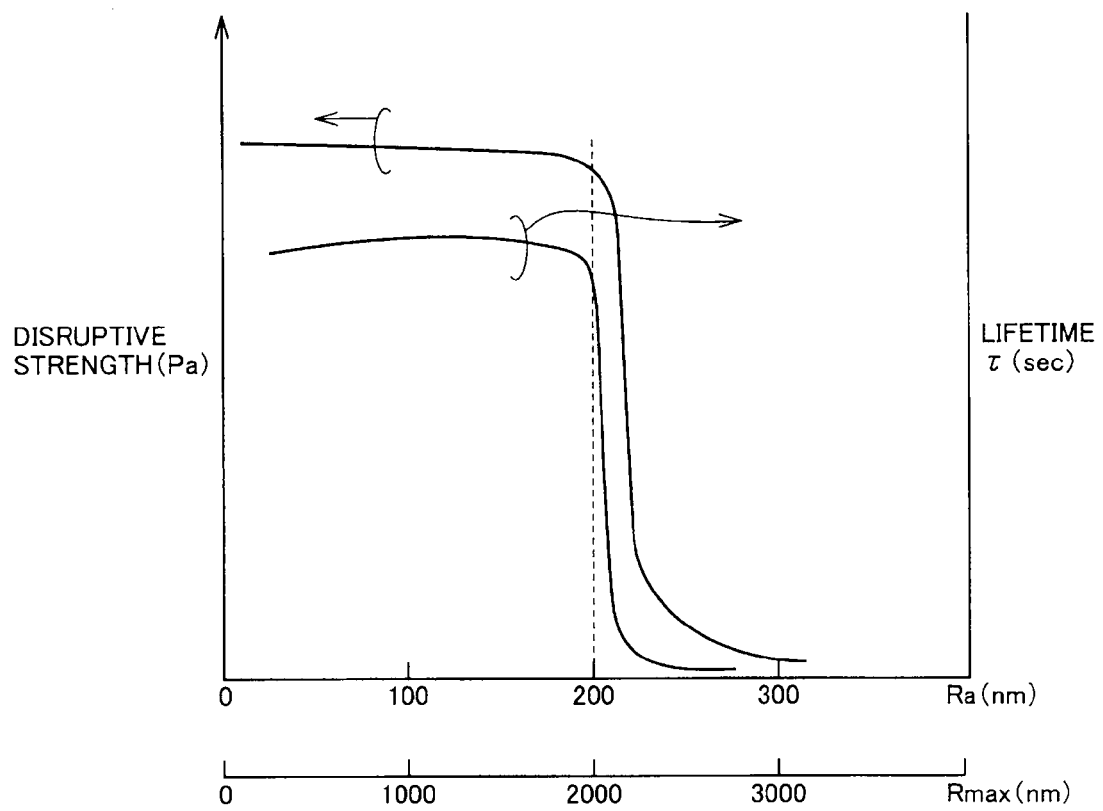
FIG. 37 is a diagram showing the relation of a center line average roughness $R_a$ and a maximum height $R_{max}$ to each of the breaking strength and the carrier lifetime, according to the third embodiment of the present invention.
Figure 38:
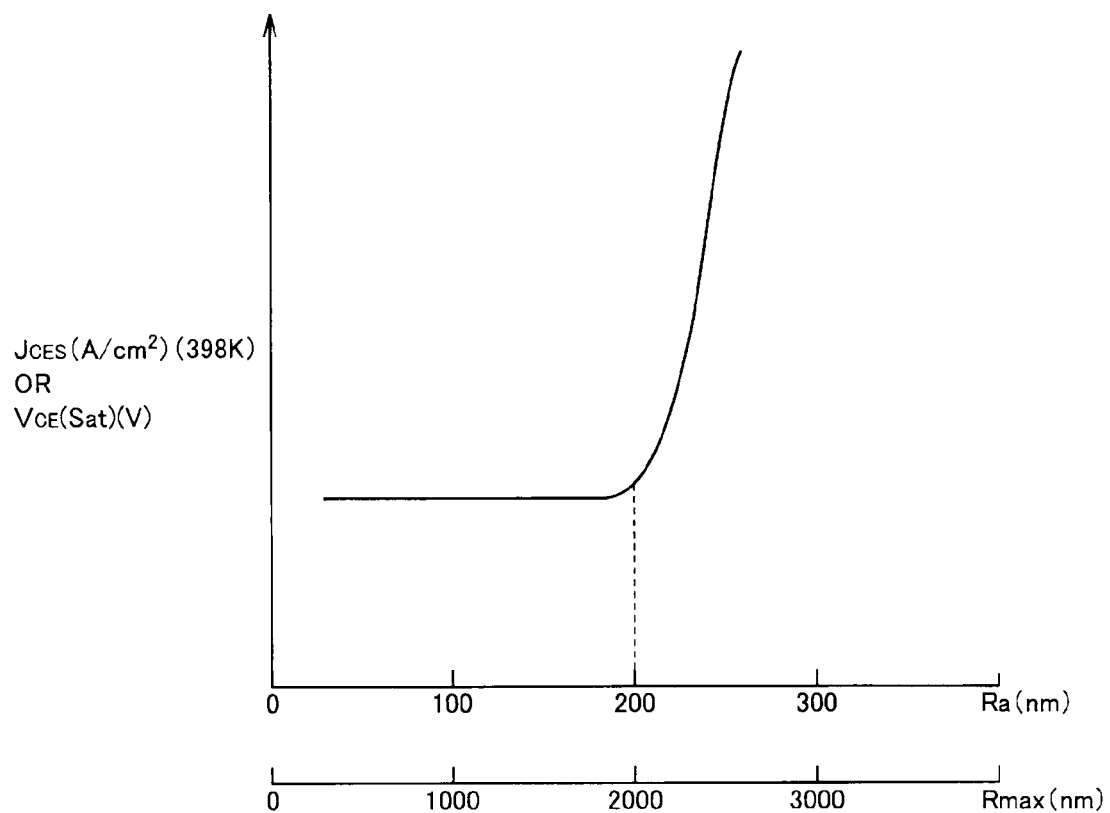
FIG. 38 is a diagram showing the relation of $R_a$ and $R_{max}$ to each of $J_{CES}$ and $V_{CE}(\text{sat})$, according to the third embodiment of the present invention.

FIG. 37 is a diagram showing the relation of each of the center line average roughness and the maximum height to the breaking strength and the carrier lifetime, according to the third embodiment of the present invention. Referring to FIG. 37, under the conditions of $0<R_a\leq200$ nm and $0<R_{max}\leq2000$ nm, high breaking strength and carrier lifetime can be achieved. FIG. 38 is a diagram showing the relation of each of the center line average roughness and the maximum height to J$_{CES}$ and V$_{CE}$(sat), according to the third embodiment of the present invention. Referring to FIG. 38, under the conditions of $0<R_a\leq200$ nm and $0<R_{max}\leq2000$ nm, low collector-emitter voltage V$_{CE}$(sat) and low leakage current density J$_{CES}$ can be achieved.

As described above, various characteristics of the IGBT can be improved under the conditions of $0<R_a\leq200$ nm or $0<R_{max}\leq2000$ nm.

Fourth Embodiment

In the present embodiment, the configuration of the MOS transistor producing the same effect as that obtained by the configuration according to each of the first to third embodiments will then be described.

Figure 39:
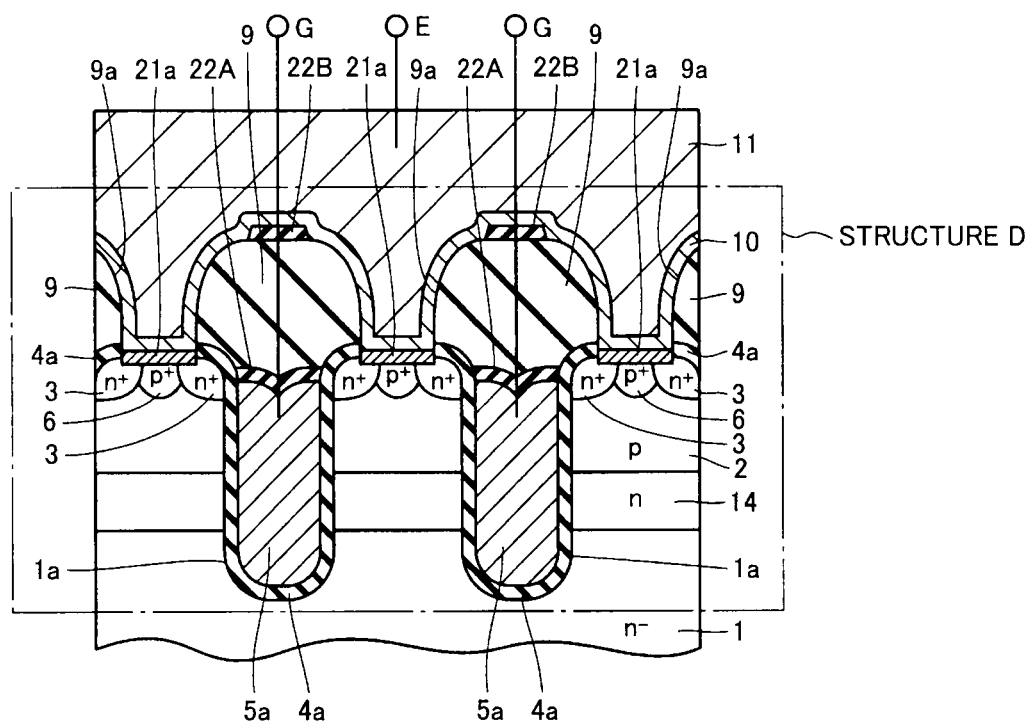
FIG. 39 is a cross sectional view showing the configuration of a MOS transistor portion in the semiconductor device according to the fourth embodiment of the present invention.

FIG. 39 is a cross sectional view showing the configuration of a MOS transistor portion in the semiconductor device according to the fourth embodiment of the present invention. Referring to FIG. 39, a structure D in the MOS transistor portion according to the present embodiment is different from a structure C shown in FIG. 1 in that an n-type impurity diffusion region 14 (buried diffusion layer) having a relatively high concentration is provided in the vicinity of the region where n⁻ drift layer 1 forms a pn junction with p-type body region 2. N-type impurity diffusion region 14 is formed between p-type body region 2 and n drift layer 1. Although not shown, a structure A shown in FIG. 1 is formed below structure D in FIG. 39.

It is to be noted that since the configurations other than those described above are almost the same as the configuration of structure C shown in FIG. 1, the same components are designated by the same reference characters, and description thereof will not be repeated.

Figure 40:
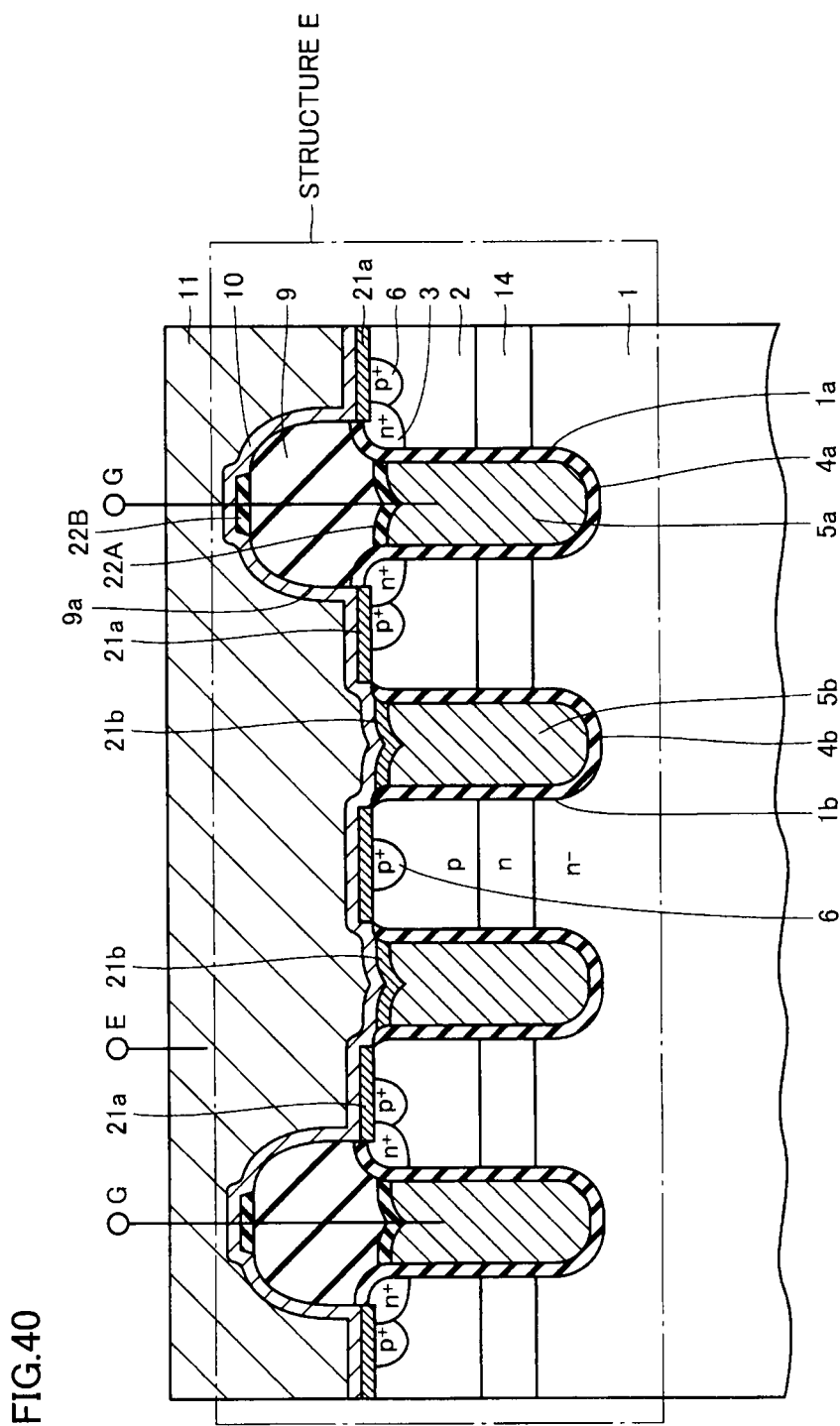
FIG. 40 is a cross sectional view showing the configuration of the first modification of the semiconductor device according to the fourth embodiment of the present invention.
Figure 41:
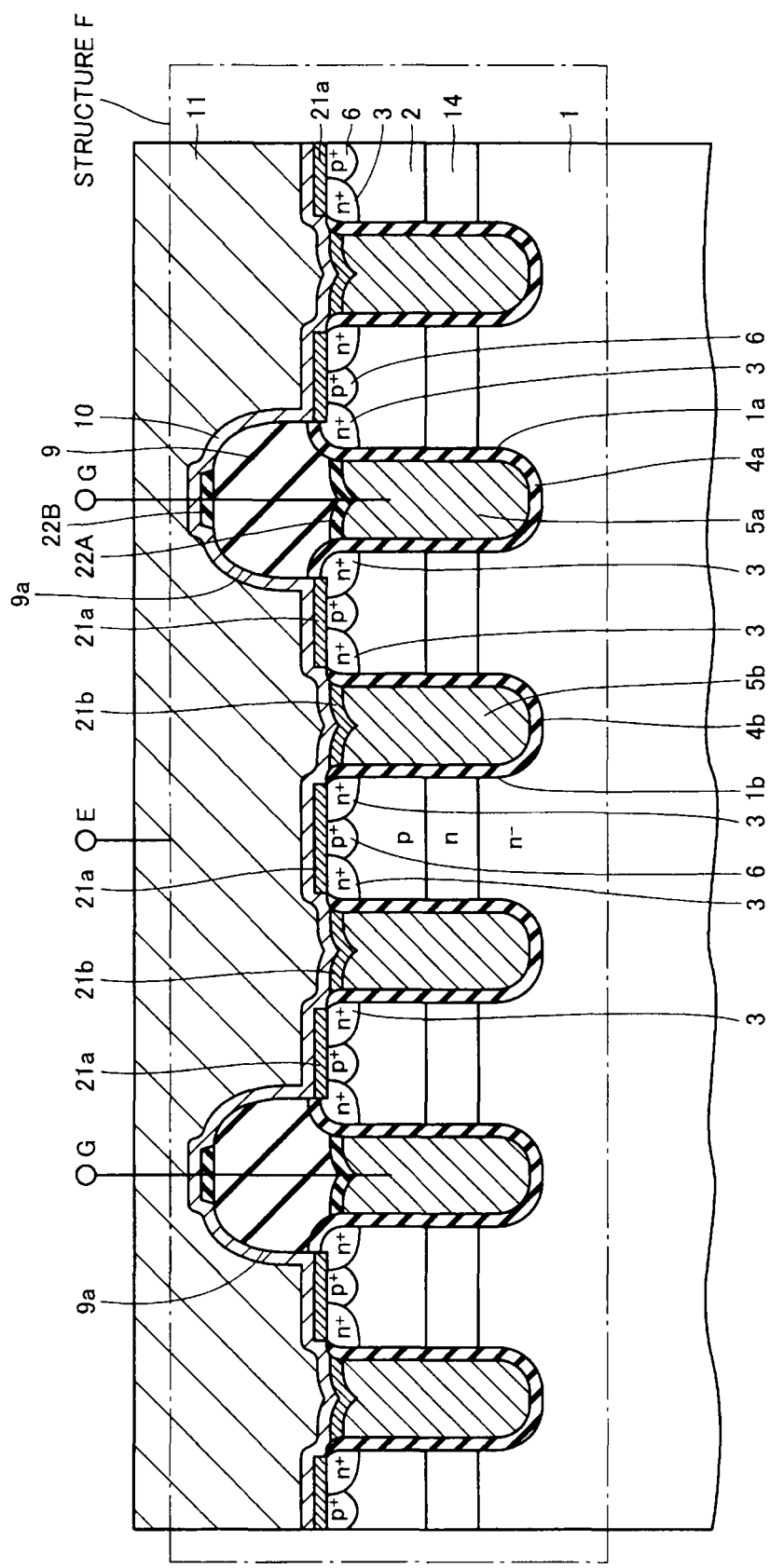
FIG. 41 is a cross sectional view showing the configuration of the second modification of the semiconductor device according to the fourth embodiment of the present invention.

The configuration provided with n-type impurity diffusion region 14 is not limited to the configuration in FIG. 39, but may be the configuration shown, for example, in FIGS. 40 and 41. In other words, n-type impurity diffusion region 14 may be provided in the configuration including an emitter trench.

FIG. 40 is a cross sectional view showing the configuration of the modification of the semiconductor device according to the fourth embodiment of the present invention. Referring to FIG. 40, structure E is provided with an emitter trench in the region interposed between two MOS transistors. The emitter trench is formed of an emitter groove 1b, an emitter insulating film 4b and an emitter conductive layer 5b. Emitter groove 1b extends through p-type body region 2 and n-type impurity diffusion region 14 to n⁻ drift layer 1. Emitter insulating film 4b is formed along the inner surface of emitter groove 1b. Emitter conductive layer 5b is formed so as to fill emitter groove 1b and electrically connected to emitter electrode 11 located thereabove. Any number of emitter trenches may be formed, and a gate trench only needs to be formed in at least one of a plurality of grooves.

Barrier metal layer 10 is formed below emitter electrode 11, and a silicide layer 21b is formed between this barrier metal layer 10 and emitter conductive layer 5b.

On the first main surface interposed between two emitter trenches, p⁺ impurity diffusion region 6 for providing low resistance contact with p-type body region 2 is formed, on which silicide layer 21a is formed.

In the configuration as described above, n-type impurity diffusion region 14 having a relatively high concentration is provided in the vicinity of the region where n⁻ drift layer 1 forms a pn junction with p-type body region 2.

It is to be noted that since the configurations other than those described above are almost the same as the configuration of structure D shown in FIG. 39, the same components are designated by the same reference characters, and description thereof will not be repeated.

Furthermore, a structure F shown in FIG. 41 is different from structure E shown in FIG. 40 in that n-type impurity diffusion region 3 is additionally provided on the sidewall of the emitter trench and on the first main surface.

It is to be noted that since the configurations other than those described above are almost the same as the configuration of structure E shown in FIG. 39, the same components are designated by the same reference characters, and description thereof will not be repeated.

In FIGS. 40 and 41, although the case where emitter conductive layer 5b filling emitter groove 1b is at an emitter potential has been described, this emitter conductive layer 5b may have a floating potential. The configuration thereof will be described below.

Figure 42:
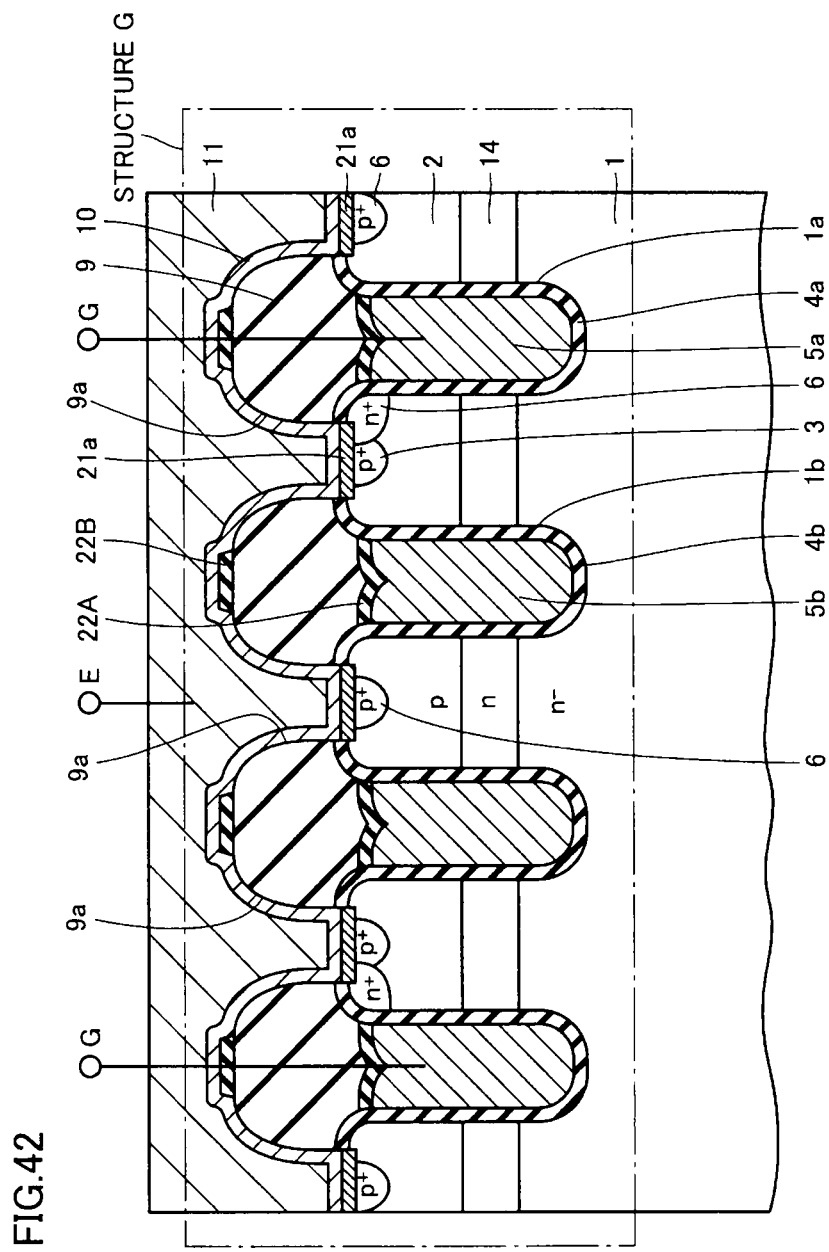
FIG. 42 is a cross sectional view showing the configuration of the third modification of the semiconductor device according to the fourth embodiment of the present invention.

Referring to FIG. 42, emitter conductive layer 5b filling emitter groove 1b is electrically separated from emitter electrode 11, and has a floating potential. In this case, an insulating film 22A made of, for example, a silicon oxide film, an insulating film 9 made of for example, silicate glass, and an insulating film 22B made of, for example, a silicon oxide film are formed on emitter conductive layer 5b filling emitter groove 1b.

It is to be noted that since the configurations other than those described above are almost the same as the configuration of structure E shown in FIG. 40, the same components are designated by the same reference characters, and description thereof will not be repeated.

N-type impurity diffusion region 14 provided in the present embodiment is formed by ion implantation and diffusion before p-type body region 2 is formed. Then, p-type body region 2 is formed and subjected to the post process similar to those in the first embodiment, to manufacture each type of semiconductor device according to the present embodiments (FIGS. 39-42).

Furthermore, each of MOS transistor structures E (FIG. 40), F (FIG. 41) and G (FIG. 42) includes a trench having an emitter potential or a floating potential, to thereby cause an effective gate width less than those in MOS transistor structures C (FIG. 1) and D (FIG. 39). As a result, each of structures E, F and G receives a current which is less than the current flowing through each of structures C and D, and therefore, achieves an effect of suppressing the saturation current.

Furthermore, in each of structures E, F and G, the on-state voltage is increased in the area where the voltage/current density is lower than that in structure D. The reason why the ON voltage falls in MOS transistor structure D is that n-type impurity diffusion region 14 disclosed in U.S. Pat. No. 6,040,599 produces the carrier storage effect even if collector structure A has a thick n⁻ drift layer 1. MOS transistor structure D produces an effect of reducing the ON voltage even if n⁻ drift layer 1 is thicker than that in the conventional structure.

In MOS transistor structures E, F and G, the effect of reducing the saturation current allows an arbitrary current to be maintained for a period of time longer than that in the case of the conventional structure or MOS transistor structures C and D when the device performs switching under unloaded conditions. In other words, MOS transistor structures E, F and G each produce an effect of suppressing the saturation current in the device and improving breakdown tolerance.

Furthermore, in MOS transistor structure D having an effect of lowering the ON voltage, an oscillation phenomenon occurs at the time of the switching under unloaded conditions. In contrast, MOS transistor structures E, F and G each produce an effect of preventing the oscillation phenomenon because emitter conductive layer 5b having an emitter potential or a floating potential exists even though n-type impurity diffusion region 14 is provided therein.

Fifth Embodiment

FIGS. 43-78 each are a cross sectional view showing each type of derivative structure of the MOS transistor structure producing the same effect as that in the fourth embodiment. The structure shown in each of FIGS. 43-78 can achieve the effect produced by the MOS transistor structure as illustrated in the fourth embodiment.

Each MOS transistor structure shown in FIGS. 43-78 will be hereinafter described.

Figure 43:
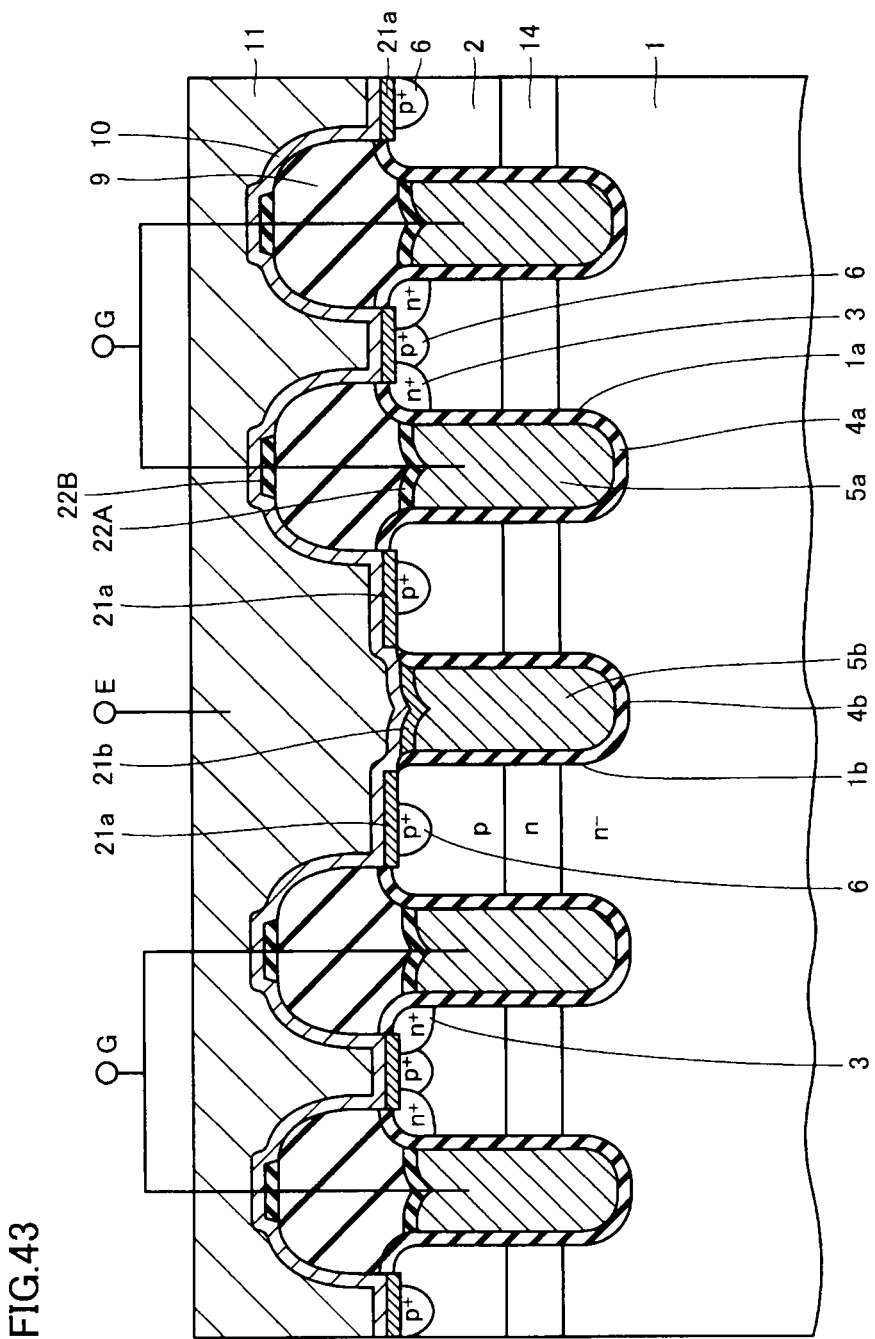
FIG. 43 is a schematic cross sectional view showing the derivative structure of the MOS transistor structure according to the fifth embodiment of the present invention.

The configuration shown in FIG. 43 is different from the configuration of structure E shown in FIG. 40 in that one emitter trench being at an emitter potential is provided in the region interposed between two MOS transistor portions and that n-type emitter region 3 is formed only on one side surface of gate groove 1a.

Figure 44:
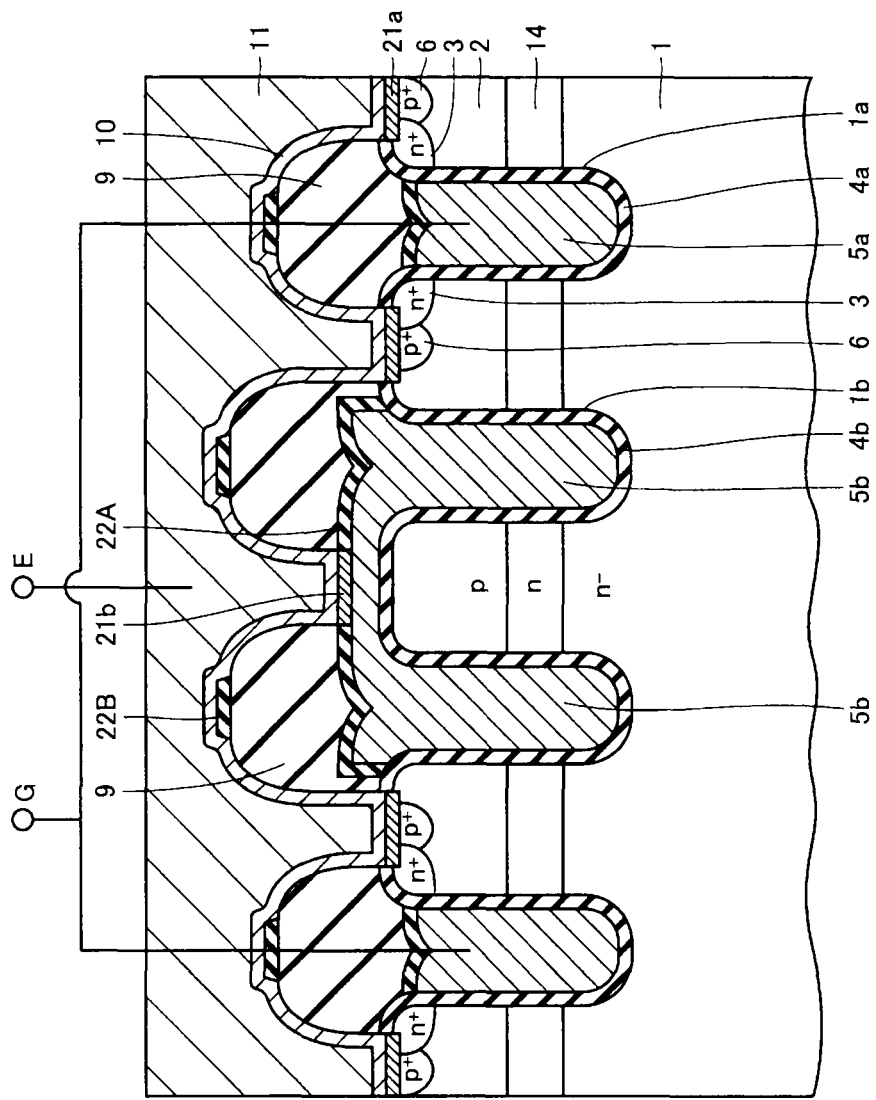
FIG. 44 is a schematic cross sectional view showing the derivative structure of the MOS transistor structure according to the fifth embodiment of the present invention.

In the configuration shown in FIG. 44, emitter conductive layer 5b made of an integrated single layer fills a plurality of emitter grooves 1b. Emitter conductive layer 5b is electrically connected to barrier metal layer 10 and emitter electrode 11 through silicide layer 21b. Silicide layer 21b is formed on a bridge connecting emitter grooves 1b to each other. Furthermore, insulating films 22A, 9 and 22B are formed on emitter conductive layer 5b other than the area where silicide layer 21b is formed.

It is to be noted that since the configurations other than those described above are almost the same as the configuration of the above-described structure E shown in FIG. 40, the same components are designated by the same reference characters, and description thereof will not be repeated.

Figure 45:
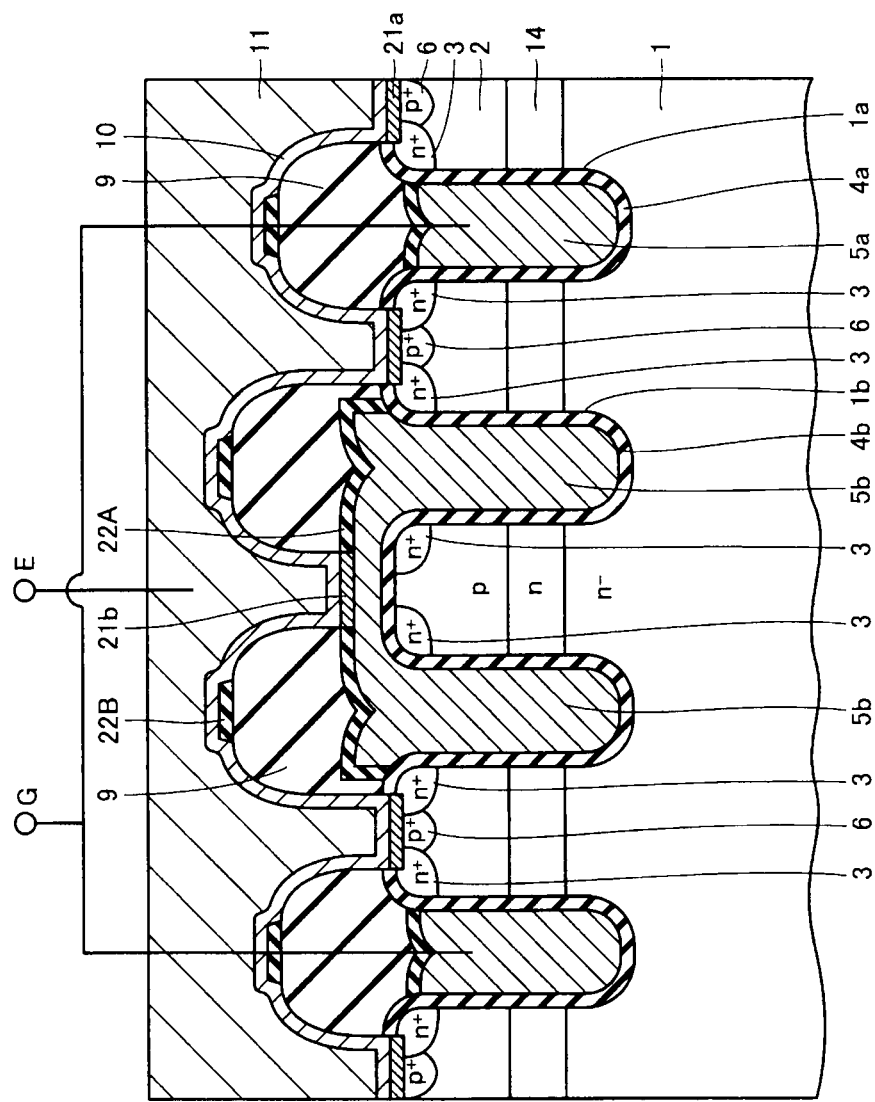
FIG. 45 is a schematic cross sectional view showing the derivative structure of the MOS transistor structure according to the fifth embodiment of the present invention.

The configuration shown in FIG. 45 is different from the configuration shown in FIG. 44 in that n-type impurity diffusion region 3 is additionally provided on both sidewalls of emitter groove 1b and on the first main surface.

Figure 46:
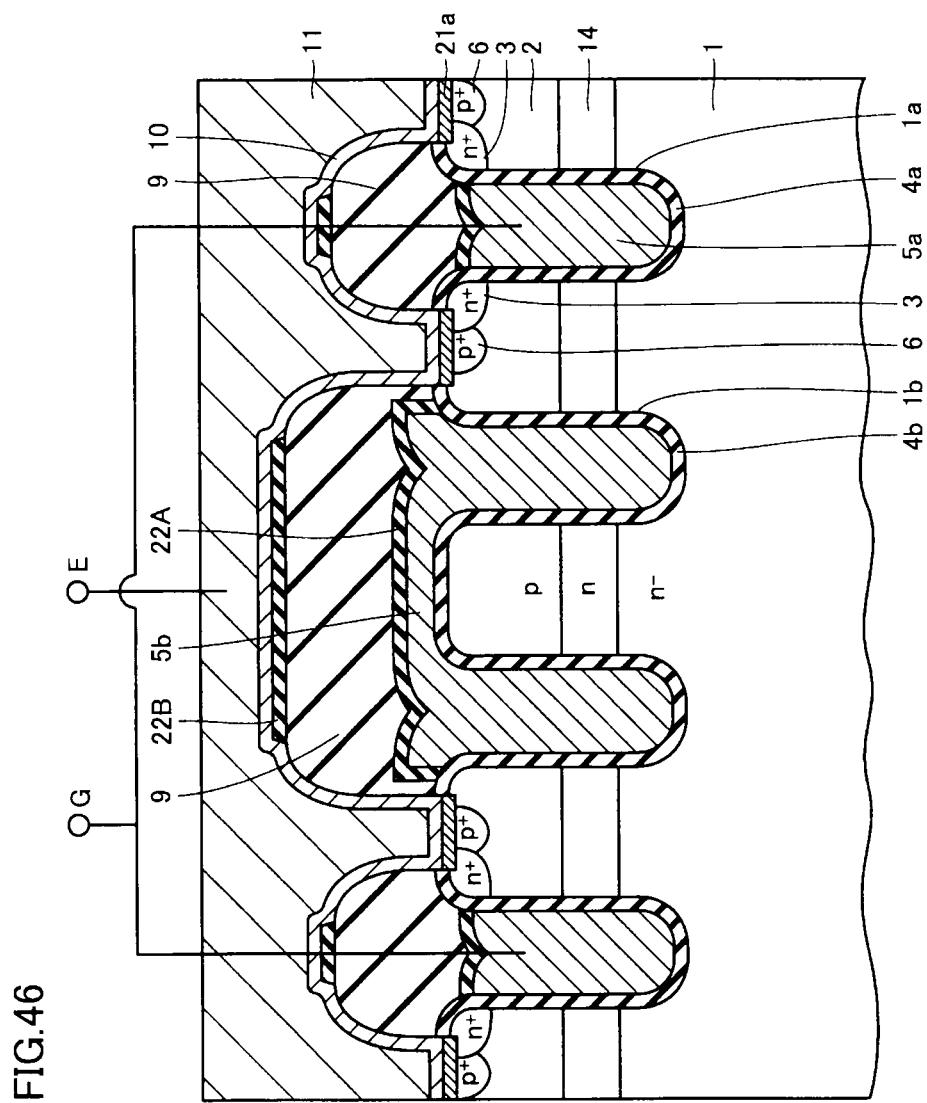
FIG. 46 is a schematic cross sectional view showing the derivative structure of the MOS transistor structure according to the fifth embodiment of the present invention.

The configuration shown in FIG. 46 is different from the configuration in FIG. 44 in that emitter conductive layer 5b filling emitter groove 1b is at a floating potential. In this case, insulating films 22A, 9 and 22B are formed on the entire surface of emitter conductive layer 5b which is electrically insulated from emitter electrode 11.

Figure 47:
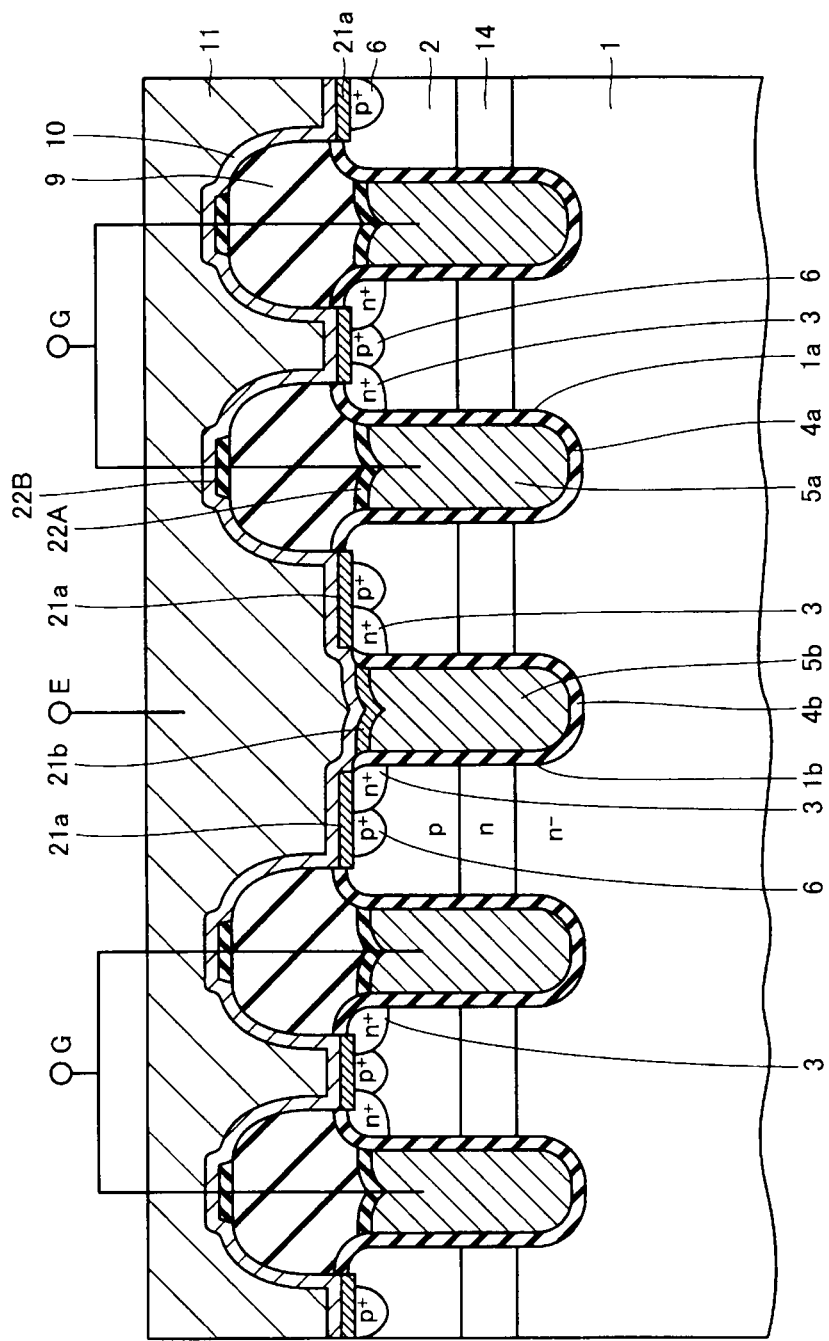
FIG. 47 is a schematic cross sectional view showing the derivative structure of the MOS transistor structure according to the fifth embodiment of the present invention.

The configuration shown in FIG. 47 is different from the configuration shown in FIG. 43 in that n-type impurity diffusion region 3 is additionally provided on both sidewalls of emitter groove 1b and on the first main surface.

Figure 48:
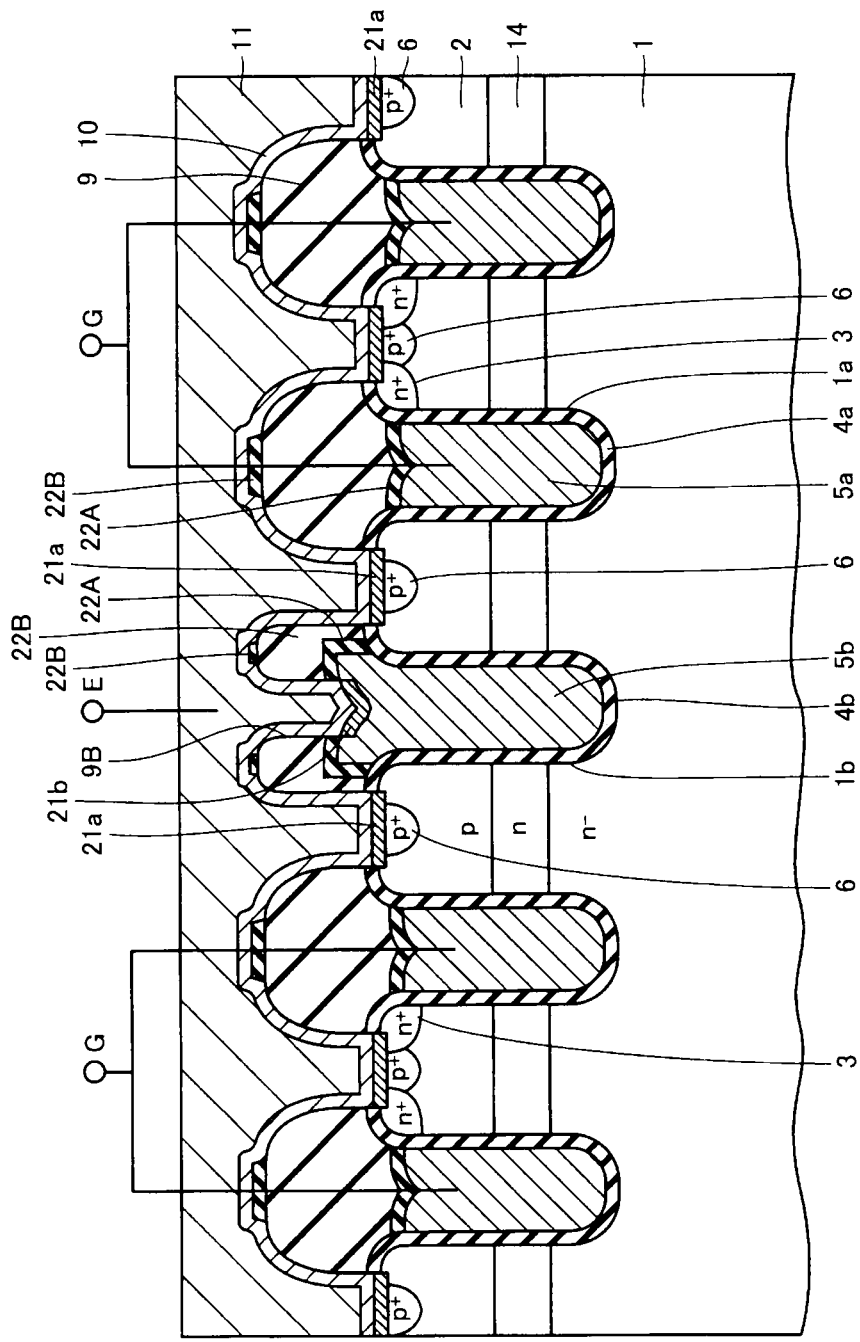
FIG. 48 is a schematic cross sectional view showing the derivative structure of the MOS transistor structure according to the fifth embodiment of the present invention.

The configuration shown in FIG. 48 is different from the configuration shown in FIG. 43 in that the upper surface of emitter conductive layer 5b protrudes above emitter groove 1b. In this case, emitter conductive layer 5b is electrically connected to barrier metal layer 10 and emitter electrode 11 through silicide layer 21b formed on a part of the surface of emitter conductive layer 5b. Furthermore, insulating films 22A, 9 and 22B are formed on emitter conductive layer 5b other than the area where silicide layer 21b is formed.

Figure 49:
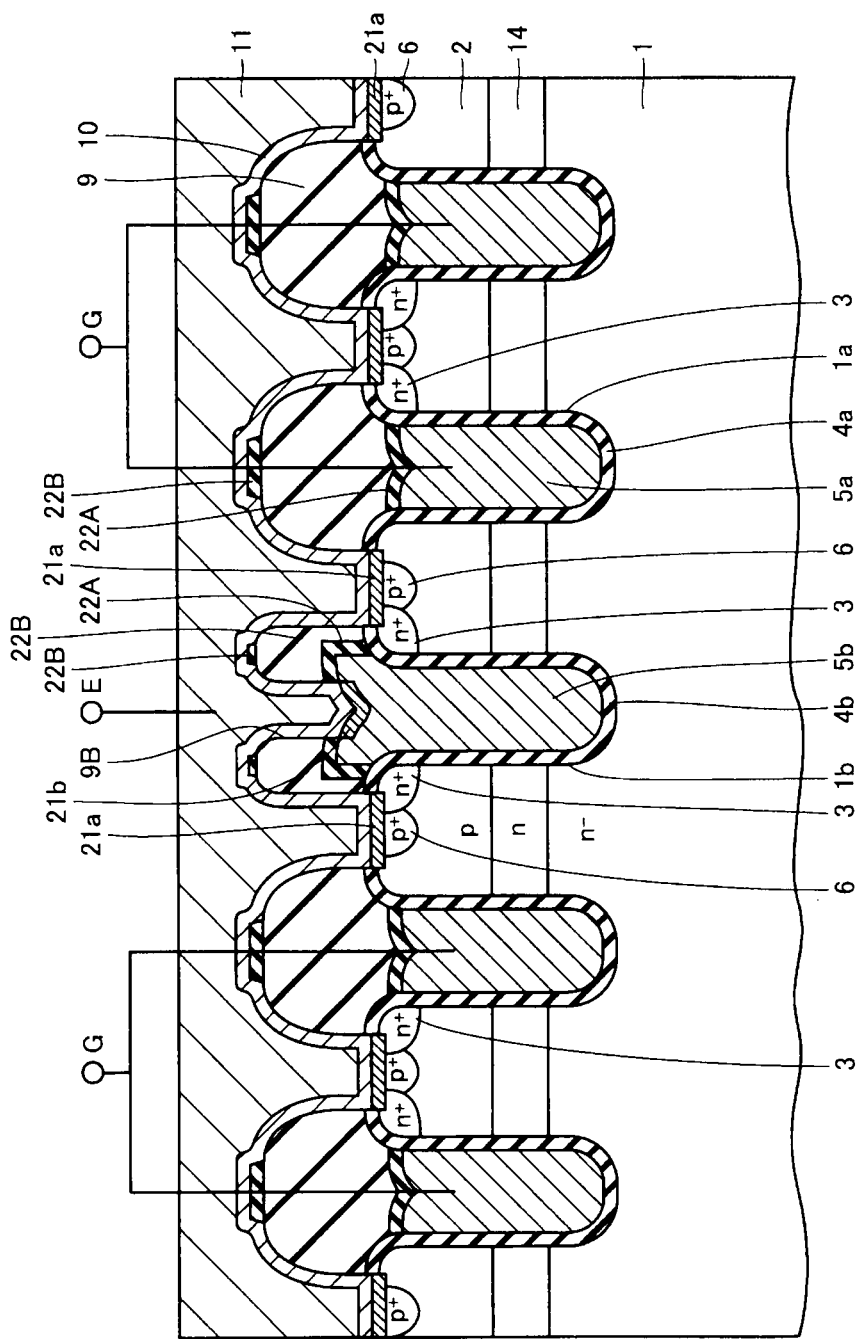
FIG. 49 is a schematic cross sectional view showing the derivative structure of the MOS transistor structure according to the fifth embodiment of the present invention.

The configuration shown in FIG. 49 is different from the configuration shown in FIG. 48 in that n-type impurity diffusion region 3 is additionally provided on both side surfaces of emitter groove 1b and on the first main surface.

Figure 50:
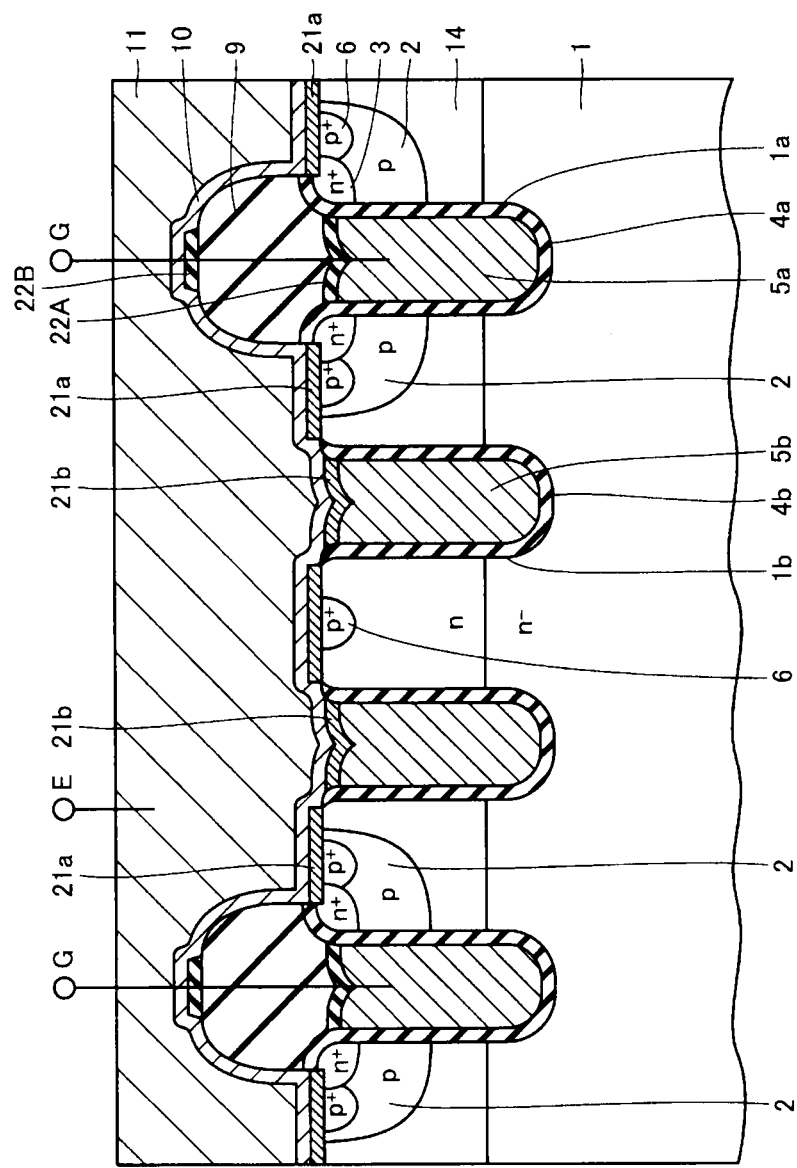
FIG. 50 is a schematic cross sectional view showing the derivative structure of the MOS transistor structure according to the fifth embodiment of the present invention.

The configuration shown in FIG. 50 is different from the configuration of structure E shown in FIG. 40 in that p-type body region 2 is formed only in the vicinity of the sidewall of gate groove 1a.

Figure 51:
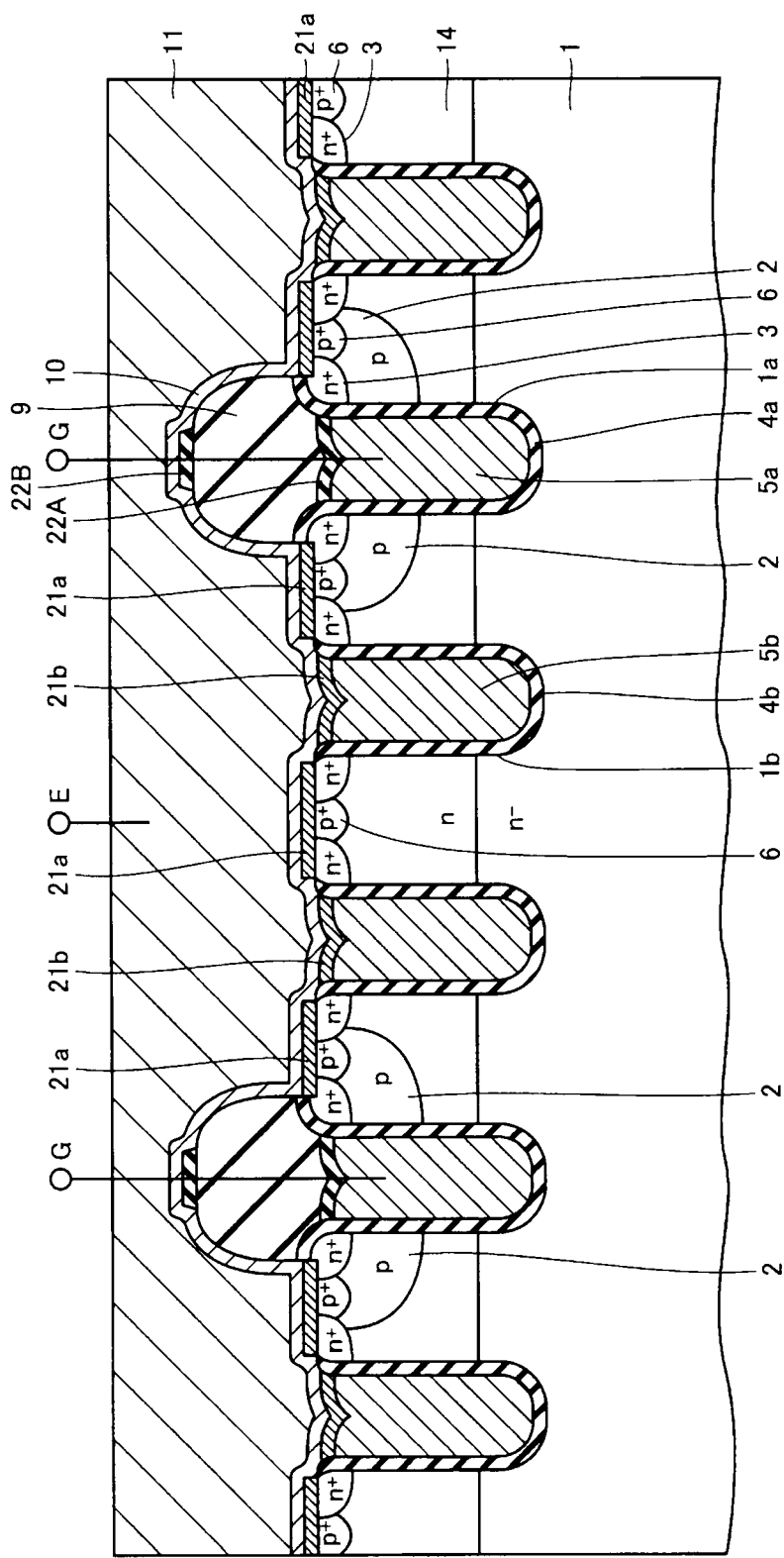
FIG. 51 is a schematic cross sectional view showing the derivative structure of the MOS transistor structure according to the fifth embodiment of the present invention.

The configuration shown in FIG. 51 is different from the configuration of structure F shown in FIG. 41 in that p-type body region 2 is formed only in the vicinity of the sidewall of gate groove 1a.

Figure 52:
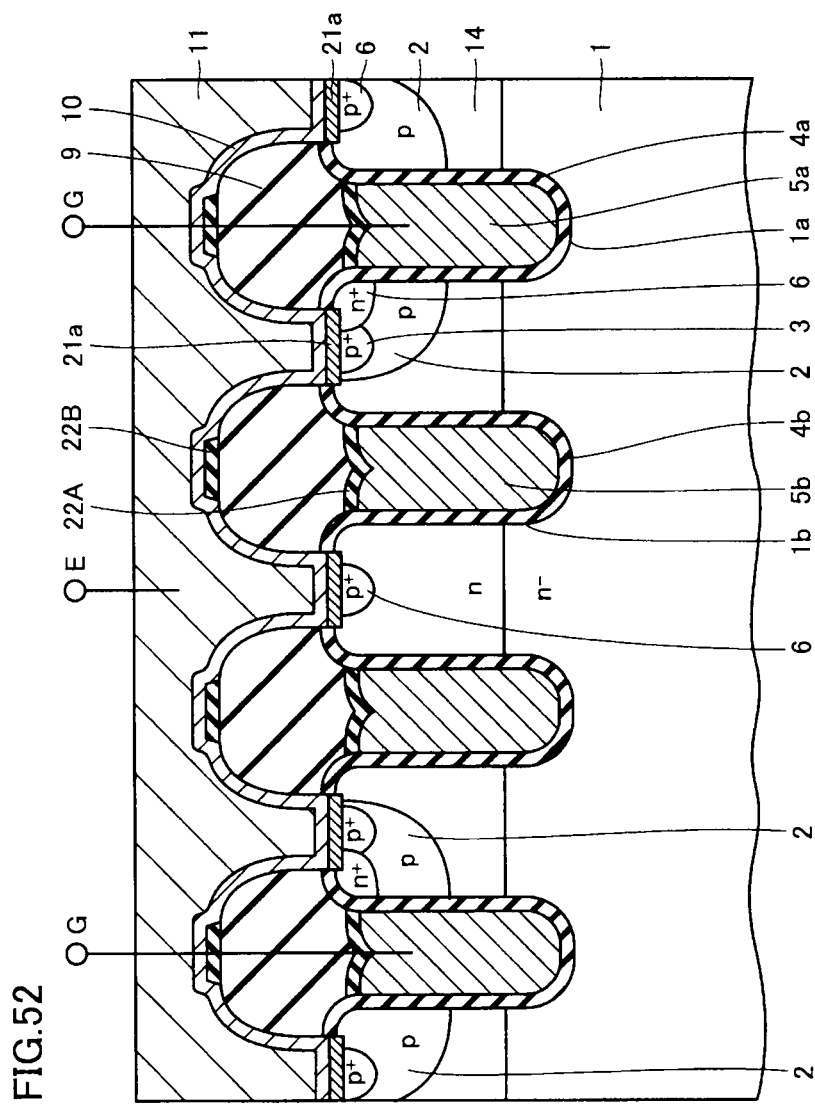
FIG. 52 is a schematic cross sectional view showing the derivative structure of the MOS transistor structure according to the fifth embodiment of the present invention.

The configuration shown in FIG. 52 is different from the configuration shown in FIG. 50 in that emitter conductive layer 5b filling emitter groove 1b is at a floating potential. In this case, insulating films 22A, 9 and 22B are formed on emitter conductive layer 5b.

Figure 53:
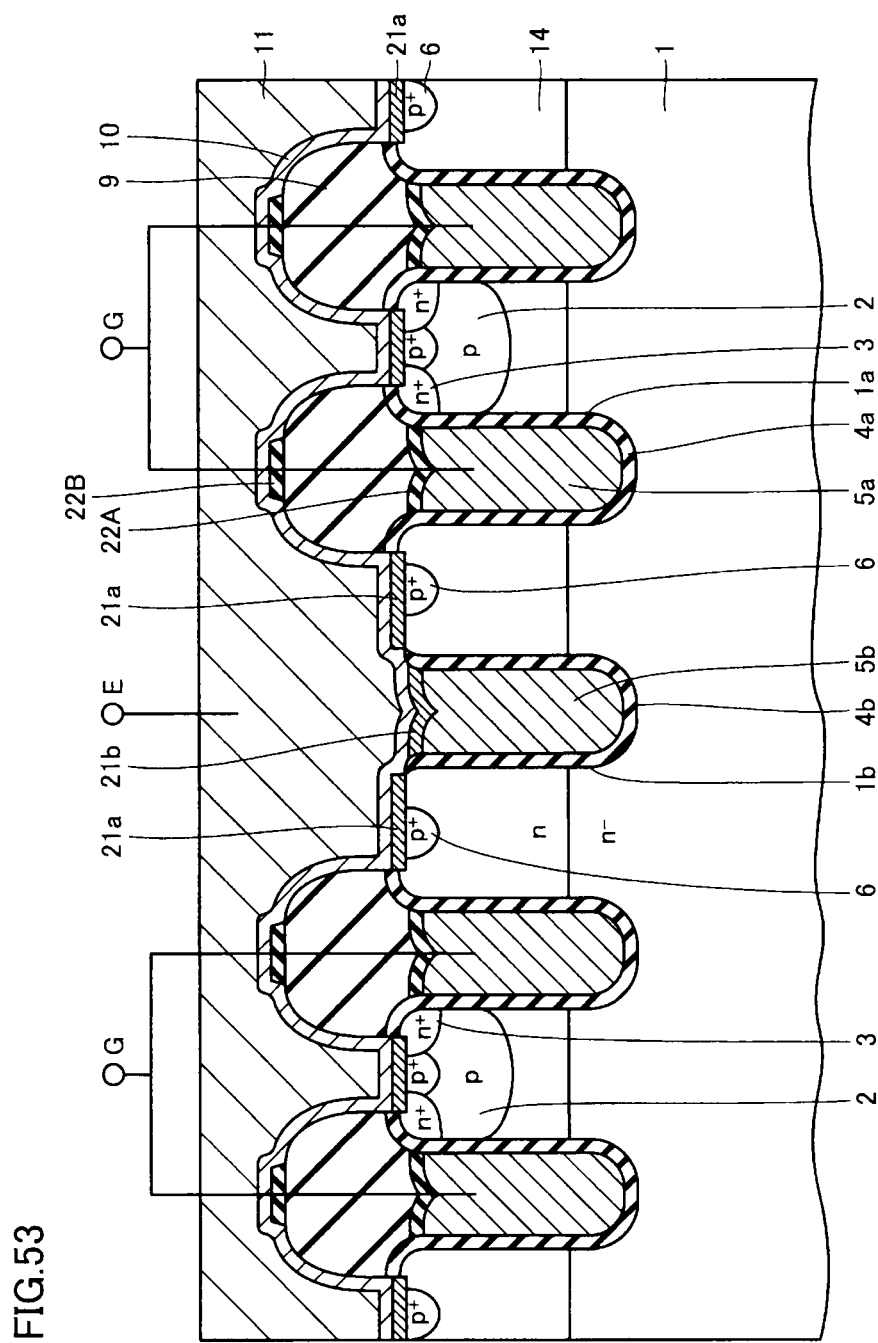
FIG. 53 is a schematic cross sectional view showing the derivative structure of the MOS transistor structure according to the fifth embodiment of the present invention.

The configuration shown in FIG. 53 is different from the configuration shown in FIG. 43 in that p-type body region 2 is formed only in the area interposed between two gate trenches.

Figure 54:
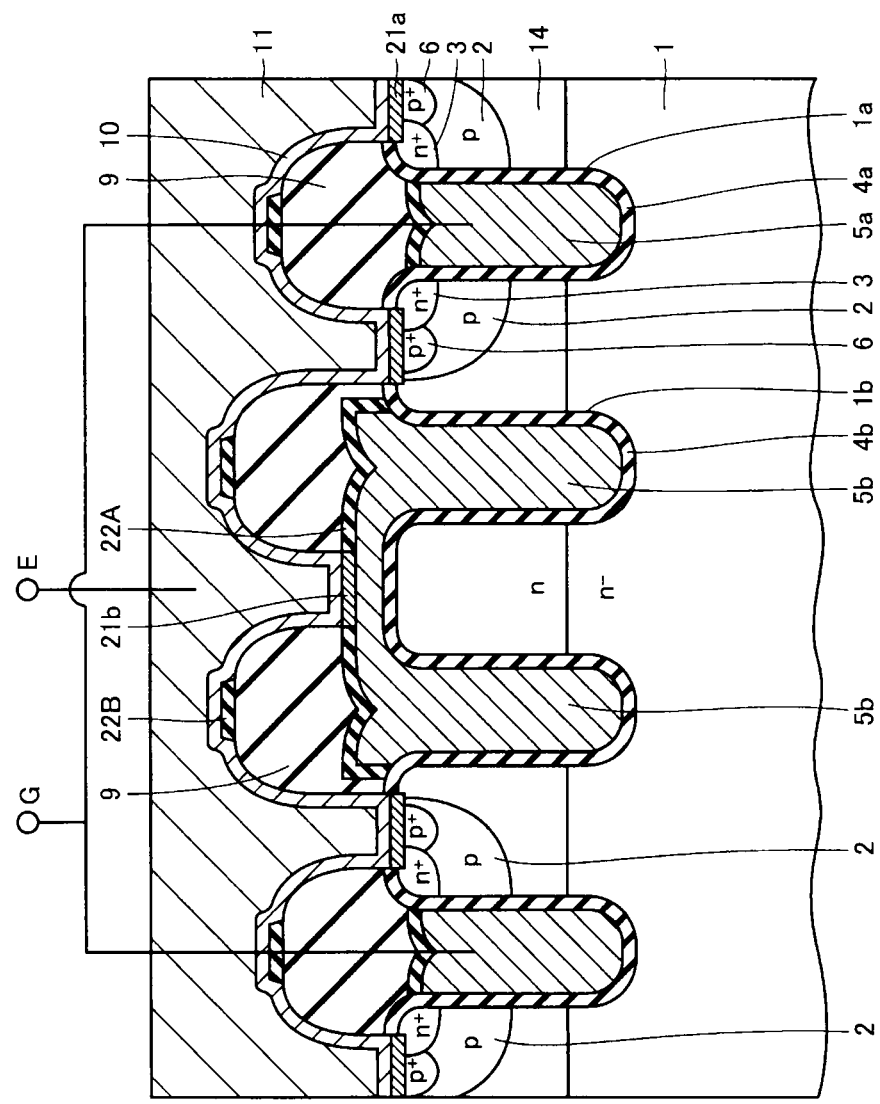
FIG. 54 is a schematic cross sectional view showing the derivative structure of the MOS transistor structure according to the fifth embodiment of the present invention.

The configuration shown in FIG. 54 is different from the configuration shown in FIG. 44 in that p-type body region 2 is formed only in the vicinity of the sidewall of gate groove 1a.

Figure 55:
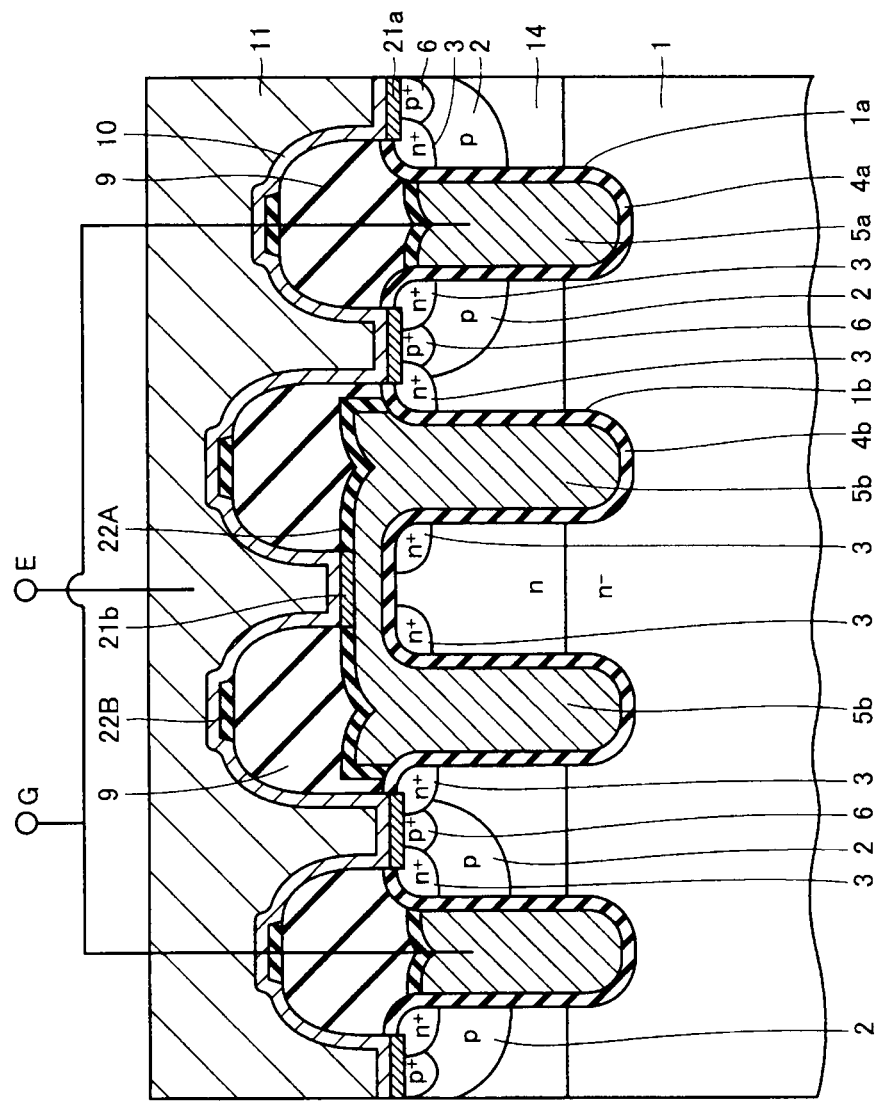
FIG. 55 is a schematic cross sectional view showing the derivative structure of the MOS transistor structure according to the fifth embodiment of the present invention.

The configuration shown in FIG. 55 is different from the configuration shown in FIG. 45 in that p-type body region 2 is formed only in the vicinity of the sidewall of gate groove 1a.

Figure 56:
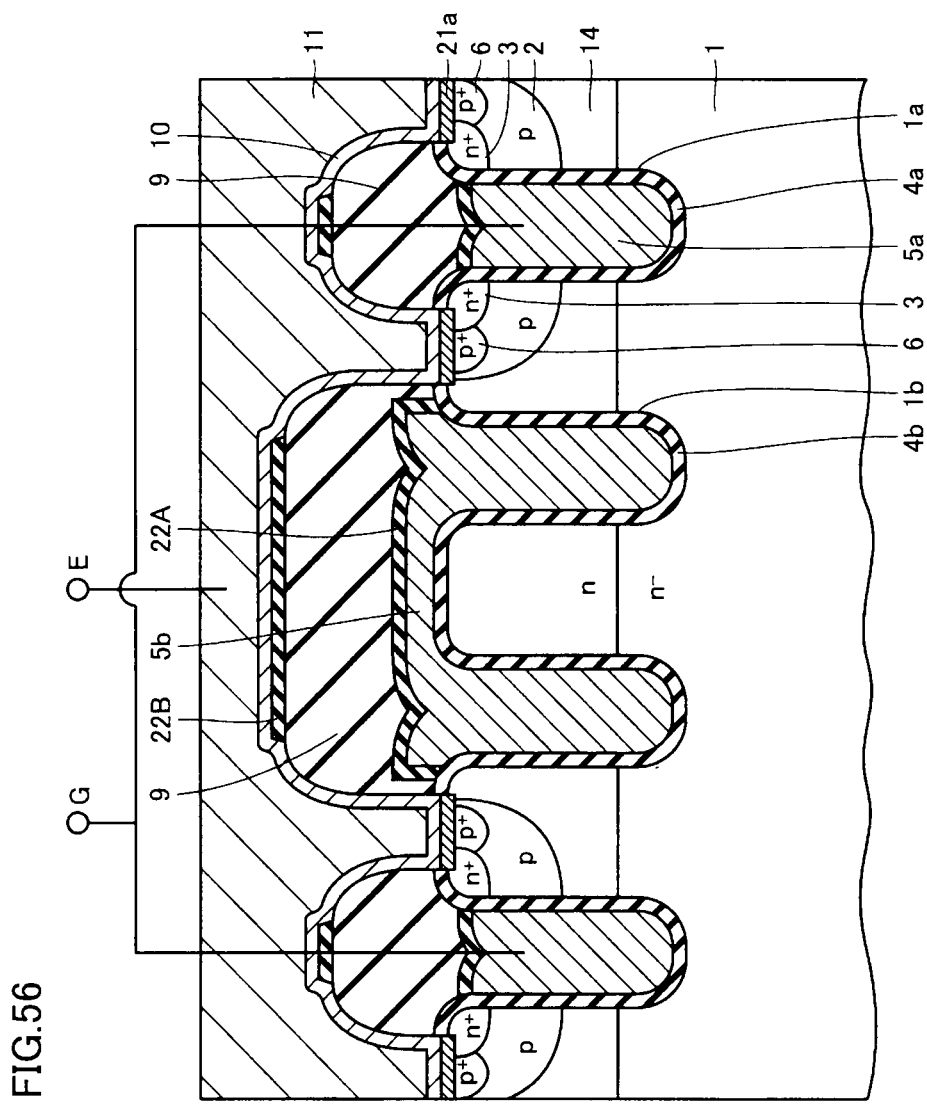
FIG. 56 is a schematic cross sectional view showing the derivative structure of the MOS transistor structure according to the fifth embodiment of the present invention.

The configuration shown in FIG. 56 is different from the configuration shown in FIG. 46 in that p-type body region 2 is formed only in the vicinity of the sidewall of gate groove 1a.

Figure 57:
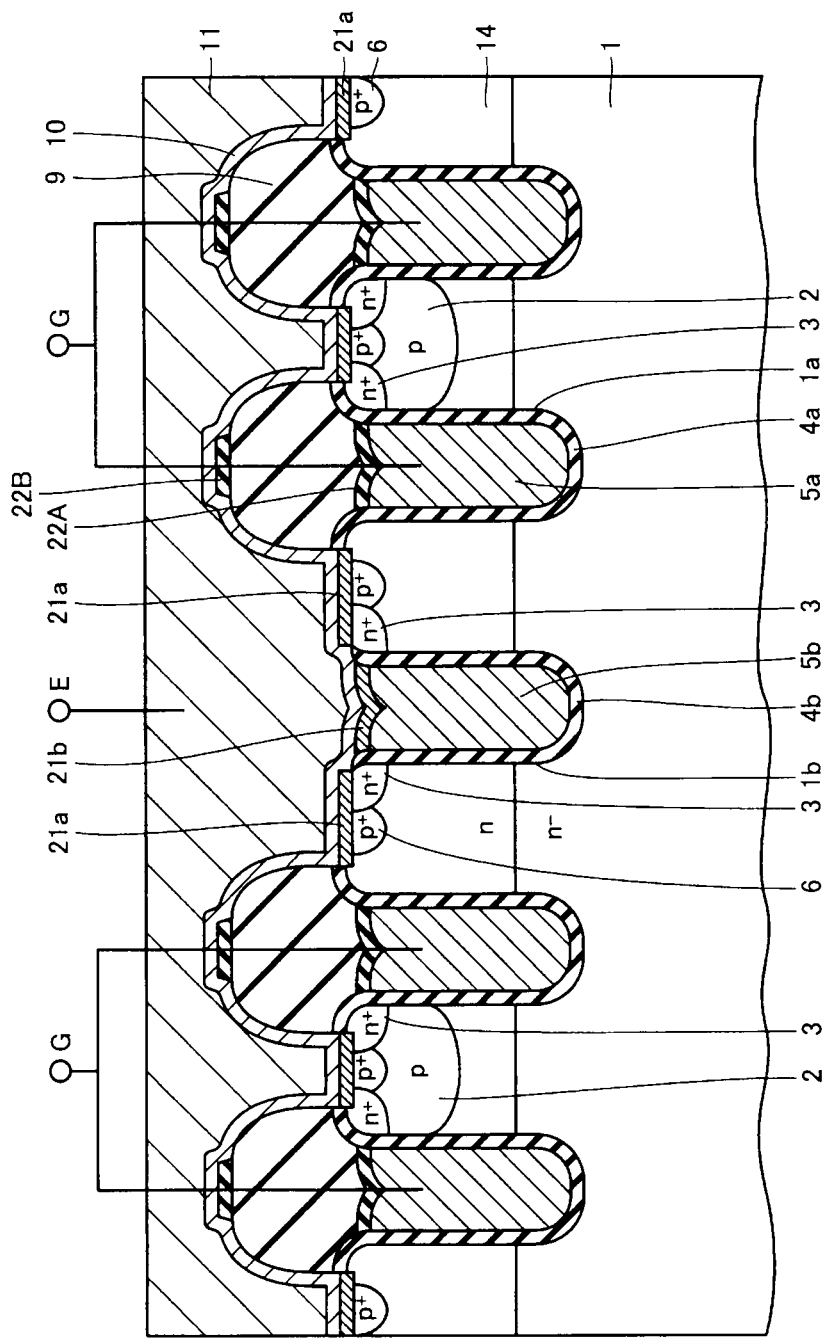
FIG. 57 is a schematic cross sectional view showing the derivative structure of the MOS transistor structure according to the fifth embodiment of the present invention.

The configuration shown in FIG. 57 is different from the configuration shown in FIG. 53 in that n-type impurity diffusion region 3 is additionally provided on both sidewalls of emitter groove 1b and on the first main surface.

Figure 58:
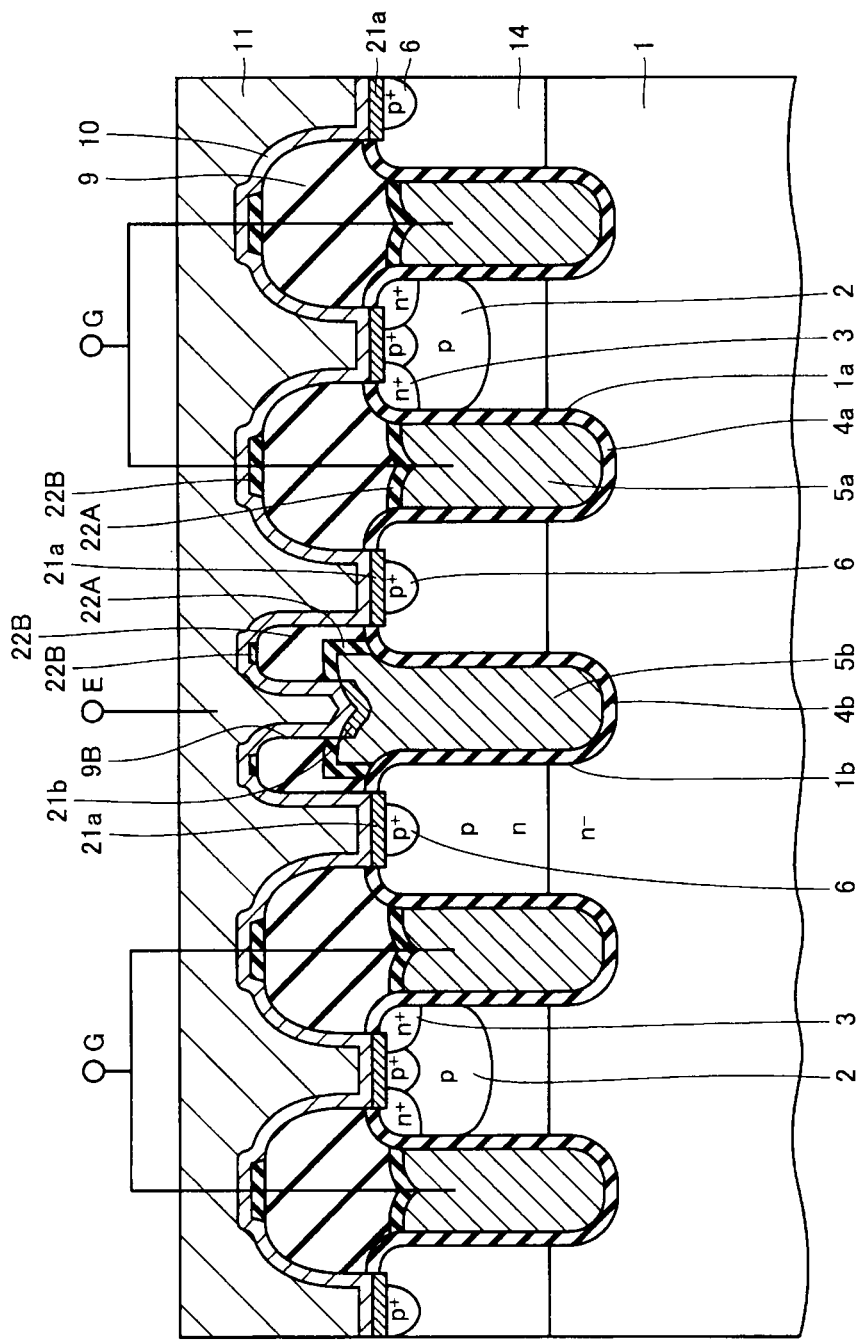
FIG. 58 is a schematic cross sectional view showing the derivative structure of the MOS transistor structure according to the fifth embodiment of the present invention.

The configuration shown in FIG. 58 is different from the configuration shown in FIG. 48 in that p-type body region 2 is formed only in the area interposed between two gate trenches.

Figure 59:
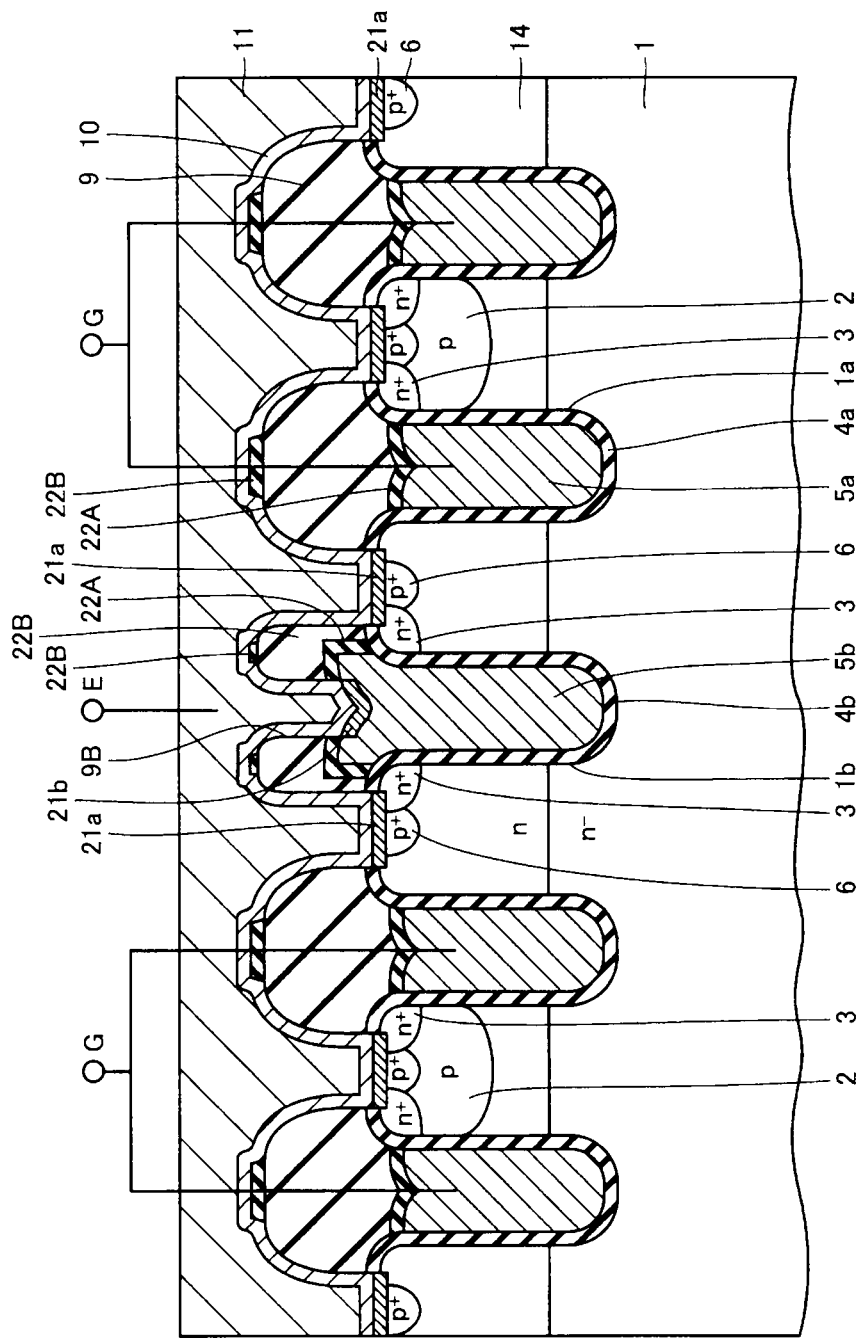
FIG. 59 is a schematic cross sectional view showing the derivative structure of the MOS transistor structure according to the fifth embodiment of the present invention.

The configuration shown in FIG. 59 is different from the configuration shown in FIG. 49 in that p-type body region 2 is formed only in the area interposed between two gate trenches.

Figure 60:
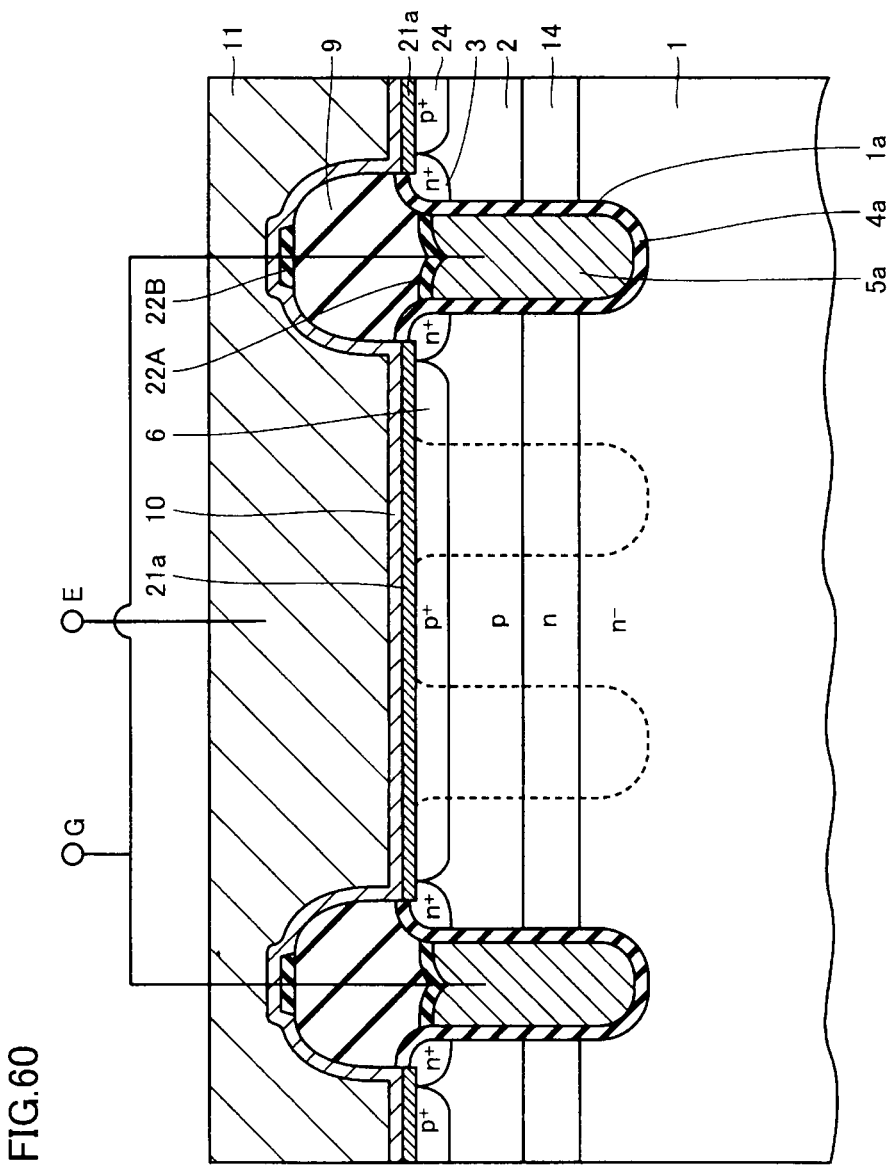
FIG. 60 is a schematic cross sectional view showing the derivative structure of the MOS transistor structure according to the fifth embodiment of the present invention.

In the configuration shown in FIG. 60, a gate trench is formed so as to have a gate width (W) equal to that in each of the above-described MOS transistor structures E-G without forming a trench in the region provided with an emitter trench in structure E shown in FIG. 40, that is, the distance between the gate trenches is increased to an arbitrary dimension so as to achieve an emitter potential.

In this case, $p^+$ impurity diffusion region 6 for providing low resistance contact with the p-type body region extends on the first main surface interposed between two gate trenches. Silicide layer 21a is formed so as to be brought into contact with $p^+$ impurity diffusion region 6 and n-type emitter region 3. $P^+$ impurity diffusion region 6 and n-type emitter region 3 are electrically connected to emitter electrode 11 through silicide layer 21a and barrier metal layer 10.

It is to be noted that since the configurations other than those described above are almost the same as the above-described configuration in FIG. 40, the same components are designated by the same reference characters, and description thereof will not be repeated.

Figure 61:
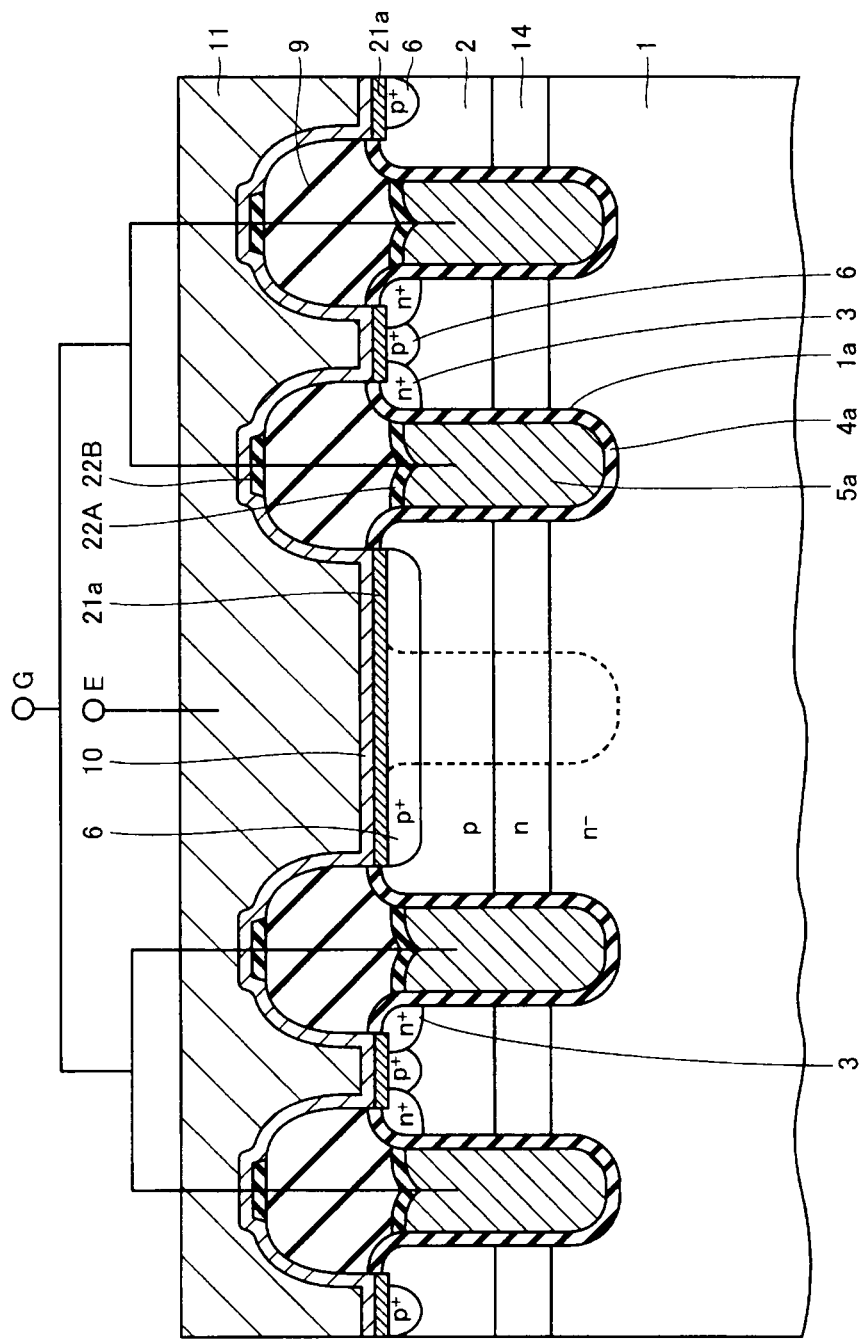
FIG. 61 is a schematic cross sectional view showing the derivative structure of the MOS transistor structure according to the fifth embodiment of the present invention.

In the configuration shown in FIG. 61, a gate trench is formed so as to have a gate width equal to that in each of the above-described MOS transistor structures E-G without forming a trench in the region provided with an emitter trench in FIG. 43, that is, the distance between the gate trenches is increased to an arbitrary dimension so as to achieve an emitter potential.

Also in this configuration, $p^+$ impurity diffusion region 6 extends on the first main surface interposed between the gate trenches so as to provide low resistance contact with the p-type body region. Silicide layer 21a is formed so as to be brought into contact with $p^+$ impurity diffusion region 6 and n-type emitter region 3. $P^+$ impurity diffusion region 6 and n-type emitter region 3 are electrically connected to emitter electrode 11 through silicide layer 21a and barrier metal layer 10.

It is to be noted that since the configurations other than those described above are almost the same as the above-described configuration in FIG. 43, the same components are designated by the same reference characters, and description thereof will not be repeated.

Figure 62:
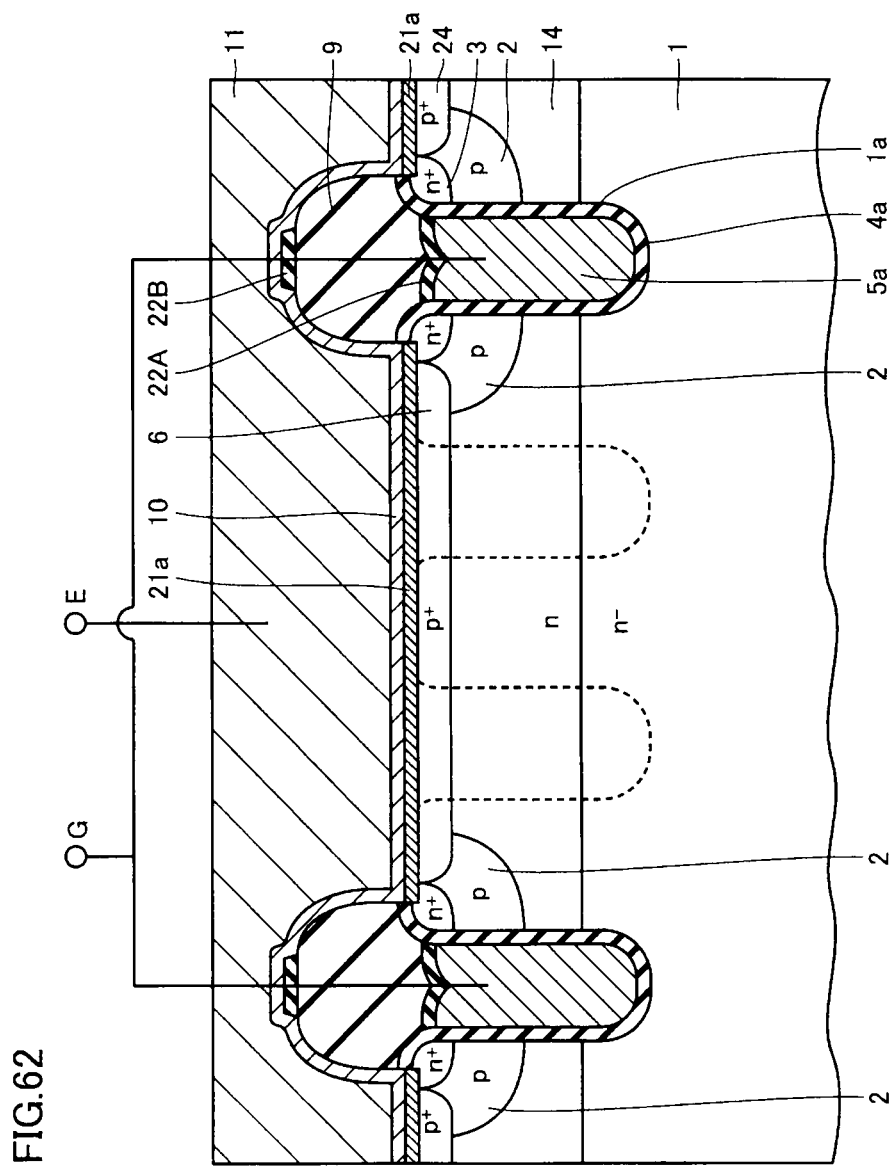
FIG. 62 is a schematic cross sectional view showing the derivative structure of the MOS transistor structure according to the fifth embodiment of the present invention.

FIG. 62 is different in configuration from FIG. 60 in that p-type body region 2 is formed only in the vicinity of the sidewall of gate groove 1a.

Figure 63:
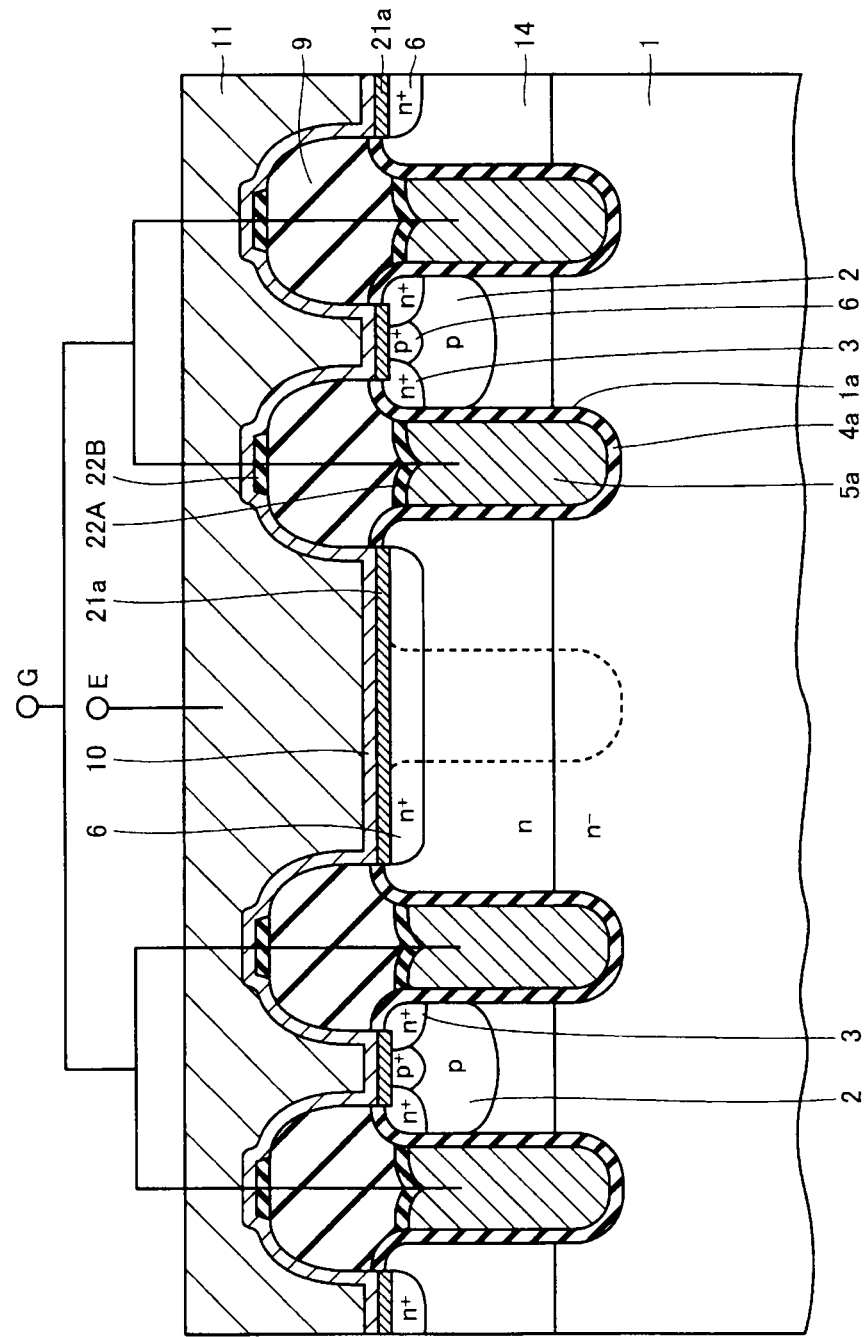
FIG. 63 is a schematic cross sectional view showing the derivative structure of the MOS transistor structure according to the fifth embodiment of the present invention.

The configuration shown in FIG. 63 is different from the configuration shown in FIG. 61 in that p-type body region 2 is formed only in the area interposed between two gate trenches.

Although the case where the upper surface of gate electrode 5a is located within gate groove 1a has been explained in the above description, the upper surface may protrude above gate groove 1a. FIGS. 64-74 each show the configuration in which the upper surface of gate electrode 5a protrudes above the upper surface of gate groove 1a.

Figure 64:
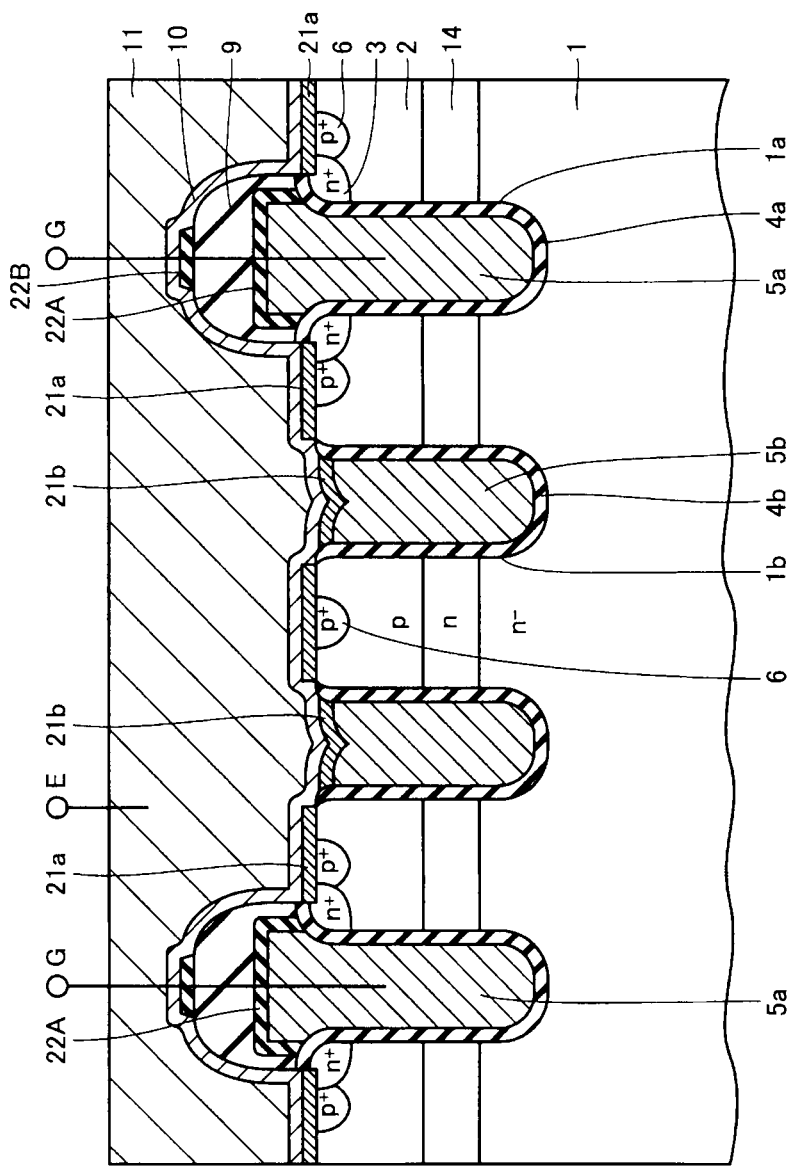
FIG. 64 is a schematic cross sectional view showing the derivative structure of the MOS transistor structure according to the fifth embodiment of the present invention.
Figure 65:
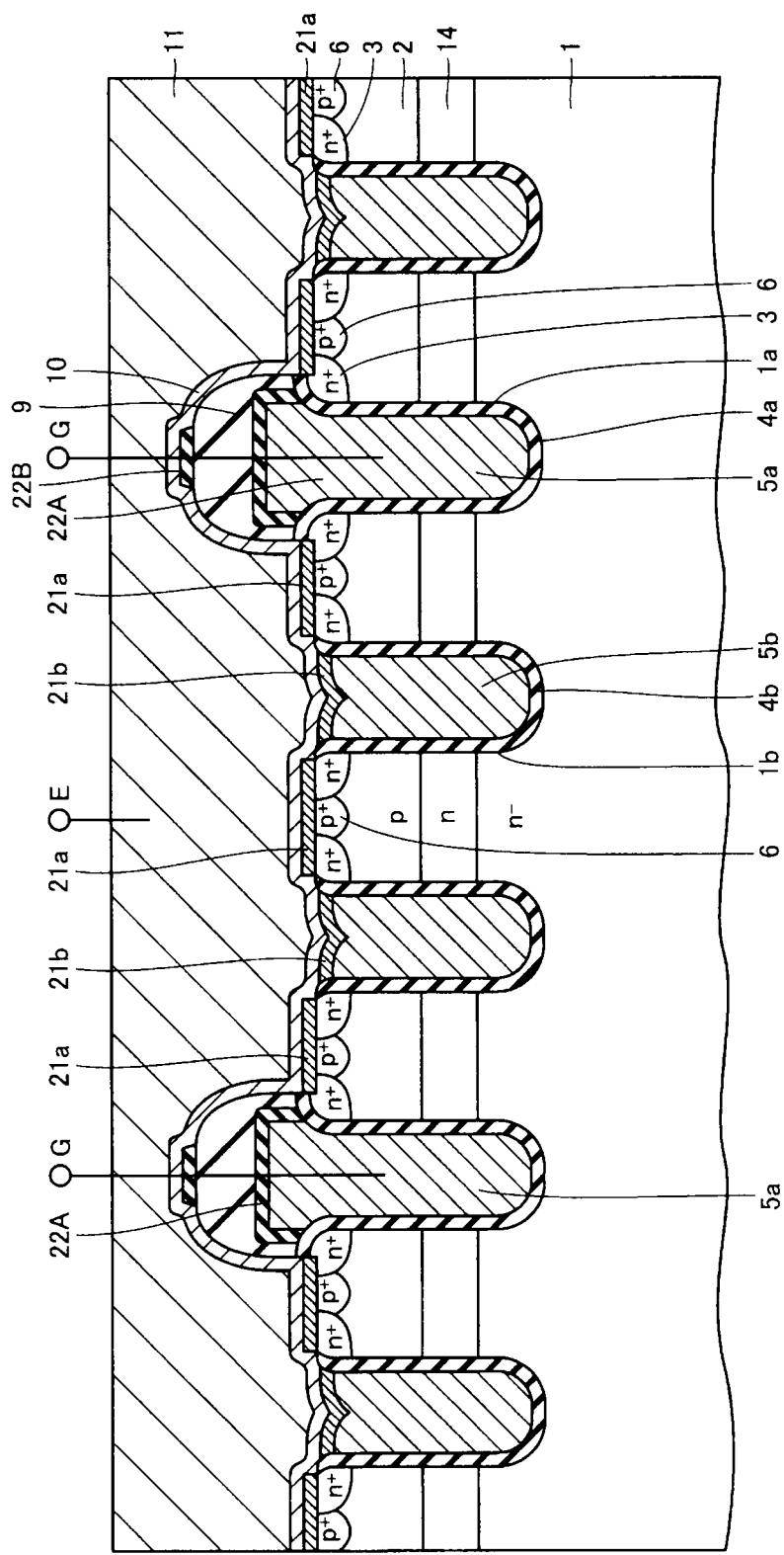
FIG. 65 is a schematic cross sectional view showing the derivative structure of the MOS transistor structure according to the fifth embodiment of the present invention.
Figure 66:
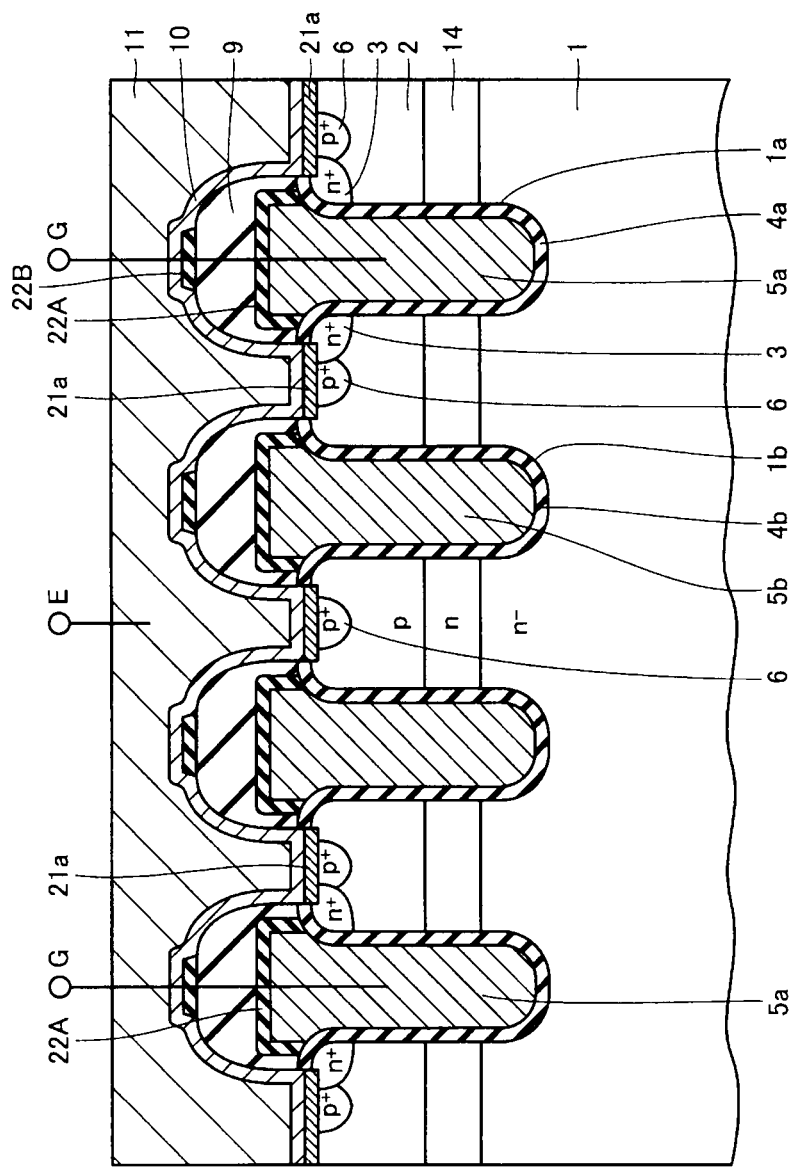
FIG. 66 is a schematic cross sectional view showing the derivative structure of the MOS transistor structure according to the fifth embodiment of the present invention.
Figure 67:
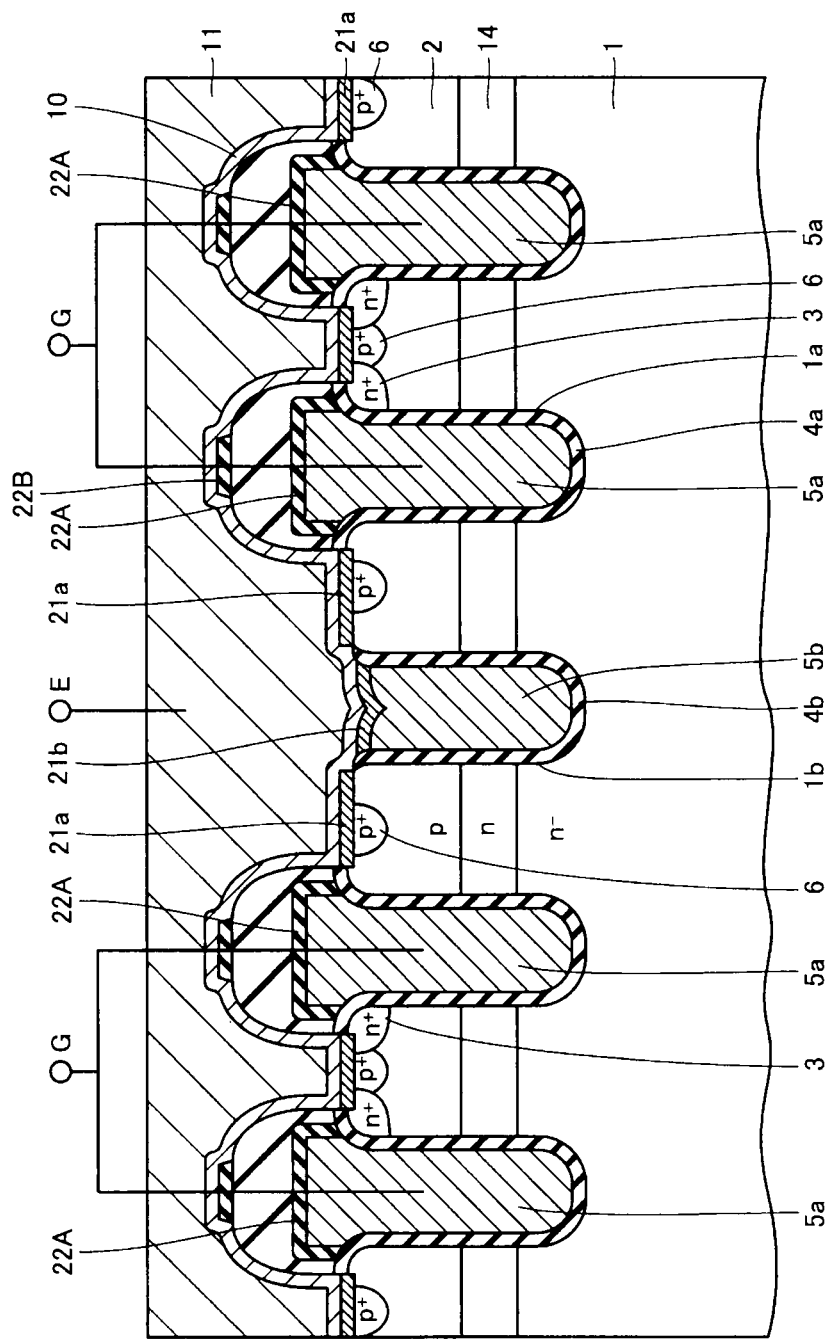
FIG. 67 is a schematic cross sectional view showing the derivative structure of the MOS transistor structure according to the fifth embodiment of the present invention.
Figure 68:
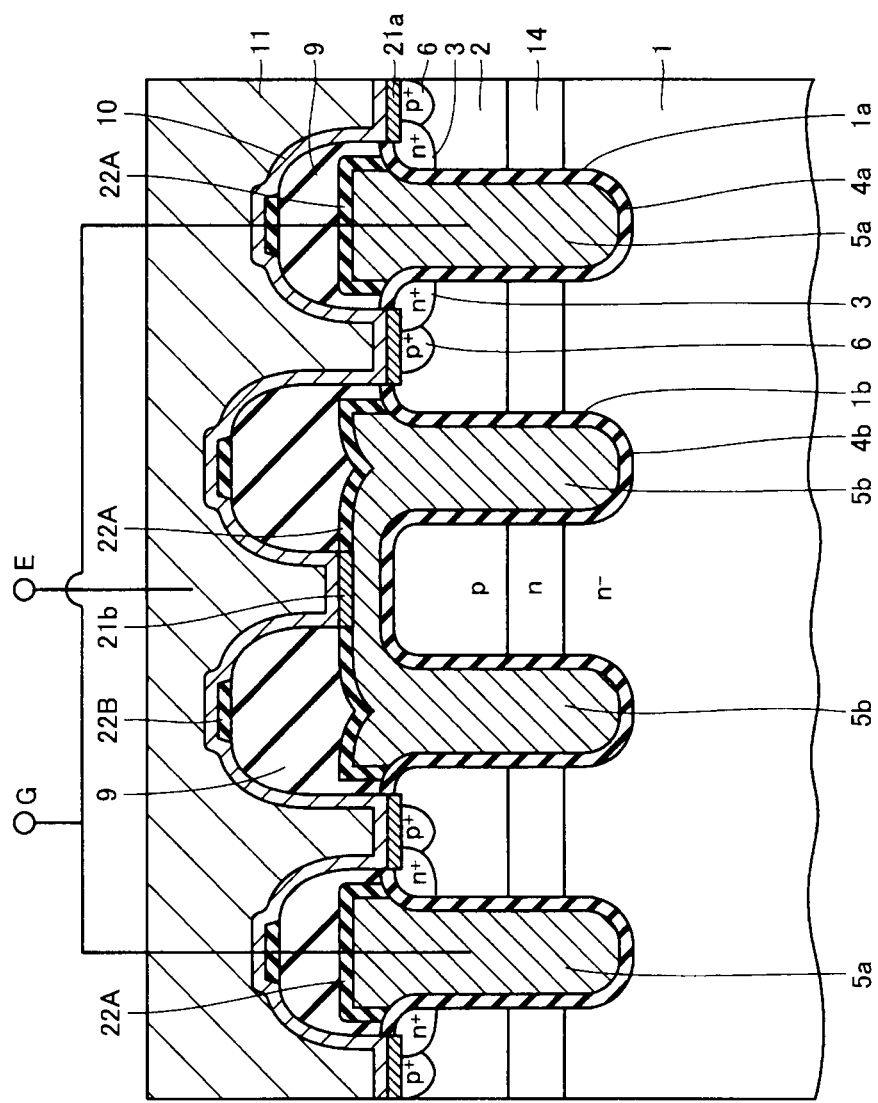
FIG. 68 is a schematic cross sectional view showing the derivative structure of the MOS transistor structure according to the fifth embodiment of the present invention.
Figure 69:
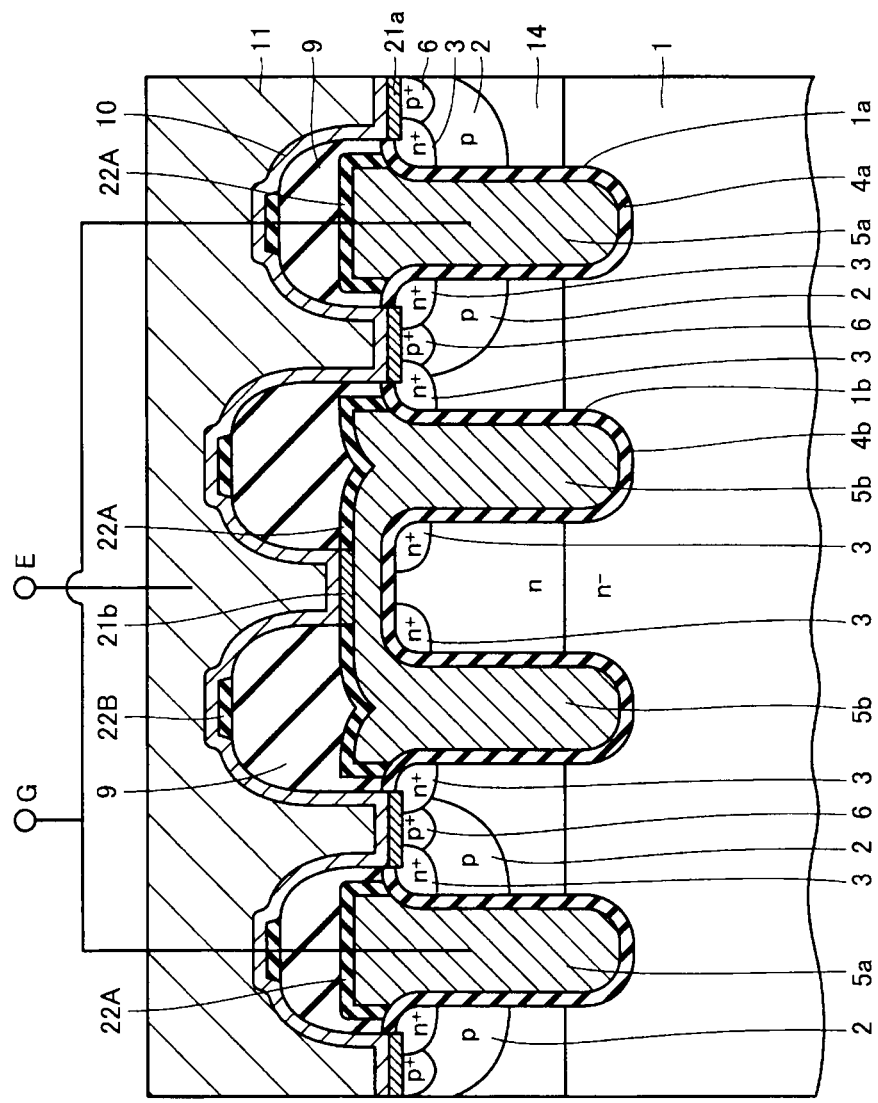
FIG. 69 is a schematic cross sectional view showing the derivative structure of the MOS transistor structure according to the fifth embodiment of the present invention.
Figure 70:
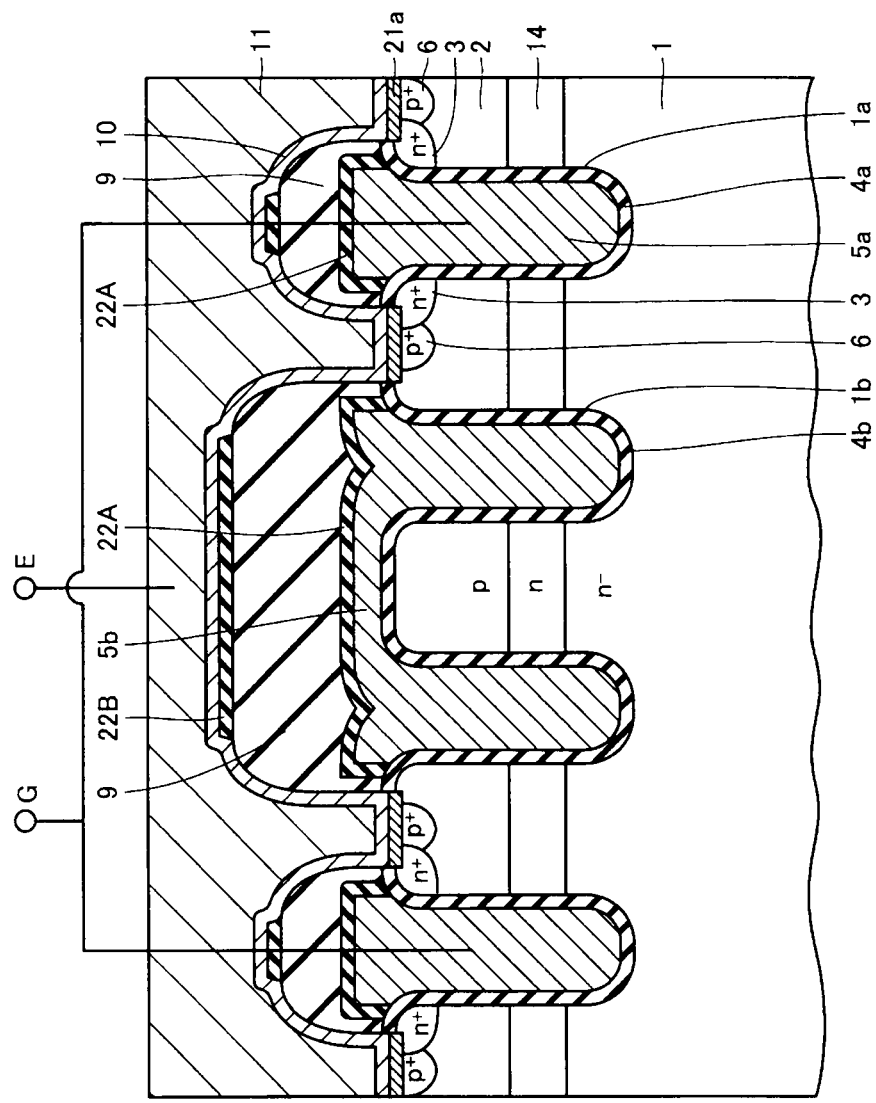
FIG. 70 is a schematic cross sectional view showing the derivative structure of the MOS transistor structure according to the fifth embodiment of the present invention.
Figure 71:
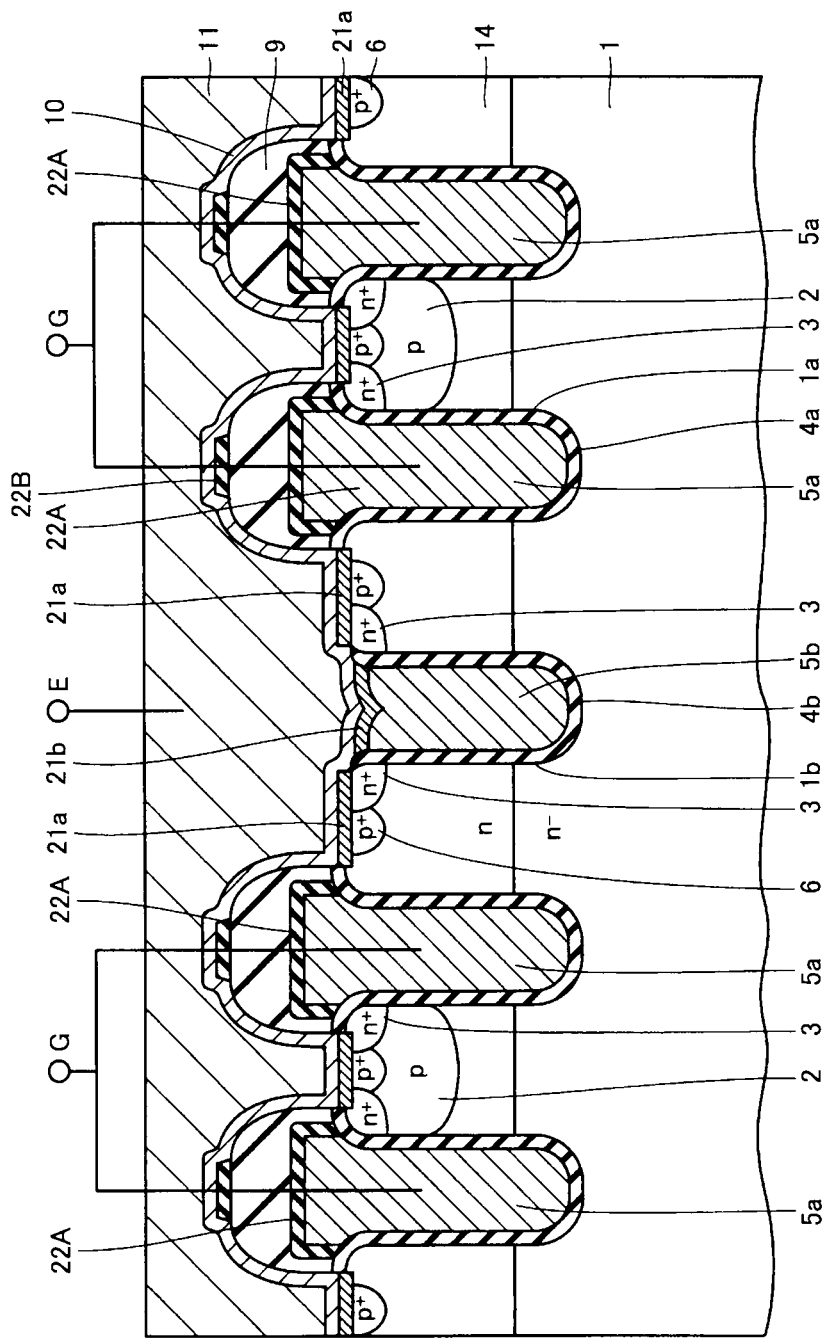
FIG. 71 is a schematic cross sectional view showing the derivative structure of the MOS transistor structure according to the fifth embodiment of the present invention.
Figure 72:
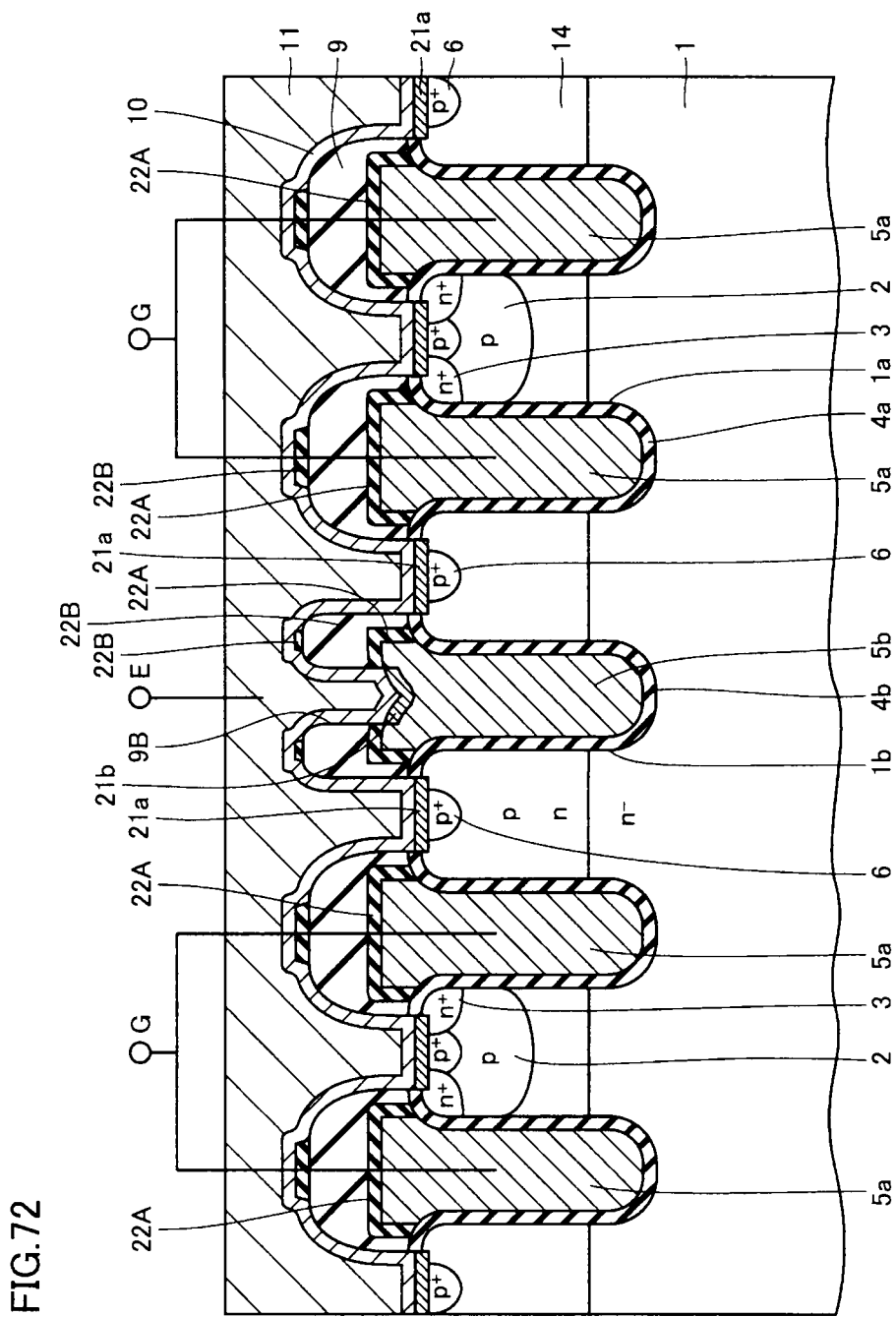
FIG. 72 is a schematic cross sectional view showing the derivative structure of the MOS transistor structure according to the fifth embodiment of the present invention.
Figure 73:
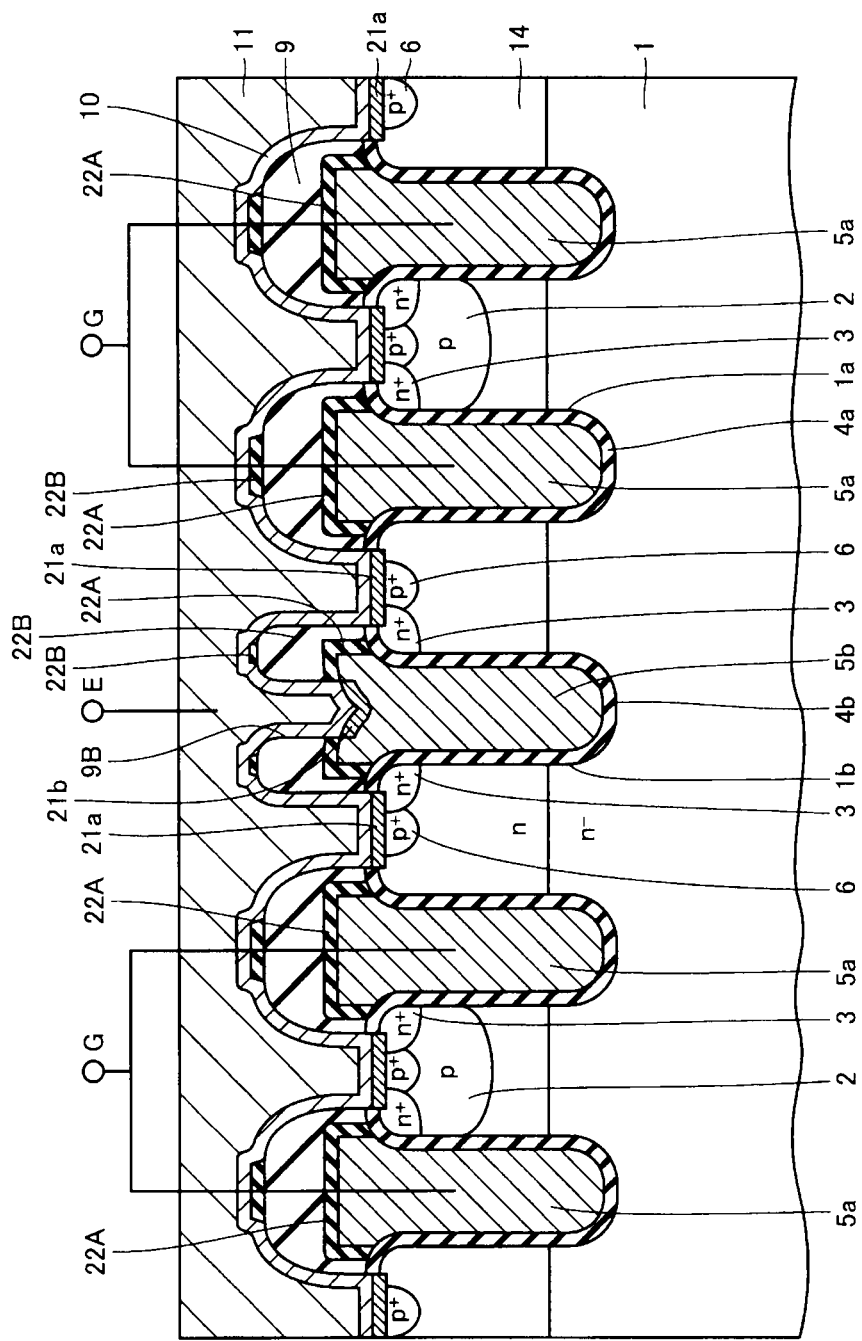
FIG. 73 is a schematic cross sectional view showing the derivative structure of the MOS transistor structure according to the fifth embodiment of the present invention.
Figure 74:
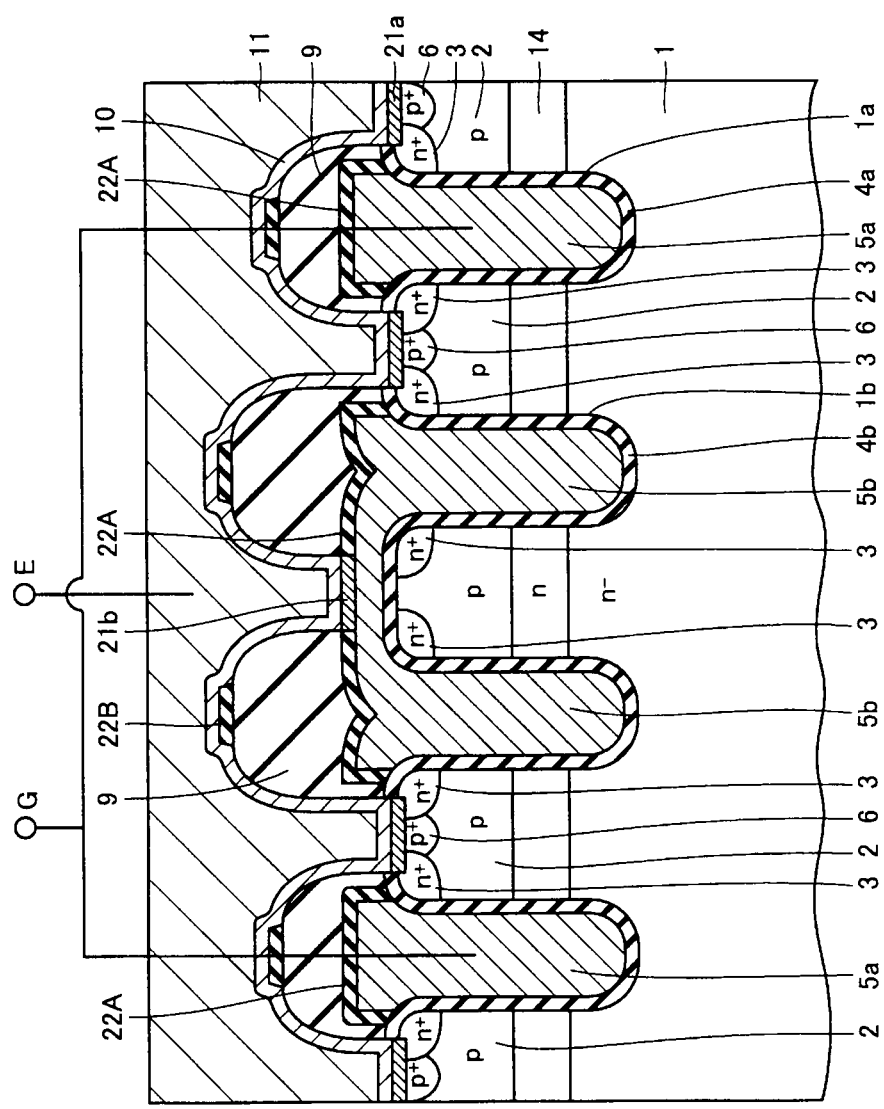
FIG. 74 is a schematic cross sectional view showing the derivative structure of the MOS transistor structure according to the fifth embodiment of the present invention.

The configuration in FIG. 64 corresponds to the configuration of structure E shown in FIG. 40, the configuration in FIG. 65 corresponds to the configuration shown in FIG. 41, the configuration in FIG. 66 corresponds to the configuration shown in FIG. 42, the configuration in FIG. 67 corresponds to the configuration shown in FIG. 43, the configuration in FIG. 68 corresponds to the configuration shown in FIG. 44, the configuration in FIG. 69 corresponds to the configuration shown in FIG. 45, the configuration in FIG. 70 corresponds to the configuration shown in FIG. 46, the configuration in FIG. 71 corresponds to the configuration shown in FIG. 47, the configuration in FIG. 72 corresponds to the configuration shown in FIG. 48, the configuration in FIG. 73 corresponds to the configuration shown in FIG. 49, and the configuration in FIG. 74 corresponds to the configuration shown in FIG. 50, except that the upper surface of gate electrode 5a protrudes above gate groove 1a. It is to be noted that, in the configuration shown in FIG. 66, the upper surface of emitter conductive layer 5b filling emitter groove 1b also protrudes above emitter groove 1b.

Although a trench-type gate structure has been explained in the above description, the configuration in each of the first to fourth embodiments can also be applied in a planar gate type IGBT. FIGS. 75-78 each are a schematic cross sectional view showing the configuration of the planar gate type IGBT.

Figure 75:
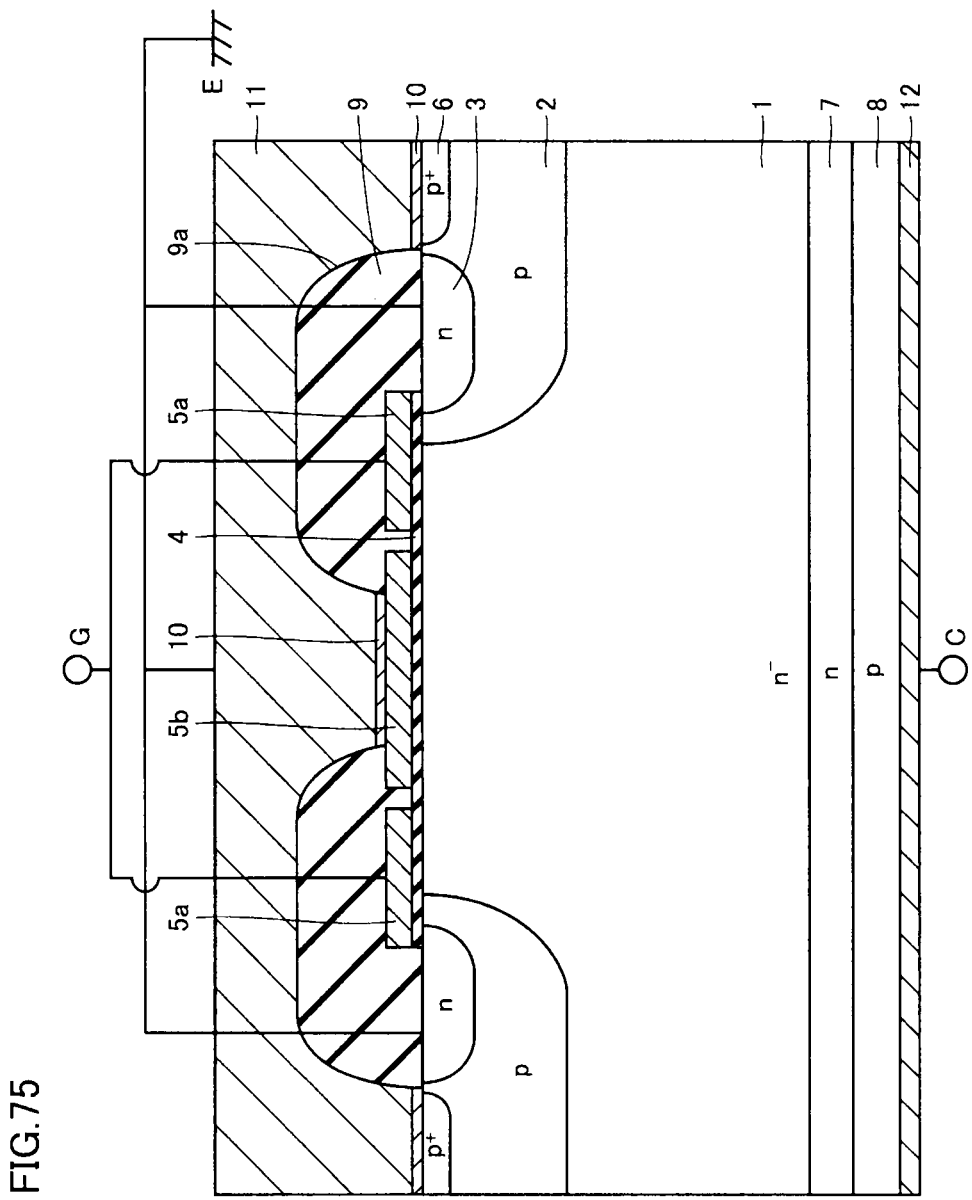
FIG. 75 is a schematic cross sectional view showing the derivative structure of the MOS transistor structure according to the fifth embodiment of the present invention.

Referring to FIG. 75, a planar gate type IGBT is formed in the semiconductor substrate, for example, having a thickness of about 50 µm to 250 µm. P-type body region 2 made of a p-type semiconductor is selectively formed on the first main surface side of $n^-$ drift layer 1 having a concentration of $1\times10^{14}$ cm$^{-3}$, for example. P-type body region 2 has, for example, a concentration of $1\times10^{15}$ to $1\times10^{18}$ cm$^{-3}$ and a diffusion depth of about 1.0-4.0 µm from the first main surface. N-type emitter region 3 made of an n-type semiconductor having, for example, a concentration of $1\times10^{18}$ to $1\times10^{20}$ cm$^{-3}$ and more and a diffusion depth of about 0.3-2.0 µm from the first main surface is formed on the first main surface in p-type body region 2. P$^+$ impurity diffusion region 6 for providing low resistance contact with p-type body region 2 is formed adjacent to this n-type emitter region 3 to have, for example, a concentration of approximately $1\times10^{18}$ to $1\times10^{20}$ cm$^{-3}$ and a diffusion depth from the first main surface less than or equal to the depth of n-type emitter region 3.

Gate electrode 5a is formed on the first main surface with a gate insulating film 4 interposed therebetween so as to face p-type body region 2 interposed between $n^-$ drift layer 1 and n-type emitter region 3.

These $n^-$ drift layer 1, n-type emitter region 3 and gate electrode 5a together form an insulated gate type field effect transistor portion (herein referred to as a MOS transistor portion) in which $n^-$ drift layer 1 is used as a drain, n-type emitter region 3 is used as a source, and a portion of p-type body region 2 facing gate electrode 5a across gate insulating film 4 is used as a channel.

On the first main surface interposed between two MOS transistor portions, emitter conductive layer 5b achieving an emitter potential is formed. The material employed for emitter conductive layer 5b and gate electrode 5a includes, for example, polycrystalline silicon to which phosphorus is introduced in high concentration, high melting point metal material, high melting point metal silicide, or a composite film thereof.

Insulating film 9 is formed on the first main surface. Insulating film 9 has a contact hole 9a formed therein, which extends to a part of the first main surface. Barrier metal layer 10 is formed on the bottom of contact hole 9a. Emitter electrode 11 applying an emitter potential E is electrically connected to emitter conductive layer 5b, p$^+$ impurity diffusion region 6 and n-type emitter region 3 through barrier metal layer 10.

Furthermore, n-type buffer region 7 and p-type collector region 8 are formed in this order on the second main surface side of $n^-$ drift layer 1. Collector electrode 12 applying a collector potential C is electrically connected to p-type collector region 8. Collector electrode 12 is made of an aluminum compound.

In the present embodiment, the spike density in the interface between the semiconductor substrate and collector electrode 12 (that is, the interface between p-type collector region 8 and collector electrode 12) is not less than 0 and not more than $3\times10^8$ unit/cm$^2$.

Figure 76:
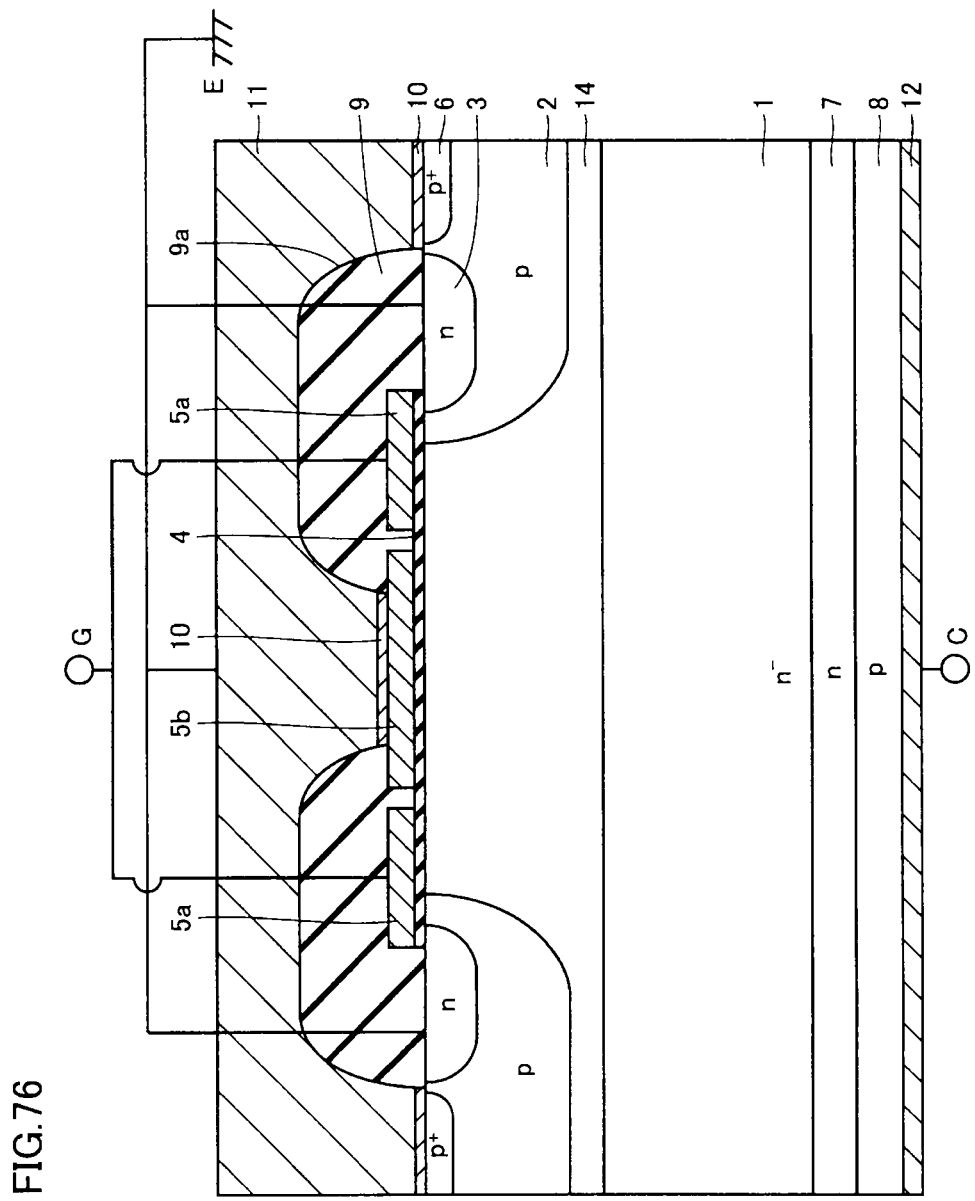
FIG. 76 is a schematic cross sectional view showing the derivative structure of the MOS transistor structure according to the fifth embodiment of the present invention.
Figure 77:
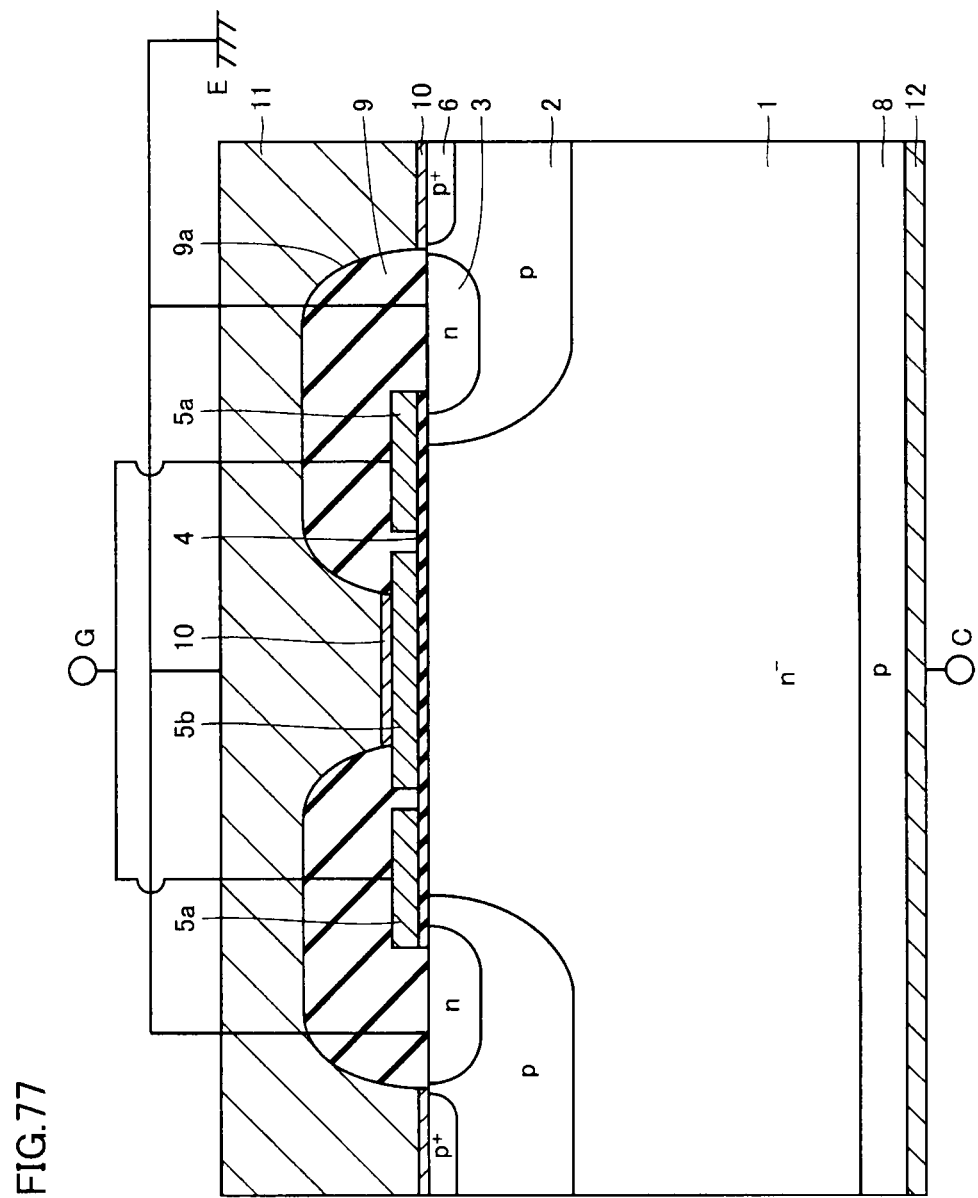
FIG. 77 is a schematic cross sectional view showing the derivative structure of the MOS transistor structure according to the fifth embodiment of the present invention.
Figure 78:
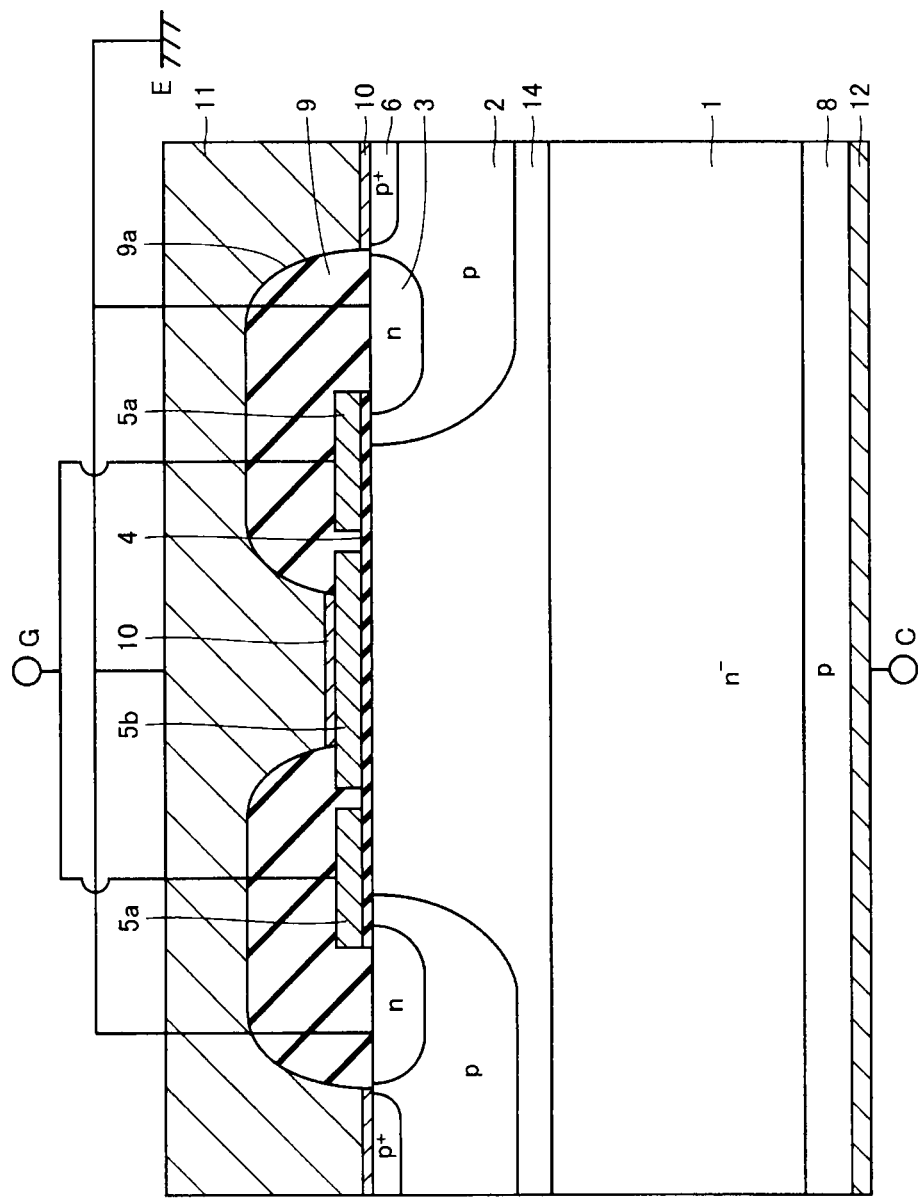
FIG. 78 is a schematic cross sectional view showing the derivative structure of the MOS transistor structure according to the fifth embodiment of the present invention.

N-type impurity diffusion region 14 may be added to the configuration in FIG. 75 as shown in FIG. 76, or n-type buffer region 7 may be omitted as shown in FIG. 77. Furthermore, as shown in FIG. 78, n-type impurity diffusion region 14 may be added and n-type buffer region 7 may be omitted.

Sixth Embodiment

In the present embodiment, other configuration of the planar gate type IGBT shown in each of FIGS. 75-78 will be described. FIGS. 79-83 each are a schematic cross sectional view showing each type of configuration of the planar gate type IGBT according to the sixth embodiment of the present invention.

Figure 79:
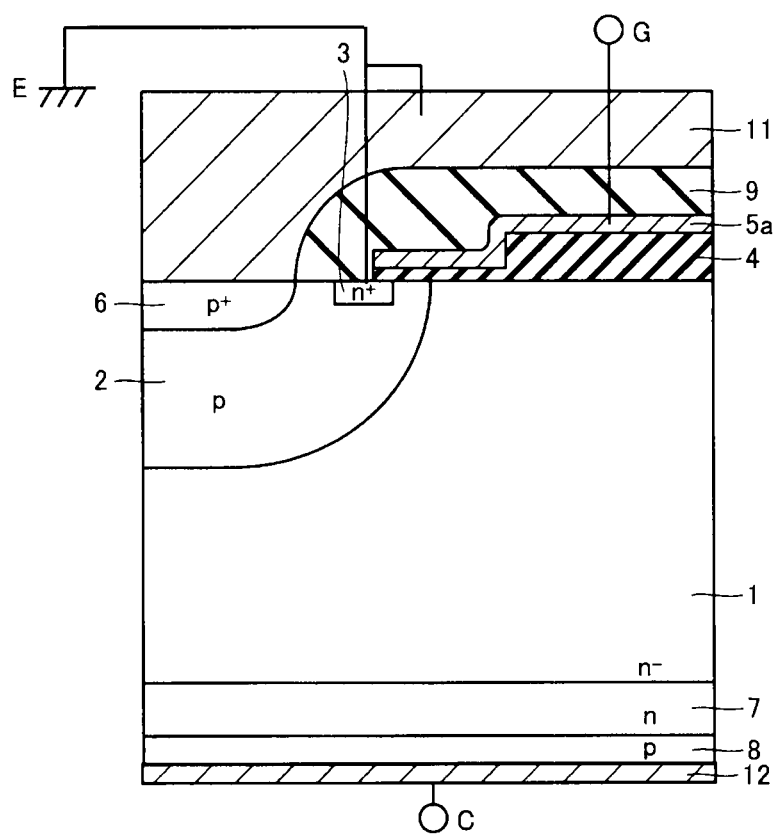
FIG. 79 is a schematic cross sectional view showing each type of configuration of a planar gate type IGBT according to the sixth embodiment of the present invention.

Referring to FIG. 79, the planar gate type IGBT is formed in the semiconductor substrate having a thickness of, for example, about 50 µm to 800 µm. P-type body region 2 made of a p-type semiconductor is selectively formed on the first main surface of $n^-$ drift layer 1 on the left side in the figure. For example, p-type body region 2 has a concentration of $1\times10^{15}$ to $1\times10^{18}$ cm$^{-3}$ and a diffusion depth of about 1.0-4.0 µm from the first main surface. N-type emitter region 3 made of an n-type semiconductor is formed on the first main surface in p-type body region 2, for example, so as to have a concentration of $1\times10^{18}$ to $1\times10^{20}$ cm$^{-3}$ or more and a diffusion depth of about 0.3-2.0 µm from the first main surface. P$^+$ impurity diffusion region 6 for providing low resistance contact with p-type body region 2 is formed to the left of n-type emitter region 3 in the figure so as to be spaced apart from n-type emitter region 3. For example, p$^+$ impurity diffusion region 6 is formed, for example, so as to have a concentration of about $1\times10^{18}$ to $1\times10^{20}$ cm$^{-3}$ and a diffusion depth from the first main surface less than or equal to the depth of n-type emitter region 3.

Gate electrode 5a is formed on the first main surface with gate insulating film 4 interposed therebetween so as to face p-type body region 2 interposed between $n^-$ drift layer 1 and n-type emitter region 3. Gate electrode 5a extends to the right end in the figure and faces $n^-$ drift layer 1 across gate insulating film 4 on the right side in the figure.

These $n^-$ drift layer 1, n-type emitter region 3 and gate electrode 5a together form an insulated gate type field effect transistor portion (herein referred to as a MOS transistor) in which $n^-$ drift layer 1 is used as a drain, n-type emitter region 3 is used as a source, and a portion of p-type body region 2 facing gate electrode 5a across gate insulating film 4 is used as a channel.

Insulating film 9 and emitter electrode 11 are formed on the first main surface. Insulating film 9 covers n-type emitter region 3 and p-type body region 2 on the first main surface, and gate electrode 5a. Emitter electrode 11 covers p+ impurity diffusion region 6 and insulating film 9, and applies emitter potential E to p+ impurity diffusion region 6 and n-type emitter region 3.

Furthermore, n-type buffer region 7 and p-type collector region 8 are formed in this order on the second main surface side of n− drift layer 1. Collector electrode 12 applying collector potential C is electrically connected to p-type collector region 8.

In the present embodiment, the spike density in the interface between the semiconductor substrate and collector electrode 12 (that is, the interface between p-type collector region 8 and collector electrode 12) is not less than 0 and not more than $3 \times 10^8$ unit/cm$^2$.

Figure 80:
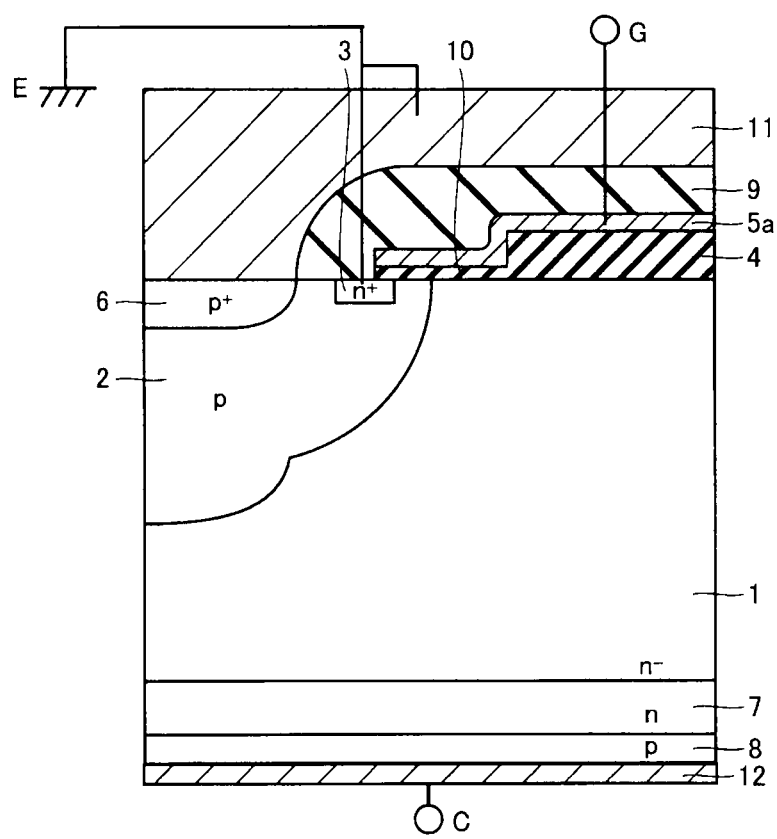
FIG. 80 is a schematic cross sectional view showing each type of configuration of the planar gate type IGBT according to the sixth embodiment of the present invention.

The configuration shown in FIG. 80 is different from the configuration in FIG. 79 in that p-type body region 2 is formed more deeply in the region (more closely to the second main surface) where insulating film 9 is not formed as seen in plan view. Such a p-type body region 2 is formed by adding the process of implanting p-type impurities into the first main surface using insulating film 9 as a mask.

Figure 81:
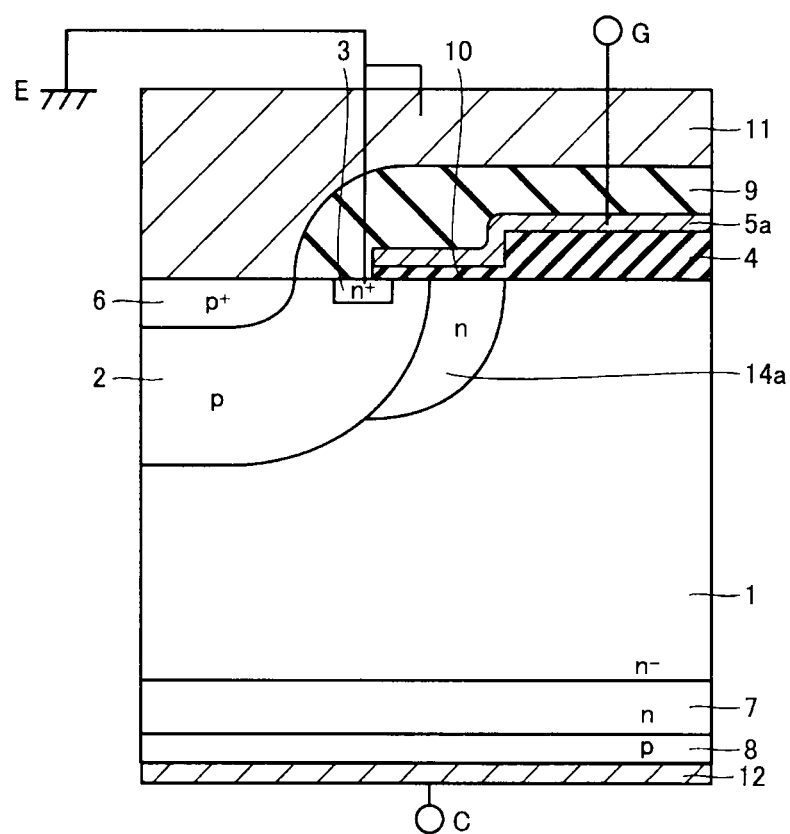
FIG. 81 is a schematic cross sectional view showing each type of configuration of the planar gate type IGBT according to the sixth embodiment of the present invention.

The configuration shown in FIG. 81 is different from the configuration in FIG. 79 in that an n-type impurity diffusion region 14a is formed within n− drift layer 1 so as to be adjacent to the side surface of p-type body region 2.

Figure 82:
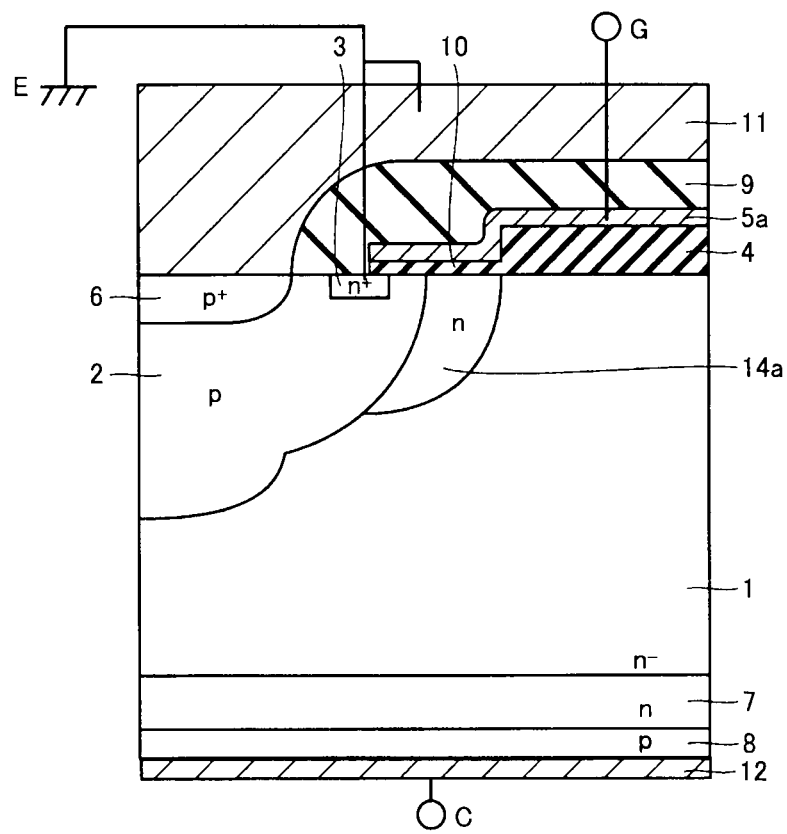
FIG. 82 is a schematic cross sectional view showing each type of configuration of the planar gate type IGBT according to the sixth embodiment of the present invention.

The configuration shown in FIG. 82 is different from the configuration in FIG. 81 in that p-type body region 2 is formed more deeply in the region (more closely to the second main surface) where insulating film 9 is not formed as seen in plan view.

Figure 83:
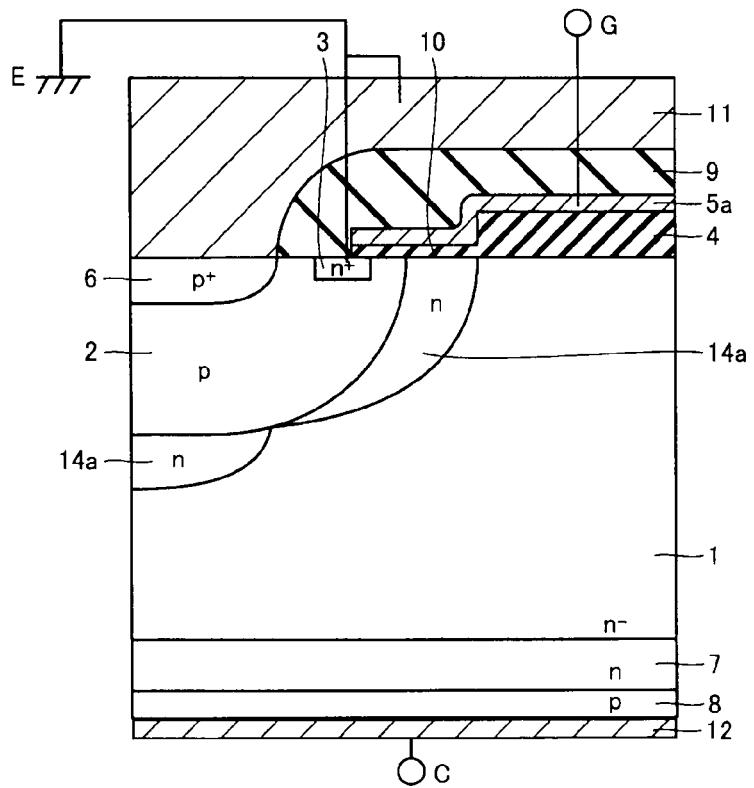
FIG. 83 is a schematic cross sectional view showing each type of configuration of the planar gate type IGBT according to the sixth embodiment of the present invention.

The configuration shown in FIG. 83 is different from the configuration in FIG. 81 in that n-type impurity diffusion region 14a is further formed within n− drift layer 1 so as to be adjacent to the bottom of p-type body region 2.

Figure 84:
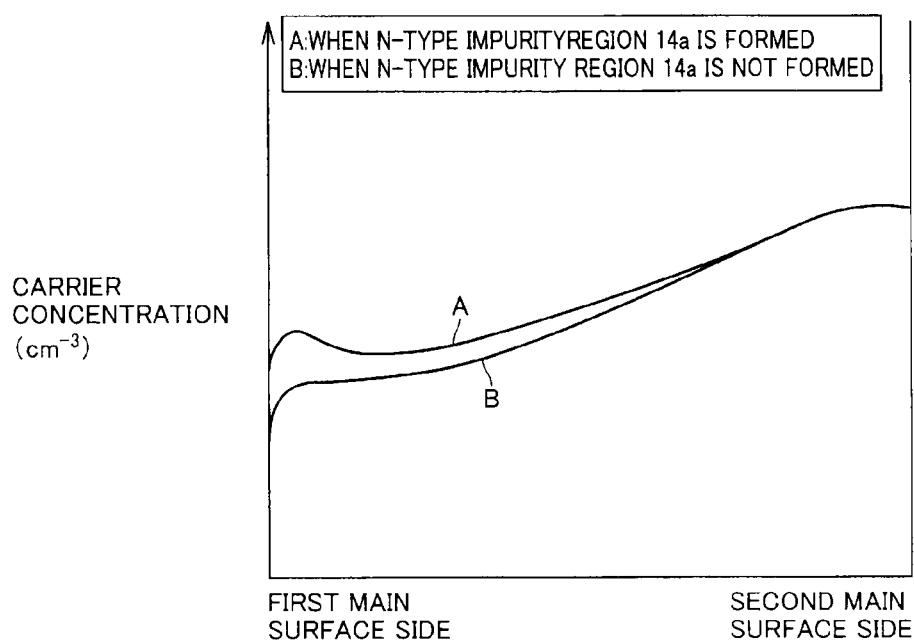
FIG. 84 is a diagram schematically showing the concentration distribution of the carrier (n-type impurities) directly below a gate electrode 5a in the configuration shown in FIGS. 79 to 83.
Figure 85:
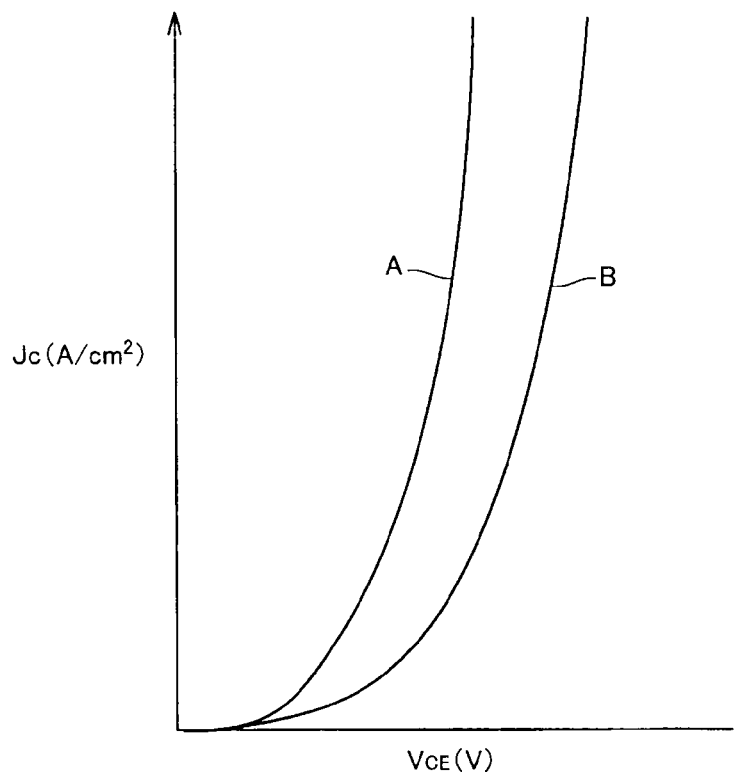
FIG. 85 is a diagram showing the relation between $V_{CE}$ and $J_C$ in each case where an n-type impurity diffusion region is formed and not formed.

N-type impurity diffusion region 14a is formed adjacent to p-type body region 2 as shown in FIGS. 81-83, which causes an increase in the carrier concentration on the emitter side (first main surface side) in the case where the IGBT is in the ON state, as shown in FIG. 84. Consequently, the characteristics of the IGBT can be improved. FIG. 85 is a diagram showing each relation between $V_{CE}$ and $J_C$ when an n-type impurity diffusion region is formed and not formed. Referring to FIG. 85, an emitter-collector voltage $V_{CE}$ with respect to current density $J_C$ is decreased in the case where n-type impurity diffusion region 14a is formed.

Figure 86:
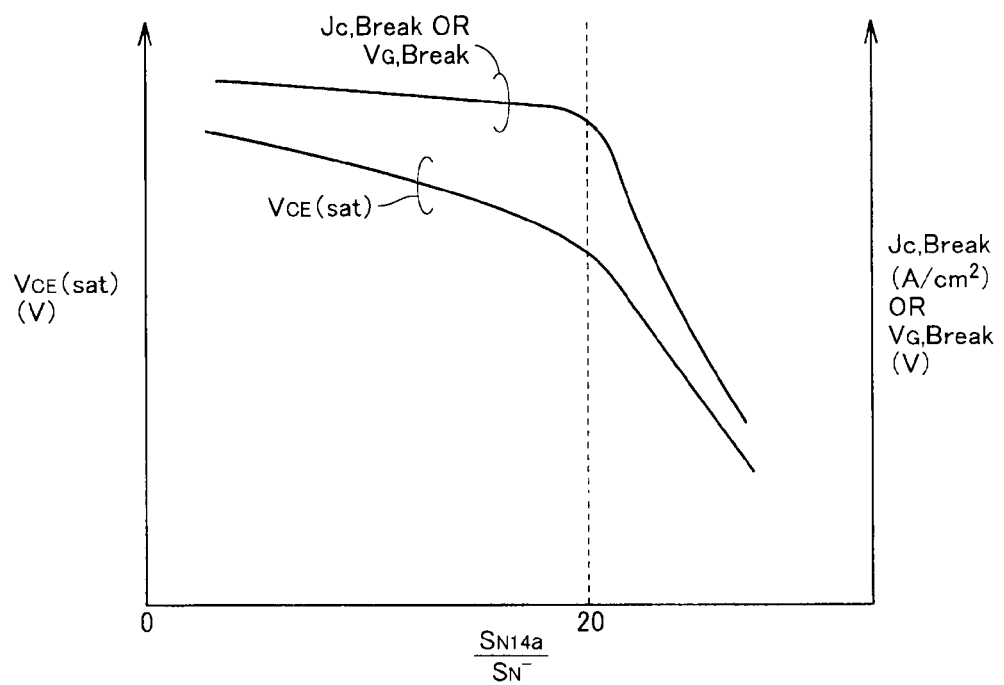
FIG. 86 is a diagram showing the relation of $S_{N14a}/S_{N-}$ to $V_{CE}(sat)$, $J_{C,Break}$ and $V_{G,Break}$ according to the sixth embodiment of the present invention.

FIG. 86 is a diagram showing the relation of $S_{N14a}/S_{N-}$ to $V_{CE}(sat)$, $J_{C,Break}$ and $V_{G,Break}$ according to the sixth embodiment of the present invention. In this case, $S_{N14a}/S_{N-}$ represents a ratio of the number of atoms per unit area of the impurities forming n-type impurity diffusion region 14a (atom/cm$^2$) $S_{N14a}$ to the number of atoms per unit area of the impurities forming n− drift layer 1 (atom/cm$^2$) $S_{N-}$. $J_{C,Break}$ represents a current density that allows interruption of the device in the RBSOA (Reverse Bias Safety Operation Area) mode, and $V_{G,Break}$ represents a gate voltage that allows interruption of the device in the SCSOA (Short Circuit Safe Operation Area) mode. Referring to FIG. 86, under the condition of $0 < S_{N14a}/S_{N-} \leq 20$, high interruption performance can be achieved and a reduced collector-emitter voltage $V_{CE}$(sat) can also be achieved. Therefore, it is preferable that n-type impurity diffusion region 14a satisfies the condition of $0 < S_{N14a}/S_{N-} \leq 20$ in order to decrease the ON voltage while ensuring RBSOA and SCSOA.

Seventh Embodiment

Figure 87:
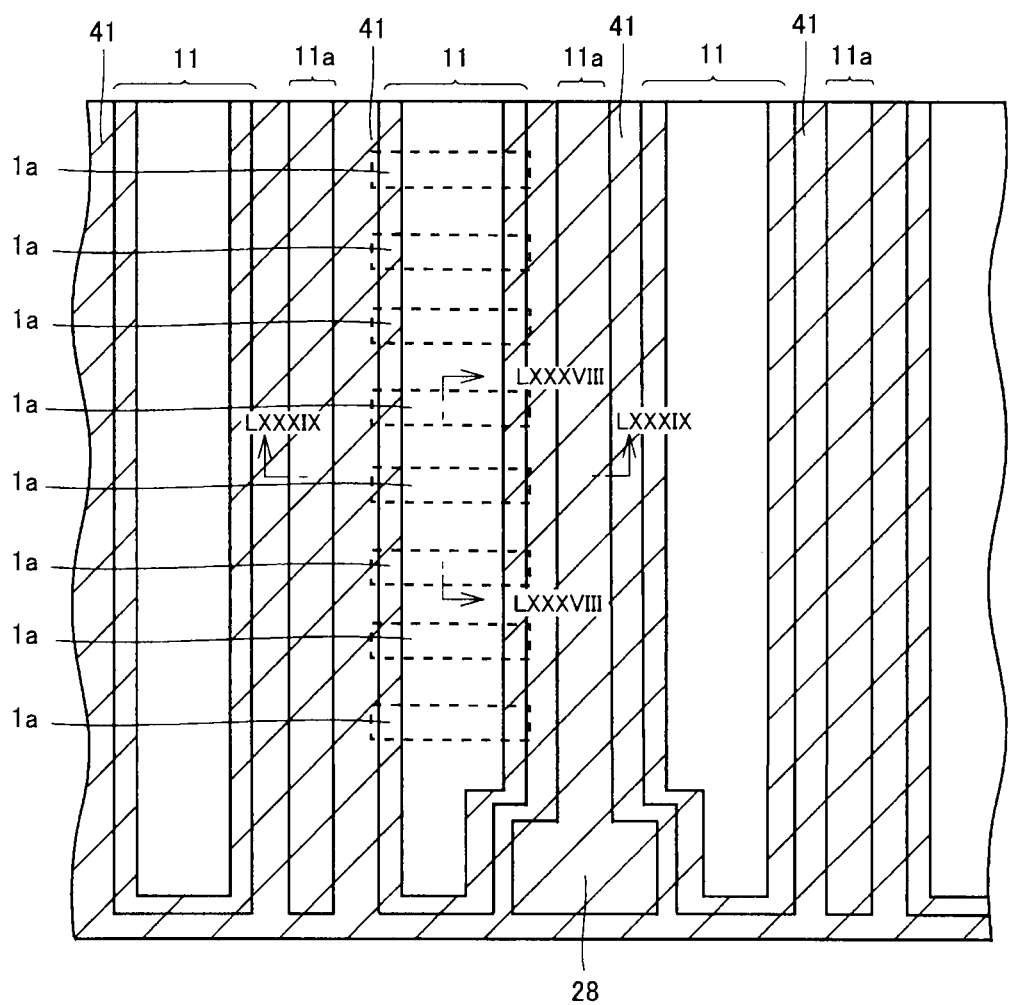
FIG. 87 is a plan view showing the layout of the semiconductor device according to the seventh embodiment of the present invention.
Figure 88:
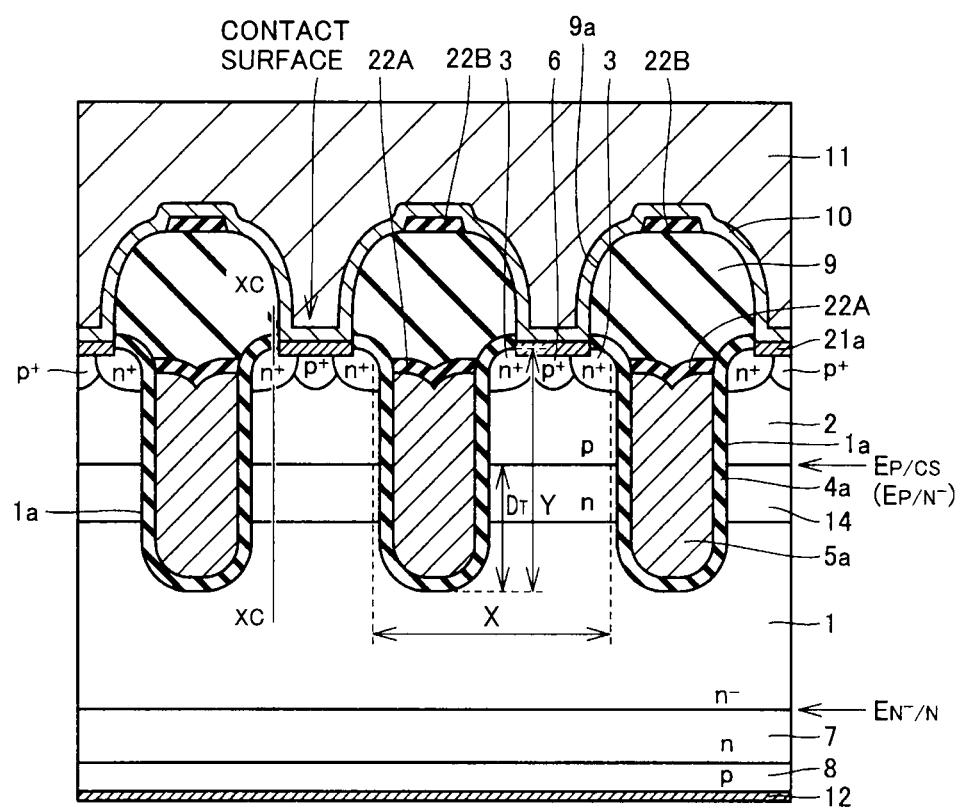
FIG. 88 is a cross sectional view along a line LXXXVIII-LXVIII in FIG. 87.
Figure 89:
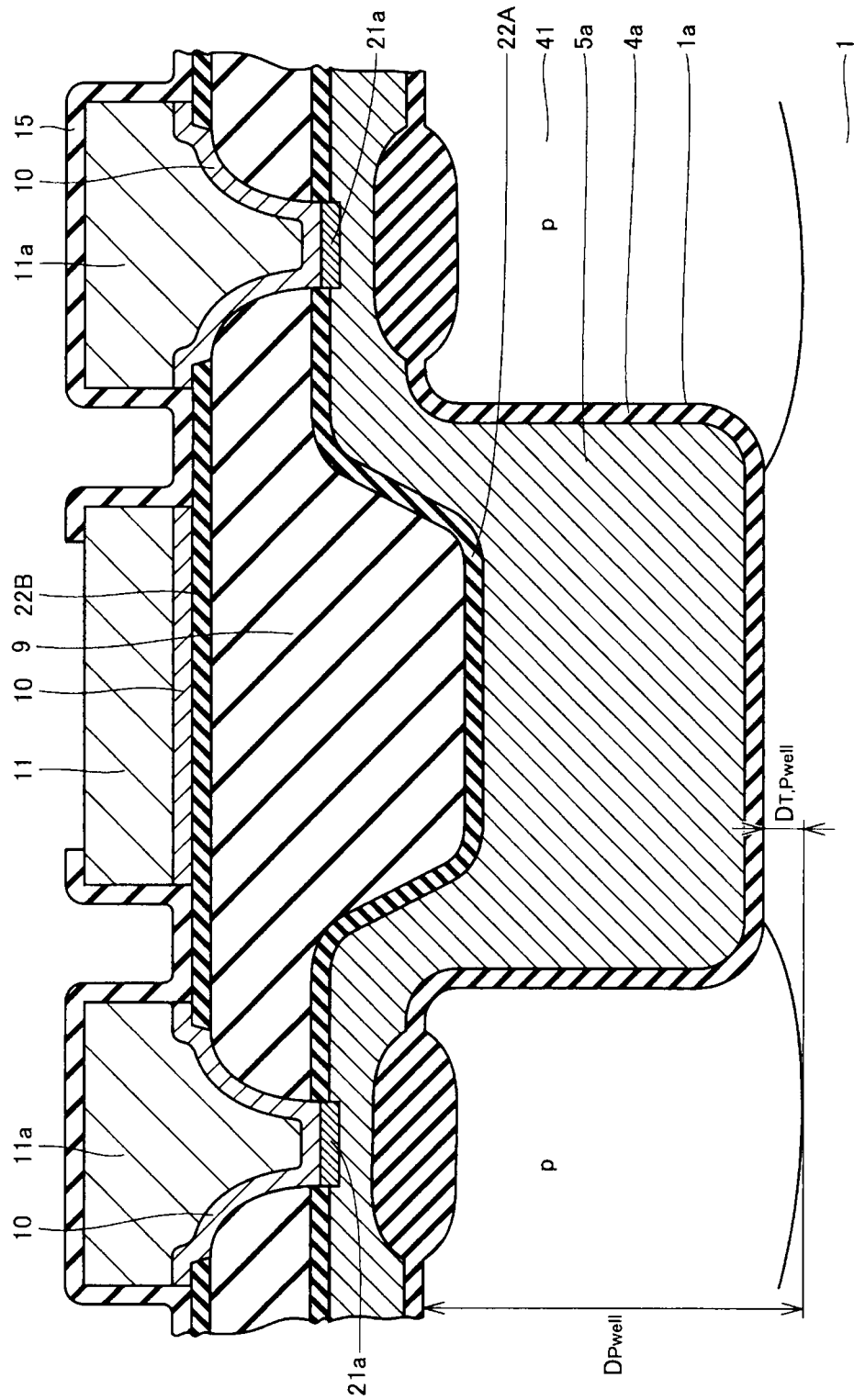
FIG. 89 is a cross sectional view along a line LXXXIX-LXXXIX in FIG. 87.
Figure 90:
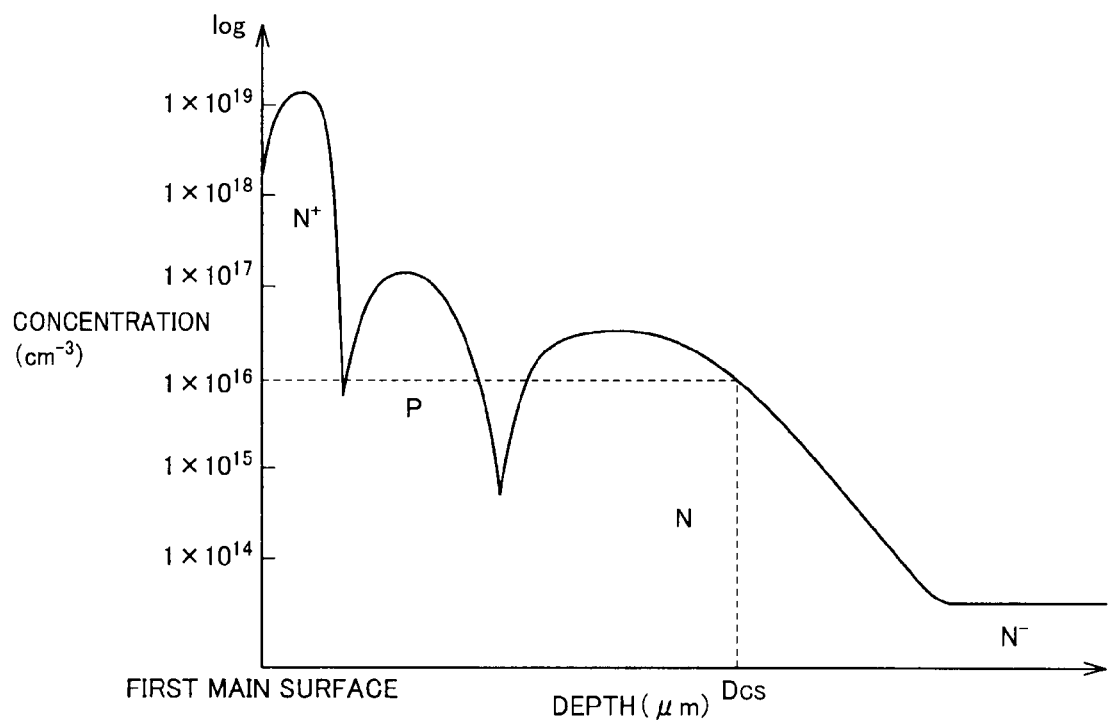
FIG. 90 shows an impurity concentration distribution along a line XC-XC in FIG. 88.

FIG. 87 is a plan view showing the layout of the semiconductor device according to the seventh embodiment of the present invention. FIG. 88 is a cross sectional view along a line LXXXVIII-LXVIII in FIG. 87. FIG. 89 is a cross sectional view along a line LXXXIX-LXXXIX in FIG. 87. FIG. 90 shows an impurity concentration distribution along a line XC-XC in FIG. 88. The section marked with diagonal lines in FIG. 87 is a region where a p-type impurity diffusion region 41 is formed. Although only gate groove 1a (represented by dotted lines in the figure) formed along one gate electrode wiring 11a is shown in FIG. 87, a plurality of gate grooves 1a (or emitter grooves 1b) are actually formed along each gate electrode wiring 11a. Referring to FIGS. 87-90, the configuration of the IGBT according to the present embodiment will then be described.

Particularly referring to FIG. 87, emitter electrodes 11 and gate electrode wirings 11a are alternately arranged in the lateral direction in the figure and extend in the vertical direction in the figure. A gate pad 28 for electrically connecting to other wiring is provided in the lower end of gate electrode wiring 11a located in the center portion of the chip in the figure. Furthermore, the plurality of gate grooves 1a are arranged directly below gate electrode wiring 11a in the vertical direction in the figure and along the direction in which gate electrode wiring 11a extends. The plurality of gate grooves 1a each having a rectangular shape in plan view are arranged along the direction in which the short side of the rectangle extends (the vertical direction in the figure). P-type body region 2 and n-type impurity diffusion region 14 are formed between gate grooves 1a which are adjacent to each other in the vertical direction in the figure. Furthermore, p-type impurity diffusion region 41 (a well layer) is formed between emitter electrodes 11 which are adjacent to each other in the lateral direction in the figure (that is, at the end of gate groove 1a). P-type impurity diffusion region 41 extends directly below gate electrode wiring 11a along emitter electrode 11 in the vertical direction in the figure.

Particularly referring to FIG. 88, n-type impurity diffusion region 14 is formed between p-type body region 2 and n− drift layer 1. N-type impurity diffusion region 14 is higher in impurity concentration than n− drift layer 1, as shown in FIG. 90. When n-type impurity diffusion region 14 exists, at least one of gate groove 1a and emitter groove 1b (for example, FIG. 40) is protruded toward the second main surface with respect to the position where the impurity concentration in n-type impurity diffusion region 14 reaches $1 \times 10^{16}$ cm$^{-3}$, which allows a high withstand voltage ($BV_{CES}$) to be maintained. The configuration shown in FIG. 88 is substantially the same as that of structure D shown in FIG. 39.

Particularly referring to FIG. 89, gate electrode 5a filling gate groove 1a extends also on the first main surface located outside gate groove 1a, and is electrically connected at its extended portion to gate electrode wiring 11a. Barrier metal layer 10 is located below gate electrode wiring 11a, and silicide layer 21a is formed in the region where barrier metal layer 10 and gate electrode 5a are in contact with each other. A passivation film 15 is formed on gate electrode wiring 11a and emitter electrode 11. P-type impurity diffusion region 41 extends deeper than gate groove 1a (toward the second main surface).

Although every groove shown in FIG. 87 corresponds to gate groove 1a filled with gate electrode 5a, at least one of the grooves only needs to serve as a gate groove and other grooves may serve as emitter grooves.

Referring to FIG. 88, the pitch between gate groove 1a and another groove adjacent thereto (gate groove 1a on the right side in the figure) is defined as a pitch X. Furthermore, the depth from the first main surface of the semiconductor substrate to the bottom of gate groove 1a forming a gate trench is defined as a depth Y. The protrusion amount of gate groove 1a from the junction plane between p-type body region 2 and n-type impurity diffusion region 14 (the junction plane between p-type body region 2 and n⁻ drift layer 1 when n-type impurity diffusion region 14 is not formed) is defined as a protrusion amount $D_T$. Further referring to FIG. 89, the distance (depth) from the junction plane between p-type impurity diffusion region 41 and n⁻ drift layer 1 to the bottom of gate groove 1a is defined as a depth $D_{T,Pwell}$.

The inventor of the present application found that the withstand voltage (breakdown voltage) of the IGBT can be improved by designing the gate trench in the IGBT having a trench-type gate structure under the following conditions.

Figure 91:
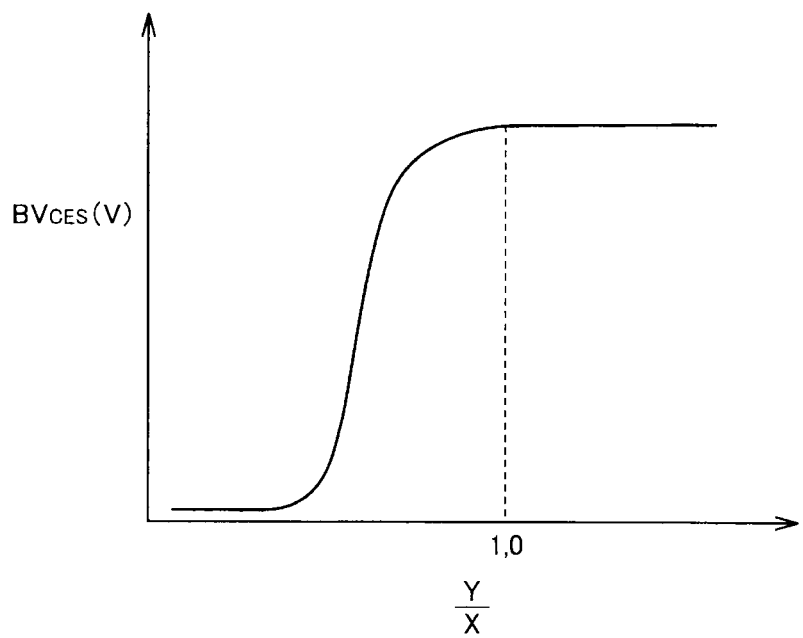
FIG. 91 is a diagram showing the relation between Y/X and $BV_{CES}$ according to the seventh embodiment of the present invention.

FIG. 91 is a diagram showing the relation between Y/X and $BV_{CES}$ according to the seventh embodiment of the present invention. Referring to FIG. 91, when depth Y from the first main surface of the semiconductor substrate to the bottom of gate groove 1a forming a gate trench is greater than the pitch between gate groove 1a and another groove adjacent thereto (that is, under the condition of 1.0≦Y/X), a high breakdown voltage $BV_{CES}$ is achieved.

Figure 92:
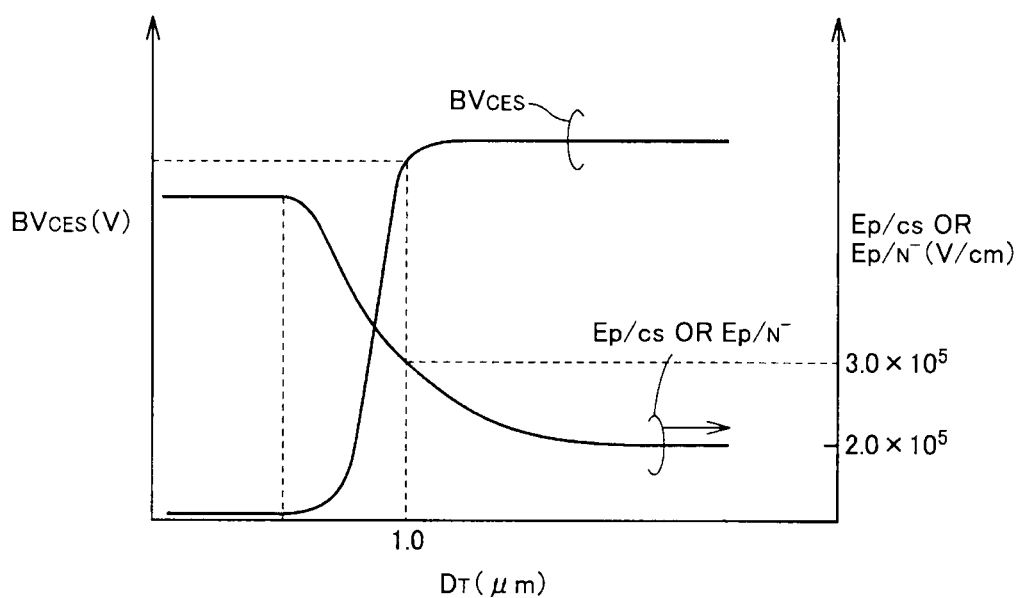
FIG. 92 is a diagram showing the relation between $D_T$ and $BV_{CES}$ and the relation between $D_T$ and $E_{P/CS}$ or $E_{P/N-}$ according to the seventh embodiment of the present invention.

FIG. 92 is a diagram showing the relation between $D_T$ and $BV_{CES}$ and the relation between $D_T$ and $E_{P/CS}$ or $E_{P/N-}$, according to the seventh embodiment of the present invention. In this case, $E_{P/CS}$ represents an electric field intensity in the junction plane between p-type body region 2 and n-type impurity diffusion region 14. $E_{P/N-}$ represents an electric field intensity in the junction plane between p-type body region 2 and n⁻ drift layer 1 in the case where n-type impurity diffusion region 14 is not formed. Referring to FIG. 92, in the case where protrusion amount $D_T$ of gate groove 1a from the junction plane between p-type body region 2 and n-type impurity diffusion region 14 is 1.0 μm≦$D_T$, electric field intensity $E_{P/CS}$ or $E_{P/N-}$ is decreased and breakdown voltage $BV_{CES}$ is increased.

Figure 93:
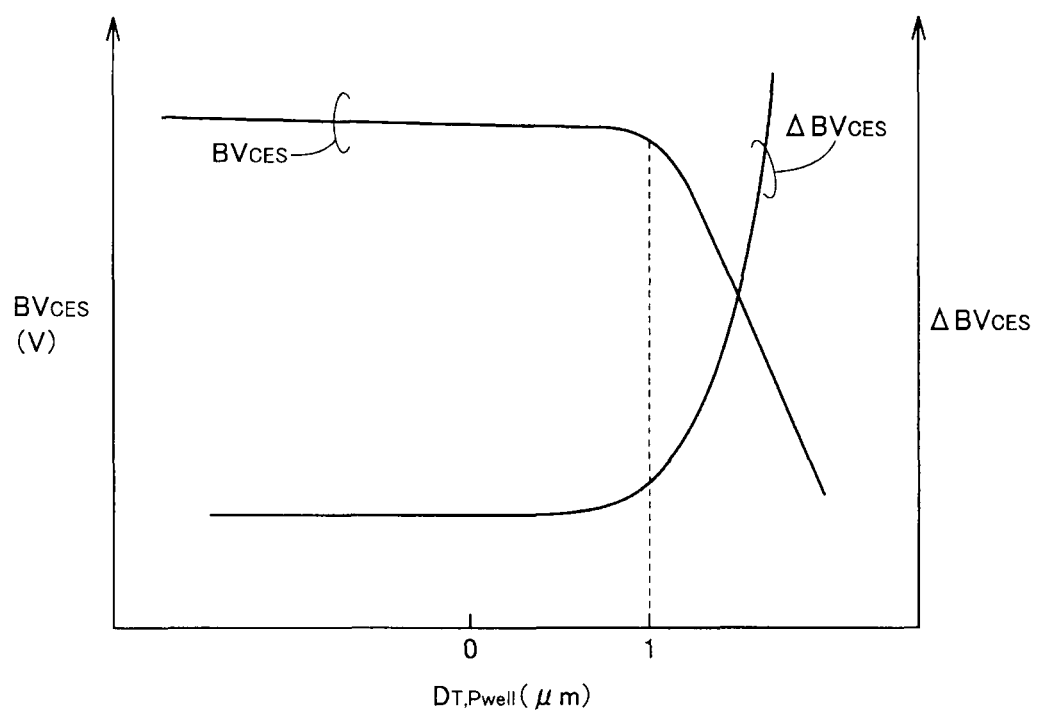
FIG. 93 is a diagram showing the relation of $D_{T,Pwell}$ to $BV_{CES}$ and $\Delta BV_{CES}$ according to the seventh embodiment of the present invention.

FIG. 93 is a diagram showing the relation of $D_{T,Pwell}$ to $BV_{CES}$ and $\Delta BV_{CES}$ according to the seventh embodiment of the present invention. In this case, $\Delta BV_{CES}$ represents a value obtained by subtracting $BV_{CES}$ in the case where the gate potential is set at −20V from $BV_{CES}$ in the case where the gate potential is set at 0V (equal to the emitter potential). Referring to FIG. 93, when depth $D_{T,Pwell}$ from the bottom surface of gate groove 1a to the bottom surface of p-type impurity diffusion region 41 (junction plane between p-type impurity diffusion region 41 and n⁻ drift layer 1) is $D_{T,Pwell}$≦1.0 μm, breakdown voltage $BV_{CES}$ is increased and breakdown voltage variation amount $\Delta BV_{CES}$ is also suppressed low.

As described above, the withstand voltage of the IGBT can be improved by manufacturing gate groove 1a and emitter groove 1b so as to satisfy the condition of 1.0≦Y/X, 1.0 μm≦$D_T$ or 0<$D_{T,Pwell}$≦1.0 μm.

Figure 94:
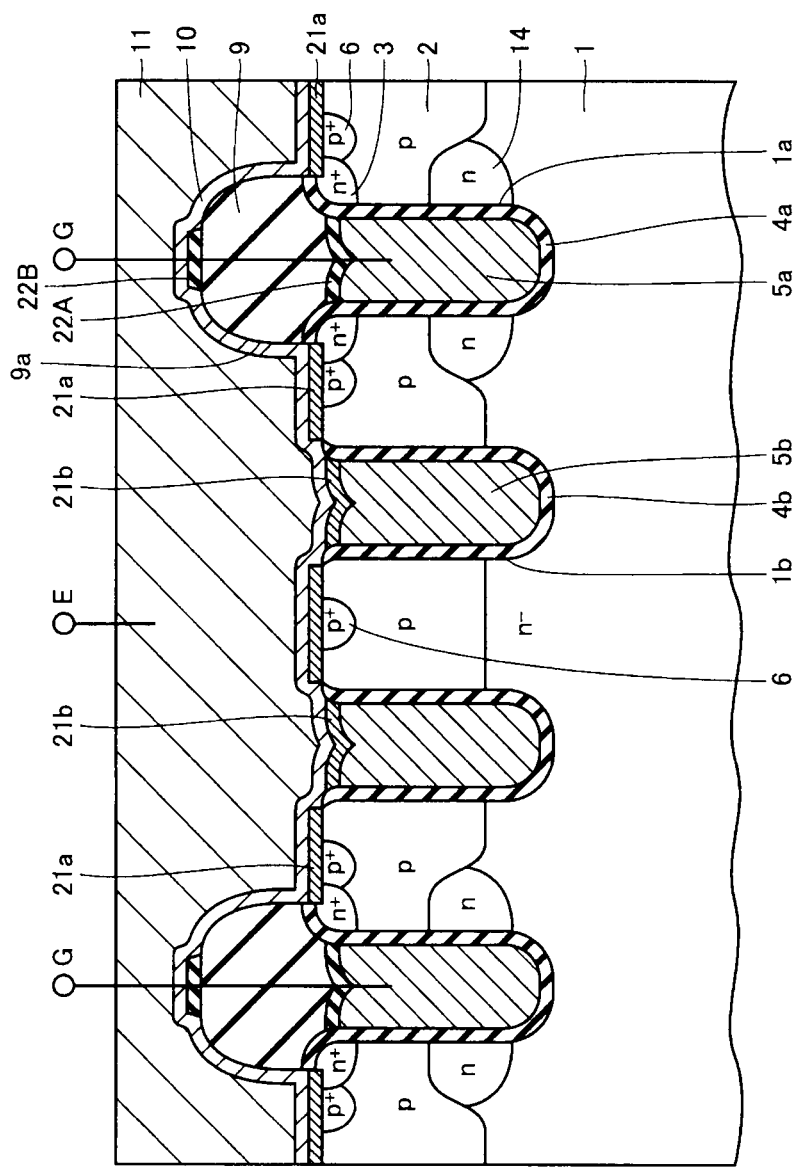
FIG. 94 is a schematic cross sectional view showing each type of configuration of a planar gate type IGBT according to the seventh embodiment of the present invention.
Figure 95:
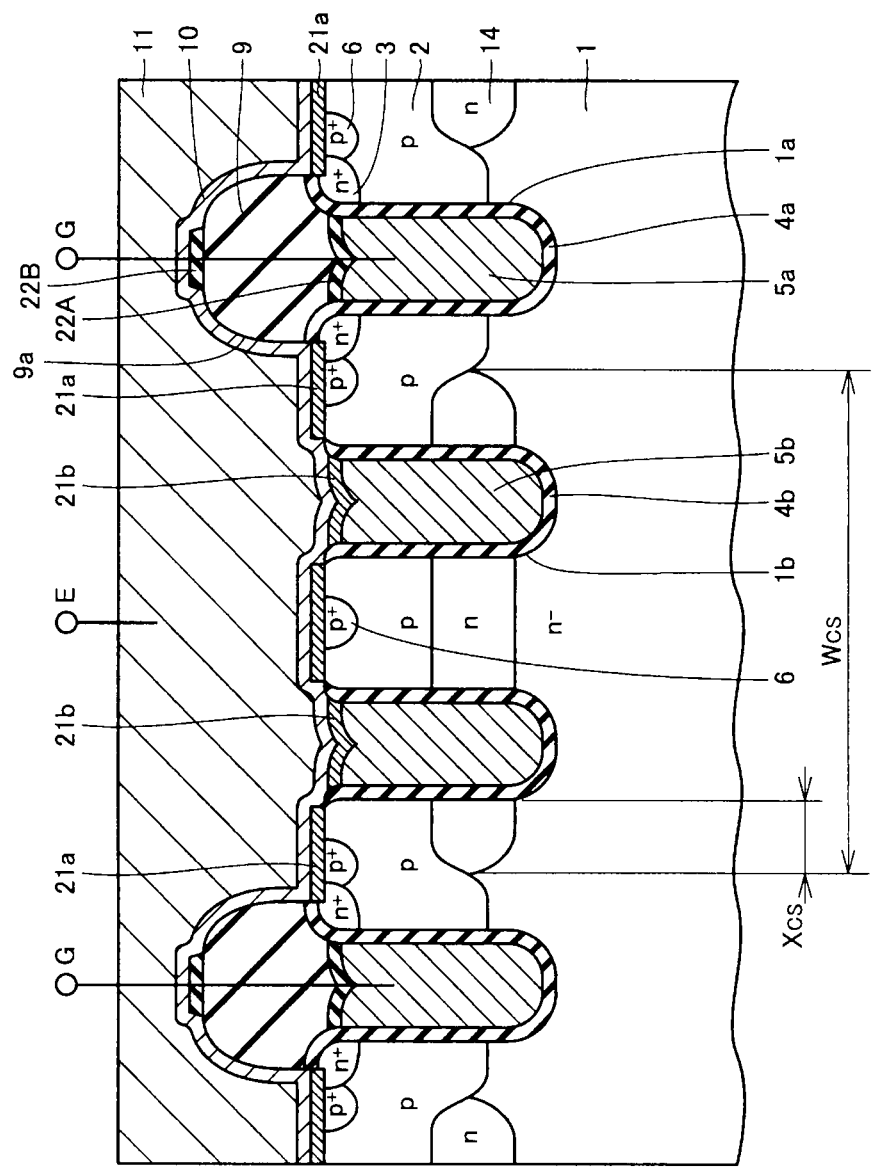
FIG. 95 is a schematic cross sectional view showing each type of configuration of the planar gate type IGBT according to the seventh embodiment of the present invention.

Although the configuration in which n-type impurity diffusion region 14 is formed entirely between gate grooves 1a has been described in FIG. 88, n-type impurity diffusion region 14 may be formed only in a portion between a plurality of grooves, as shown in FIGS. 94 and 95 set forth below.

FIGS. 94 and 95 each are a schematic cross sectional view showing each type of configuration of the trench gate type IGBT according to the seventh embodiment of the present invention. In the configuration shown in FIG. 94, n-type impurity diffusion region 14 is formed only around the gate trench. N-type impurity diffusion region 14 is formed so as to be brought into contact with gate groove 1a but not with emitter groove 1b. In contrast, in the configuration shown in FIG. 95, n-type impurity diffusion region 14 is formed only around the emitter trench. N-type impurity diffusion region 14 is formed so as to be brought into contact with each of two emitter grooves 1b but not with gate groove 1a.

It is to be noted that since the configurations other than those described above are almost the same as the configuration of structure E shown in FIG. 40, the same components are designated by the same reference characters, and description thereof will not be repeated.

The inventor of the present application found that the collector-emitter voltage can be decreased and the breakdown energy can be improved by adjusting the width of n-type impurity diffusion region 14 and the distance from emitter groove 1b.

Figure 96:
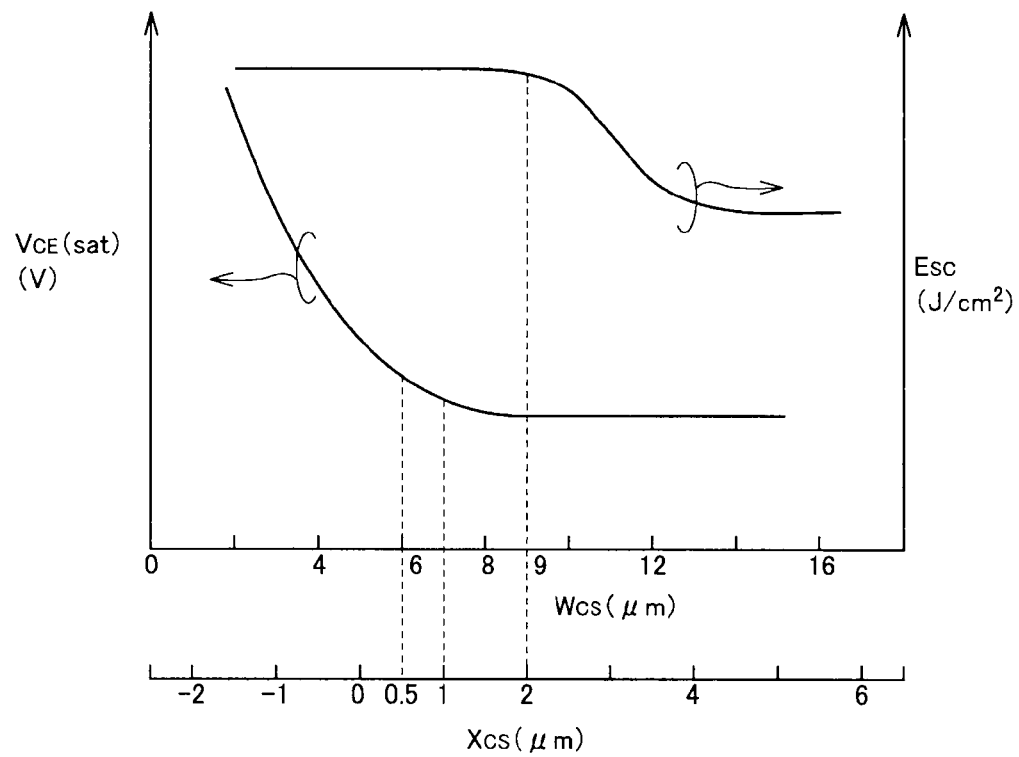
FIG. 96 is a diagram showing the relations of $W_{CS}$ and $X_{CS}$ to each of $V_{CE}$ and $E_{SC}$.

FIG. 96 is a diagram showing the relations of $W_{CS}$ and $X_{CS}$ to $V_{CE}$ and $E_{SC}$. In this case, $W_{CS}$ represents a width of n-type impurity diffusion region 14 in the region existing around emitter groove 1b as see in plan view, and $X_{CS}$ represents a distance from emitter groove 1b to the end of n-type impurity diffusion region 14. Referring to FIG. 96, when width $W_{CS}$ of n-type impurity diffusion region 14 is 6 μm≦$W_{CS}$≦9 μm, or when distance $X_{CS}$ from emitter groove 1b to the end of n-type impurity diffusion region 14 is 0.5 μm $X_{CS}$≦2 μm, collector-emitter voltage $V_{CE}$ is decreased and a breakdown energy $E_{SC}$ obtained during high short circuit is achieved.

Figure 97:
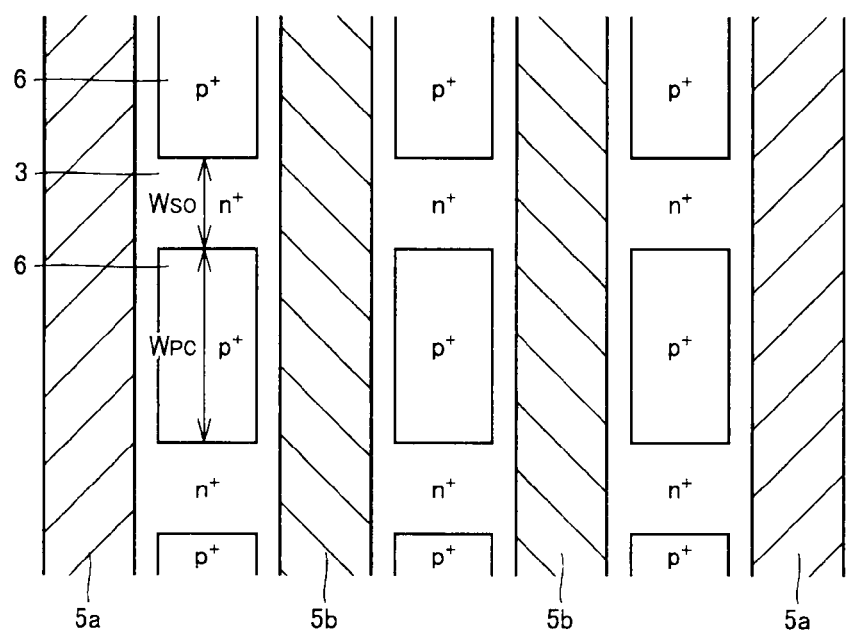
FIG. 97 is a plan view showing the layout of an n-type emitter region 3 and a p$^+$ impurity diffusion region 6 in the semiconductor device according to the seventh embodiment of the present invention.

FIG. 97 is a diagram showing the planar layout of n-type emitter region 3 and p⁺ impurity diffusion region 6 in the semiconductor device according to the seventh embodiment of the present invention. Referring to FIG. 97, gate electrode 5a and emitter conductive layer 5b each extend in the vertical direction in the figure, and n-type emitter region 3 is formed between gate electrode 5a and emitter conductive layer 5b, and between emitter conductive layers 5b. N-type emitter region 3 extends in the vertical direction in the figure, and p⁺ impurity diffusion regions 6 are formed at regular intervals in the region interposed between n-type emitter regions 3. Furthermore, as shown in FIG. 98, n-type emitter region 3 and p⁺ impurity diffusion region 6 may be alternately formed in the direction in which gate electrode 5a or emitter conductive layer 5b extends (in the vertical direction in the figure).

Figure 98:
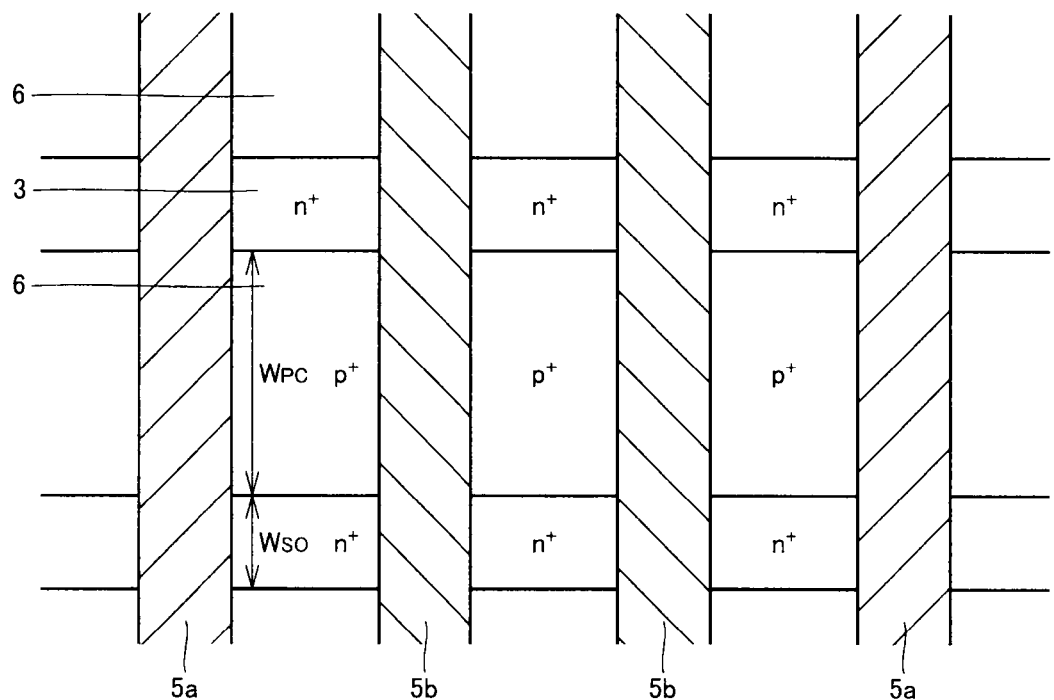
FIG. 98 is a plan view showing a modification of the layout of n-type emitter region 3 and p$^+$ impurity diffusion region 6 in the semiconductor device according to the seventh embodiment of the present invention.

As shown in FIGS. 97 and 98, the width of n-type emitter region 3 along the direction in which gate electrode 5a extends is defined as $W_{SO}$, and the width of p⁺ impurity diffusion region 6 along the direction in which gate electrode 5a extends is defined as $W_{PC}$. The inventor of the present application found that the collector-emitter voltage can be decreased and the breakdown energy can be improved by controlling the relation between $W_{SO}$ and $W_{PC}$.

Figure 99:
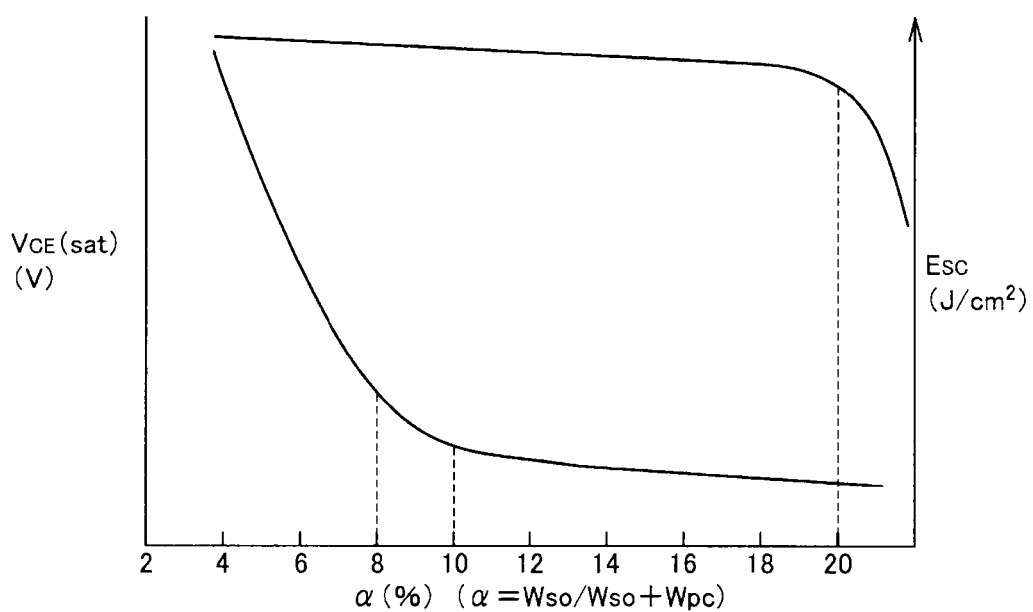
FIG. 99 is a diagram showing the relation of α to $V_{CE}(sat)$ and $E_{SC}$ according to the seventh embodiment of the present invention.

FIG. 99 is a diagram showing the relation of α to $V_{CE}$(sat) and $E_{SC}$ according to the seventh embodiment of the present invention. In this case, α (%) represents a value defined by the expression α=($W_{SO}/W_{SO}+W_{PC}$)×100. Referring to FIG. 99, when α is in the range of 8.0%≦α≦20.0%, a low collector-emitter voltage $V_{CE}$(sat) and a high breakdown energy $E_{SC}$ are achieved.

Eighth Embodiment

Figure 100:
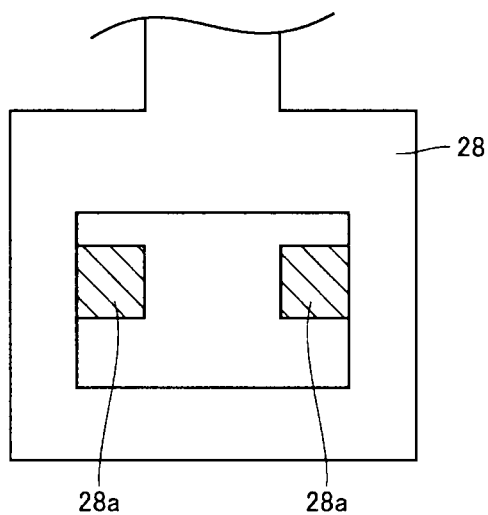
FIG. 100 is a plan view schematically showing the layout of a gate pad according to the eighth embodiment of the present invention.

FIG. 100 is a diagram schematically showing the planar layout of the gate pad according to the eighth embodiment of the present invention. Referring to FIG. 100, in the present embodiment, a part of the current path of gate electrode wiring 11a (FIG. 87) is formed by a resistor body 28a having a locally high resistance. In FIG. 100, a part of gate pad 28 for electrically connecting the wiring (surface gate wiring) and gate electrode wiring 11a is formed by resistor bodies 28a. Each of resistor bodies 28a protrudes through the opening provided in the center portion of gate pad 28 so as to face each other. Resistor body 28a may have the same structure as that of gate electrode 5a, for example, shown in FIG. 1 or 75.

Figure 101:
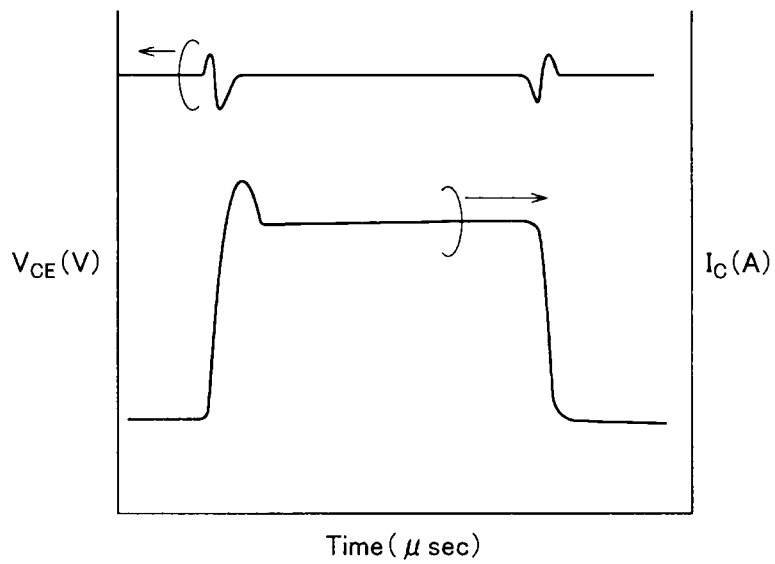
FIG. 101 is a diagram for illustrating the oscillation phenomenon of the gate voltage.
Figure 102:
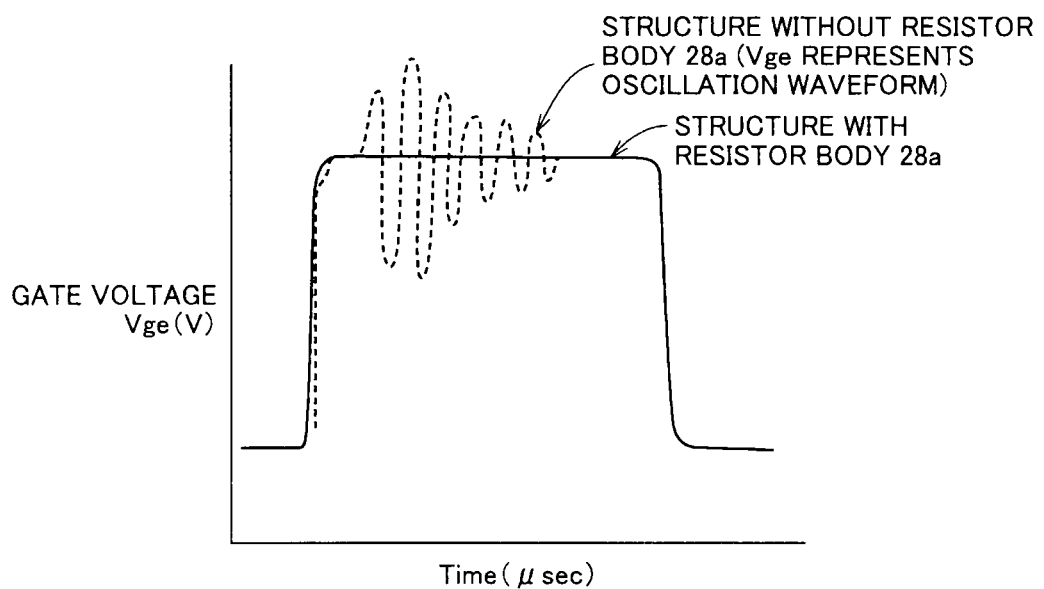
FIG. 102 is a diagram for illustrating the oscillation phenomenon of the gate voltage.

FIGS. 101 and 102 each are a diagram for illustrating the oscillation phenomenon of the gate voltage. According to the MOS transistor and the IGBT having a trench gate structure, an increase in the switching speed causes collector-emitter voltage $V_{CE}$ to oscillate during fluctuation of a current $I_c$ as shown in FIG. 101. This is caused by the fact that an LCR circuit constant causing oscillation of the device is attained. Accordingly, resistor body 28a is disposed to achieve an LCR circuit constant which hardly causes oscillation of the device. Consequently, the oscillation phenomenon of a gate voltage $V_{ge}$ can be suppressed as shown in FIG. 102.

Ninth Embodiment

In order to improve the $V_{CE}(sat)$-$E_{OFF}$ characteristics in the IGBT, it is effective to reduce a thickness of n⁻ drift layer 1. However, a reduction in thickness of n⁻ drift layer 1 makes it difficult to implement a high withstand voltage. Thus, the inventor of the present application pays attention to the relation between electric field intensity $E_{P/CS}$ in the junction plane between p-type body region 2 and n-type impurity diffusion region 14 (electric field intensity $E_{P/N-}$ in the junction plane between p-type body region 2 and n⁻ drift layer 1 when n-type impurity diffusion region 14 is not formed) and electric field intensity $E_{N/N-}$ in the junction plane between n-type buffer region 7 and n⁻ drift layer 1, to thereby find out that the withstand voltage of the IGBT can be improved.

Figure 103:
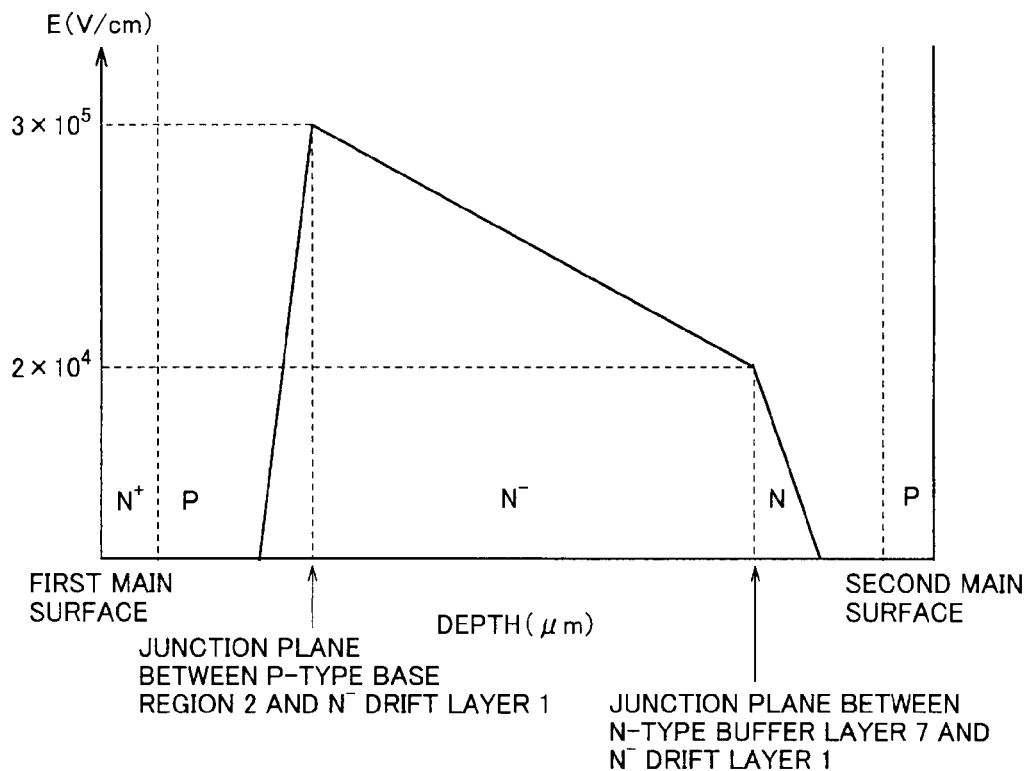
FIG. 103 is a diagram schematically showing the electric field strength distribution along a line XIX-XIX in FIG. 1 when applying a reverse bias slightly lower than a breakdown voltage to the main junction in the IGBT, according to the ninth embodiment of the present invention.
Figure 104:
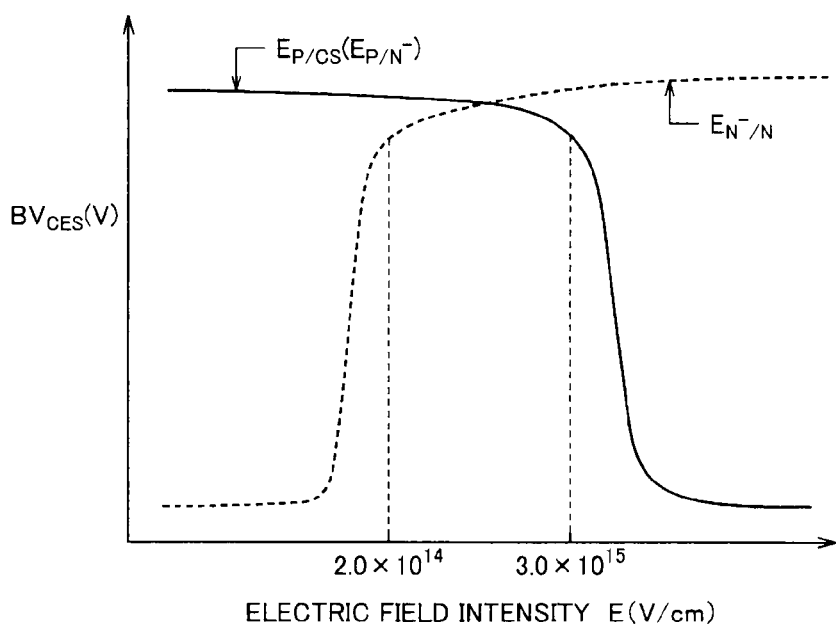
FIG. 104 is a diagram showing the relation between the breakdown voltage and the electric field intensity in the junction plane according to the ninth embodiment of the present invention.

FIG. 103 is a diagram schematically showing the electric field intensity distribution along a line XIX-XIX in FIG. 1 when applying a reverse bias slightly lower than the breakdown voltage to the main junction in the IGBT, according to the ninth embodiment of the present invention. FIG. 104 is a diagram showing the relation between the electric field intensity and the breakdown voltage in the junction plane according to the ninth embodiment of the present invention.

Referring to FIG. 103, the electric field in the semiconductor obtained when applying a reverse bias slightly lower than the breakdown voltage to the main junction of the IGBT is rapidly increased in the region from the first main surface of the semiconductor substrate to the junction plane between p-type body region 2 and n⁻ drift layer 1, and then, gradually decreased within n⁻ drift layer 1, which is followed by a rapid decrease in n⁻ drift layer 1 and n-type buffer region 7. Furthermore, the electric field reaches 0 in p-type body region 2 and n-type buffer region 7. Referring to FIG. 104, a high breakdown voltage $BV_{CES}$ is achieved when electric field intensity $E_{P/N-}$ in the junction plane between n⁻ drift layer 1 and p-type body region 2 is $0 < E_{P/N-} \leq 3.0 \times 10^{15}$ (V/cm). Furthermore, a high breakdown voltage $BV_{CES}$ is achieved when electric field intensity $E_{N/N-}$ in the junction plane between n-type buffer region 7 and n⁻ drift layer 1 is $2.0 \times 10^{14}$ $E_{N/N-}$ (V/cm). It is preferable that $E_{N/N-}$ is not more than $E_{P/N-}$.

It is to be noted that the structure or the value range described in each of the first to eighth embodiments can be combined with each other as appropriate.

It should be understood that the embodiments disclosed herein are illustrative and non-restrictive in every respect. The scope of the present invention is defined by the terms of the claims, rather than the description above, and is intended to include any modifications and alterations within the scope and meaning equivalent to the terms of the claims.

INDUSTRIAL APPLICABILITY

The present invention is suitable as a high withstand voltage semiconductor device suitable for parallel operation, and particularly as a semiconductor device having an IGBT.

The invention claimed is:

1. A semiconductor device comprising:
a semiconductor substrate having a first main surface and a second main surface facing each other;
an element having a gate electrode formed on a side of said first main surface, a first electrode formed on the side of said first main surface and a second electrode formed in contact with said second main surface, said element generating an electric field in a channel by a voltage applied to said gate electrode, and controlling a current between said first electrode and said second electrode by the electric field in said channel; and
a collector region formed on said second main surface, said collector region including a collector diffusion layer of a first conductivity type in contact with said second electrode, and a buffer diffusion layer of a second conductivity type formed closer to the first main surface than said collector diffusion layer is, wherein
an impurity concentration of said collector diffusion layer in an interface between said second electrode and said collector diffusion layer is not less than $5.0 \times 10^{15}$ cm⁻³ and not more than $1.0 \times 10^{22}$ cm⁻³.

2. A semiconductor device comprising:
a semiconductor substrate having a first main surface and a second main surface facing each other;
an element having a gate electrode formed on a side of said first main surface, a first electrode formed on the side of said first main surface and a second electrode formed in contact with said second main surface, said element generating an electric field in a channel by a voltage applied to said gate electrode, and controlling a current between said first electrode and said second electrode by the electric field in said channel; and
a collector region formed on said second main surface, said collector region including a collector diffusion layer of a first conductivity type in contact with said second electrode, and a buffer diffusion layer of a second conductivity type formed closer to the first main surface than said collector diffusion layer is, wherein
a maximum value of an impurity concentration of said collector diffusion layer is not less than $1.0 \times 10^{16}$ cm⁻³ and not more than $1.0 \times 10^{22}$ cm⁻³.

3. A semiconductor device comprising:
a semiconductor substrate having a first main surface and a second main surface facing each other;
an element having a gate electrode formed on a side of said first main surface, a first electrode formed on the side of said first main surface and a second electrode formed in contact with said second main surface, said element generating an electric field in a channel by a voltage applied to said gate electrode, and controlling a current between said first electrode and said second electrode by the electric field in said channel; and
a collector region formed on said second main surface, said collector region including a collector diffusion layer of a first conductivity type in contact with said second electrode, and a buffer diffusion layer of a second conductivity type formed closer to the first main surface than said collector diffusion layer is, wherein a depth from said second main surface to a junction plane between said collector diffusion layer and said buffer diffusion layer is greater than 0 and not more than 1.0 µm.

4. A semiconductor device comprising:
a semiconductor substrate having a first main surface and a second main surface facing each other;
an element having a gate electrode formed on a side of said first main surface, a first electrode formed on the side of said first main surface and a second electrode formed in contact with said second main surface, said element generating an electric field in a channel by a voltage applied to said gate electrode, and controlling a current between said first electrode and said second electrode by the electric field in said channel; and
a collector region formed on said second main surface, said collector region including a collector diffusion layer of a first conductivity type in contact with said second electrode, and a buffer diffusion layer of a second conductivity type formed closer to the first main surface than said collector diffusion layer is, wherein
said collector region further includes a drift diffusion layer of the second conductivity type, and said drift diffusion layer is lower in impurity concentration than said buffer diffusion layer and formed adjacent to said buffer diffusion layer and closer to the first main surface than said buffer diffusion layer is, and
a depth from said second main surface to a junction plane between said buffer diffusion layer and said drift diffusion layer is not less than 0.4 µm and not more than 50 µm.

5. A semiconductor device comprising:
a semiconductor substrate having a first main surface and a second main surface facing each other;
an element having a gate electrode formed on a side of said first main surface, a first electrode formed on the side of said first main surface and a second electrode formed in contact with said second main surface, said element generating an electric field in a channel by a voltage applied to said gate electrode, and controlling a current between said first electrode and said second electrode by the electric field in said channel; and
a collector region formed on said second main surface, said collector region including a collector diffusion layer of a first conductivity type in contact with said second electrode, and a buffer diffusion layer of a second conductivity type formed closer to the first main surface than said collector diffusion layer is, wherein
a carrier lifetime in said buffer diffusion layer is less than a carrier lifetime in said collector diffusion layer.

6. A semiconductor device comprising:
a semiconductor substrate having a first main surface and a second main surface facing each other;
an element having a gate electrode formed on a side of said first main surface, a first electrode formed on the side of said first main surface and a second electrode formed in contact with said second main surface, said element generating an electric field in a channel by a voltage applied to said gate electrode, and controlling a current between said first electrode and said second electrode by the electric field in said channel; and
a collector region formed on said second main surface, said collector region including a collector diffusion layer of a first conductivity type in contact with said second electrode, and a buffer diffusion layer of a second conductivity type formed closer to the first main surface than said collector diffusion layer is, wherein
said collector region further includes a drift diffusion layer of the second conductivity type, and said drift diffusion layer is lower in impurity concentration than said buffer diffusion layer and formed adjacent to said buffer diffusion layer and closer to the first main surface than said buffer diffusion layer is, and
a carrier lifetime in a range of a depth of not less than 0.50 µm and not more than 60.0 µm from said second main surface is less than a carrier lifetime in said drift diffusion layer.

7. A semiconductor device comprising:
a semiconductor substrate having a first main surface and a second main surface facing each other;
an element having a gate electrode formed on a side of said first main surface, a first electrode formed on the side of said first main surface and a second electrode formed in contact with said second main surface, said element generating an electric field in a channel by a voltage applied to said gate electrode, and controlling a current between said first electrode and said second electrode by the electric field in said channel; and
a collector region formed on said second main surface, said collector region including a collector diffusion layer of a first conductivity type in contact with said second electrode, and a buffer diffusion layer of a second conductivity type formed closer to the first main surface than said collector diffusion layer is, wherein
said collector diffusion layer is lower in activation rate than said buffer diffusion layer.

8. A semiconductor device comprising:
a semiconductor substrate having a first main surface and a second main surface facing each other;
an element having a gate electrode formed on a side of said first main surface, a first electrode formed on the side of said first main surface and a second electrode formed in contact with said second main surface, said element generating an electric field in a channel by a voltage applied to said gate electrode, and controlling a current between said first electrode and said second electrode by the electric field in said channel; and
a collector region formed on said second main surface, said collector region including a collector diffusion layer of a first conductivity type in contact with said second electrode, and a buffer diffusion layer of a second conductivity type formed closer to the first main surface than said collector diffusion layer is, wherein
an activation rate in said collector diffusion layer is greater than 0 and not more than 90%.

9. A semiconductor device comprising:
a semiconductor substrate having a first main surface and a second main surface facing each other;
an element having a gate electrode formed on a side of said first main surface, a first electrode formed on the side of said first main surface and a second electrode formed in contact with said second main surface, said element generating an electric field in a channel by a voltage applied to said gate electrode, and controlling a current between said first electrode and said second electrode by the electric field in said channel; and
a collector region formed on said second main surface, said collector region including a collector diffusion layer of a first conductivity type in contact with said second electrode, and a buffer diffusion layer of a second conductivity type formed closer to the first main surface than said collector diffusion layer is, wherein a depth from said second main surface to a position where an impurity concentration of said buffer diffusion layer reaches a maximum value is not less than 0.40 μm and not more than 50 μm.

10. A semiconductor device comprising:
a semiconductor substrate having a first main surface and a second main surface facing each other;
an element having a gate electrode formed on a side of said first main surface, a first electrode formed on the side of said first main surface and a second electrode formed in contact with said second main surface, said element generating an electric field in a channel by a voltage applied to said gate electrode, and controlling a current between said first electrode and said second electrode by the electric field in said channel; and
a collector region formed on said second main surface, said collector region including a collector diffusion layer of a first conductivity type in contact with said second electrode, and a buffer diffusion layer of a second conductivity type formed closer to the first main surface than said collector diffusion layer is, wherein
a ratio of a maximum value of an impurity concentration in said collector diffusion layer to a maximum value of an impurity concentration in said buffer diffusion layer is not less than 1.0 and not more than $1.0 \times 10^3$.

11. A semiconductor device comprising:
a semiconductor substrate having a first main surface and a second main surface facing each other;
an element having a gate electrode formed on a side of said first main surface, a first electrode formed on the side of said first main surface and a second electrode formed in contact with said second main surface, said element generating an electric field in a channel by a voltage applied to said gate electrode, and controlling a current between said first electrode and said second electrode by the electric field in said channel; and
a collector region formed on said second main surface, said collector region including a collector diffusion layer of a first conductivity type in contact with said second electrode, and a buffer diffusion layer of a second conductivity type formed closer to the first main surface than said collector diffusion layer is, wherein
said collector region further includes a drift diffusion layer of the second conductivity type, and said drift diffusion layer is lower in impurity concentration than said buffer diffusion layer and formed adjacent to said buffer diffusion layer and closer to the first main surface than said buffer diffusion layer is, and
a ratio of the number of atoms per unit area of impurities forming said buffer diffusion layer to the number of atoms per unit area of impurities forming said drift diffusion layer is not less than 0.05 and not more than 100.

12. A semiconductor device comprising:
a semiconductor substrate having a first main surface and a second main surface facing each other;
an element having a gate electrode formed on a side of said first main surface, a first electrode formed on the side of said first main surface and a second electrode formed in contact with said second main surface, said element generating an electric field in a channel by a voltage applied to said gate electrode, and controlling a current between said first electrode and said second electrode by the electric field in said channel; and
a collector region formed on said second main surface, said collector region including a collector diffusion layer of a first conductivity type in contact with said second electrode, and a buffer diffusion layer of a second conductivity type formed closer to the first main surface than said collector diffusion layer is, wherein
said collector region further includes an intermediate layer of the second conductivity type, and said intermediate layer is lower in impurity concentration than said buffer diffusion layer and formed adjacent to said buffer diffusion layer, and
a ratio of the number of atoms per unit area of impurities forming said intermediate layer to the number of atoms per unit area of impurities forming said buffer diffusion layer is greater than 0 and not more than 0.50.

13. A semiconductor device comprising:
a semiconductor substrate having a first main surface and a second main surface facing each other;
an element having a gate electrode formed on a side of said first main surface, a first electrode formed on the side of said first main surface, and a second electrode formed in contact with said second main surface, said element generating an electric field in a channel by a voltage applied to said gate electrode, and controlling a current between said first electrode and said second electrode by the electric field in said channel; and
a collector region formed on said second main surface, said collector region including a collector diffusion layer of a first conductivity type in contact with said second electrode, a buffer diffusion layer of a second conductivity type formed closer to said first main surface than said collector diffusion layer is, and a drift diffusion layer of the second conductivity type, and said drift diffusion layer being lower in impurity concentration than said buffer diffusion layer and formed adjacent to said buffer diffusion layer and closer to the first main surface than said buffer diffusion layer is, wherein
a ratio of the number of atoms per unit area of impurities forming said buffer diffusion layer to the number of atoms per unit area of impurities forming said drift diffusion layer is not less than 0.05 and not more than 100.

14. The semiconductor device according to claim 13, wherein an impurity concentration of said collector diffusion layer in an interface between said second electrode and said collector diffusion layer is not less than $5.0 \times 10^{15}$ cm$^{-3}$ and not more than $1.0 \times 10^{21}$ cm$^{-3}$.

15. The semiconductor device according to claim 13, wherein a maximum value of the impurity concentration of said collector diffusion layer is not less than $1.0 \times 10^{16}$ cm$^{-3}$ and not more than $1.0 \times 10^{21}$ cm$^{-3}$.

16. The semiconductor device according to claim 13, wherein a depth from said second main surface to a junction plane between said collector diffusion layer and said buffer diffusion layer is greater than 0 and not more than 1.0 μm.

17. The semiconductor device according to claim 13, wherein a depth from said second main surface to a junction plane between said buffer diffusion layer and said drift diffusion layer is not less than 0.4 μm and not more than 50 μm.

18. The semiconductor device according to claim 13, wherein a carrier lifetime in said buffer diffusion layer is less than a carrier lifetime in said collector diffusion layer.

19. The semiconductor device according to claim 13, wherein a carrier lifetime in a range of a depth of not less than 0.50 μm and not more than 60.0 μm from said second main surface is less than a carrier lifetime in said drift diffusion layer.

20. The semiconductor device according to claim 13, wherein said collector diffusion layer is lower in activation rate than said buffer diffusion layer.

21. The semiconductor device according to claim 13, wherein an activation rate in said collector diffusion layer is greater than 0 and not more than 90%.

22. The semiconductor device according to claim 13, wherein a depth from said second main surface to a position where the impurity concentration of said buffer diffusion layer reaches a maximum value is not less than 0.40 μm and not more than 50 μm.

23. The semiconductor device according to claim 13, wherein a ratio of a maximum value of the impurity concentration in said collector diffusion layer to a maximum value of the impurity concentration in said buffer diffusion layer is not less than 1.0 and not more than $1.0 \times 10^3$.

24. The semiconductor device according to claim 13, wherein the ratio of the number of atoms per unit area of impurities forming said buffer diffusion layer to the number of atoms per unit area of impurities forming said drift diffusion layer is not less than 0.05 and not more than 100.

25. The semiconductor device according to claim 13, wherein said second main surface has a center line average roughness of greater than 0 and not more than 200 nm.

26. The semiconductor device according to claim 13, wherein a maximum height of said second main surface is greater than 0 and not more than 2000 nm.

27. The semiconductor device according to claim 13, wherein a gate groove is formed in said first main surface of said semiconductor substrate, and said gate groove is filled with said gate electrode.

28. The semiconductor device according to claim 27, wherein
a plurality of grooves are formed in said first main surface of said semiconductor substrate and said gate groove is at least one of said plurality of grooves, and
a ratio of a depth from said first main surface to a bottom of said gate groove to a pitch between said gate groove and another groove adjacent thereto is not less than 1.0.

29. The semiconductor device according to claim 27, wherein a plurality of grooves are formed in said first main surface of said semiconductor substrate, said plurality of grooves are arranged in one direction as seen in plan view, and said gate groove is at least one of said plurality of grooves, said semiconductor device further comprises a well layer of the first conductivity type formed on said first main surface adjacent to each of said plurality of grooves, extending in said one direction as seen in plan view, and formed deeper than each of said plurality of grooves, and
a depth from a bottom surface of said gate groove to a bottom of said well layer is greater than 0 and not more than 1.0 μtm.

30. The semiconductor device according to claim 13, further comprising: a body diffusion layer of the first conductivity type serving as said channel; and
a buried diffusion layer of the second conductivity type formed between said body diffusion layer and said drift diffusion layer.

31. The semiconductor device according to claim 30, wherein a groove is formed in said first main surface of said semiconductor substrate, and said groove protrudes toward the second main surface with respect to a position where the impurity concentration in said buried diffusion layer reaches $1 \times 10^{16}$ cm$^{-3}$.

32. The semiconductor device according to claim 30, wherein
a gate groove and an emitter groove are formed in said first main surface of said semiconductor substrate, said gate groove is filled with said gate electrode, and said emitter groove is filled with a conductive layer having said emitter potential, and
said buried diffusion layer is formed so as to be brought into contact with an emitter groove but not with the gate groove.

33. The semiconductor device according to claim 32, wherein said buried diffusion layer has a width of not less than 6.0 μm and not more than 9 μm as seen in plan view in a region existing around said emitter groove.

34. The semiconductor device according to claim 32, wherein a distance from said emitter groove to an end of said buried diffusion layer is not less than 0.5 μm and not more than 2 μm.

35. The semiconductor device according to claim 30, wherein
a gate groove and an emitter groove are formed in said first main surface of said semiconductor substrate, said gate groove is filled with said gate electrode, and said emitter groove is filled with a conductive layer having an emitter potential, and
said buried diffusion layer is formed so as to be brought into contact with said gate groove but not with the emitter groove.

36. The semiconductor device according to claim 30, wherein
a plurality of grooves are formed in said first main surface of said semiconductor substrate, and said plurality of grooves are arranged in one direction as seen in plan view, and
said buried diffusion layer is formed only in a region interposed between said grooves as seen in plan view.

37. The semiconductor device according to claim 36, further comprising a well layer of the first conductivity type formed on said first main surface adjacent to said plurality of grooves in a direction in which said plurality of grooves are arranged, extending in said one direction as seen in plan view and formed deeper than each of said plurality of grooves, wherein
said well layer is formed deeper than said buried diffusion layer.

38. The semiconductor device according to claim 13, further comprising:
a first emitter diffusion layer of the first conductivity type formed on said first main surface and in contact with said first electrode; and
a second emitter diffusion layer of the second conductivity type formed on said first main surface and in contact with said first electrode and said first emitter diffusion layer, wherein
a ratio of a width of said first second emitter diffusion layer along a direction in which said gate electrode extends to a sum of said width of the first emitter diffusion layer and a width of the second emitter diffusion layer along the direction in which said gate electrode extends is not less than 0.08 and not more than 0.20.

39. The semiconductor device according to claim 13, wherein an electric signal is transmitted to said gate electrode through a resistor body having a locally high electrical resistance value.

40. The semiconductor device according to claim 39, wherein said resistor body is identical in structure to said gate electrode.

41. The semiconductor device according to claim 13, further comprising a body diffusion layer of the first conductivity type being in contact with said collector region and serving as said channel, wherein an electric field intensity in a junction plane between said drift diffusion layer and said body diffusion layer obtained when a reverse voltage is applied to said element is greater than 0 and not more than $3.0 \times 10^5$ V/cm.

42. The semiconductor device according to claim 13, further comprising a body diffusion layer of the first conductivity type being in contact with said collector region and serving as said channel, wherein an electric field intensity in a junction plane between said buffer diffusion layer and said drift diffusion layer obtained when a reverse voltage is applied to said element is not less than $2.0 \times 10^4$ V/cm and not more than an electric field intensity in a junction plane between said drift diffusion layer and said body diffusion layer.

43. The semiconductor device according to claim 13, further comprising a body diffusion layer of the first conductivity type serving as said channel, wherein a gate groove is formed in said first main surface of said semiconductor substrate, and said gate groove is filled with said gate electrode, and a protrusion amount of said gate groove from a bottom of said body diffusion layer is not less than 1.0 μm and not more than a depth reaching said second main surface.

44. The semiconductor device according to claim 13, further comprising: a body diffusion layer of the first conductivity type serving as said channel; and a buried diffusion layer of the second conductivity type formed adjacent to a side surface of said body diffusion layer as seen in plan view.

45. The semiconductor device according to claim 44, wherein a ratio of the number of atoms per unit area of impurities forming said buried diffusion layer the number of atoms per unit area of impurities forming said drift diffusion layer is not less than 0 and not more than 20.

* * * * *